US008389200B2

(12) United States Patent
Kanna et al.

(10) Patent No.: US 8,389,200 B2
(45) Date of Patent: Mar. 5, 2013

(54) PATTERN FORMING METHOD

(75) Inventors: Shinichi Kanna, Haibara-gun (JP); Haruki Inabe, Haibara-gun (JP); Hiromi Kanda, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 18 days.

(21) Appl. No.: 12/618,365

(22) Filed: Nov. 13, 2009

(65) Prior Publication Data

US 2010/0068661 A1 Mar. 18, 2010

Related U.S. Application Data

(63) Continuation of application No. 11/656,527, filed on Jan. 23, 2007, now Pat. No. 7,700,260.

(30) Foreign Application Priority Data

Jan. 23, 2006 (JP) ................................ P2006-013978
Jun. 6, 2006 (JP) ................................ P2006-157227

(51) Int. Cl.
*G03F 7/00* (2006.01)
*G03F 7/004* (2006.01)
*G03F 7/20* (2006.01)
*G03F 7/40* (2006.01)

(52) U.S. Cl. ..................... 430/270.1; 430/311; 430/330; 430/322; 430/913

(58) Field of Classification Search ............... 430/270.1, 430/311, 330, 322, 913
See application file for complete search history.

(56) References Cited

U.S. PATENT DOCUMENTS

| | | | | |
|---|---|---|---|---|
| 6,593,058 | B1 * | 7/2003 | Feiring et al. | 430/270.1 |
| 6,908,724 | B2 * | 6/2005 | Araki et al. | 430/270.1 |
| 7,342,640 | B2 * | 3/2008 | Kamono | 355/53 |
| 7,929,109 | B2 * | 4/2011 | Poon et al. | 355/53 |
| 2002/0081520 | A1 | 6/2002 | Sooriyakumaran et al. | |
| 2005/0046934 | A1 | 3/2005 | Ho et al. | |
| 2005/0221234 | A1 | 10/2005 | Ito | |
| 2006/0008746 | A1 | 1/2006 | Onishi et al. | |
| 2006/0141400 | A1 | 6/2006 | Hirayama et al. | |
| 2006/0246373 | A1 | 11/2006 | Wang et al. | |
| 2007/0002296 | A1 | 1/2007 | Chang et al. | |
| 2007/0058263 | A1 * | 3/2007 | Chang et al. | 359/665 |
| 2007/0134593 | A1 | 6/2007 | Hirayama et al. | |
| 2007/0254235 | A1 | 11/2007 | Allen et al. | |
| 2008/0055574 | A1 * | 3/2008 | Kamono | 355/30 |
| 2009/0053650 | A1 | 2/2009 | Irie | |
| 2009/0190114 | A1 | 7/2009 | Ito | |
| 2009/0202945 | A1 | 8/2009 | Nakagawa et al. | |
| 2011/0075119 | A1 | 3/2011 | Ito | |

FOREIGN PATENT DOCUMENTS

| | | | |
|---|---|---|---|
| EP | 1 500 977 | A1 | 1/2005 |
| EP | 1 598 704 | A2 | 11/2005 |
| EP | 1 601 008 | A1 | 11/2005 |
| EP | 1 764 649 | A2 | 3/2007 |
| EP | 1 764 652 | A2 | 3/2007 |
| EP | 1 767 992 | A1 | 3/2007 |
| JP | 57-153433 | A | 9/1982 |
| JP | 7-220990 | A | 8/1995 |
| JP | 11-288877 | A | 10/1999 |
| JP | 2005-277053 | A | 10/2005 |
| JP | 2006-119292 | A | 5/2006 |
| JP | 2007-187887 | A | 7/2007 |
| WO | 2004-068242 | A1 | 8/2004 |
| WO | 2004-077158 | A1 | 9/2004 |
| WO | WO 2004/074937 | A1 | 9/2004 |

OTHER PUBLICATIONS

B.J. Lin Semiconductor Foundry, Lithography, and Partners Micropatterning Division TSMC, Inc., SPIE vol. 4688 (2002), pp. 11-24.
J.A. Hoffnagle, et al. Liquid Immersion Deep-Ultraviolet Interferometric Lithography J. Vac. Sci. Technol. B 17(6), 1999 American Vacuum Society, pp. 3306-3309.
European Search Report dated May 31, 2007.
Communication dated Jan. 17, 2012, issued by the Japanese Patent Office in counterpart Japanese Application No. 2006-157227.

* cited by examiner

*Primary Examiner* — Amanda C. Walke
(74) *Attorney, Agent, or Firm* — Sughrue Mion, PLLC

(57) ABSTRACT

A pattern forming method which uses a positive resist composition comprises: (A) a fluorine-free resin capable of increasing its solubility in an alkaline developer under action of an acid; (B) a compound capable of generating an acid upon irradiation with an actinic ray or radiation; (C) a fluorine-containing resin having at least one group selected from the group consisting of (X) an alkali-soluble group, (XI) a group capable of decomposing under action of an alkali developer and increasing solubility of the resin (C) in an alkaline developer and (XII) a group capable of decomposing under action of an acid and increasing solubility of the resin (C) in an alkaline developer; and (D) a solvent, the method comprising: (i) a step of applying the positive resist composition to a substrate to form a resist coating; (ii) a step of exposing the resist coating to light via an immersion liquid; (iii) a step of removing the immersion liquid remaining on the resist coating; (iv) a step of heating the resist coating; and (v) a step of developing the resist coating.

22 Claims, No Drawings

PATTERN FORMING METHOD

This is a Continuation of application Ser. No. 11/656,527 filed Jan. 23, 2007, which claims priority from Japanese Patent Application Nos. 2006-013978, filed Jan. 23, 2006, and 2006-157227, filed Jun. 6, 2006. The parent and priority applications are incorporated herein by reference in their entireties.

BACKGROUND OF THE INVENTION

1. Field of the Invention

The present invention relates to a pattern forming method utilizing a positive resist composition usable in a lithography process for manufacturing semiconductors, such as ICs, and circuit boards for LCDs and thermal heads, and other photofabrication processes. More specifically, the invention is concerned with a pattern forming method utilizing a positive resist composition suitable for exposure performed with a projection exposure apparatus for immersion lithography using as a light source far ultraviolet rays with wavelengths of 300 nm or below.

2. Description of the Related Art

With the growing need for finer semiconductor devices, it has been advanced to adopt exposure light sources having shorter wavelengths and projection lenses having higher numerical apertures (higher NAs). Up to now, steppers using as light sources ArF excimer laser with a wavelength of 193 nm and having NA of 0.84 have been developed. As generally well known, the resolution and the focal depth of these machines can be given by the following expressions;

$$(\text{Resolution})=k_1\cdot(\lambda/\text{NA})$$

$$(\text{Focal depth})=\pm k_2\cdot\lambda/\text{NA}^2$$

where λ is the wavelength of a exposure light source, NA is the numerical aperture of a projection lens, and $k_1$ and $k_2$ are coefficients concerning a process.

Although steppers using as light sources $F_2$ excimer laser with a wavelength of 157 nm are under study with an eye toward achieving higher-resolution by further shortening of the wavelengths of exposure light sources, it is very difficult to stabilize production costs and qualities of apparatus and materials since lens materials used in exposure apparatus and materials used for resist in order to ensure shorter wavelengths are confined within very narrow limits, and fears are arising for completion of exposure apparatus and resist having sufficient performance and stability within a required period.

As an art of heightening the resolution in an optical microscope, the method of filling the space between a projection lens and a test specimen with a liquid having a high refractive index (hereinafter referred to as an immersion liquid), or the so-called immersion method, has hitherto been known.

This "immersion effect" can be explained as follows. In immersion lithography, the foregoing resolution and focal depth can be given by the following expressions;

$$(\text{Resolution})=k_1\cdot(\lambda_0/n)/\text{NA}_0$$

$$(\text{Focal depth})=\pm k_2\cdot(\lambda_0/n)/\text{NA}_0^2$$

where $\lambda_0$ is the wavelength of a exposure light source in the air, n is the refractive index of an immersion liquid relative to the air and $\text{NA}_0$ is equal to sin θ when the convergent half angle of incident rays is represented by θ. That is to say, the effect of immersion is equivalent to the use of exposure light with a 1/n wavelength. In other words, application of the immersion method to a projection optical system having the same NA value can multiply the focal depth by a factor of n.

This art is effective on all shapes of patterns, and besides, it can be used in combination with super-resolution techniques under study at present, such as a phase-shift method and an off-axis illumination method.

Examples of apparatus utilizing this effect for transfer of fine circuit patterns in semiconductor devices are disclosed in JP-A-57-153433 and JP-A-7-220990, but these documents have no description of resist suitable for immersion lithography.

Recent progress of immersion lithography is reported in Proceedings of International Society for Optical Engineering (Proc. SPIE), vol. 4688, p. 11 (2002), J. Vac. Sci. Technol. B, 17 (1999), Proceedings of International Society for Optical Engineering (Proc. SPIE), vol. 3999, p. 2 (2000), and WO 2004/077158.

In order to supplement the sensitivity drop by light absorption from the resist for KrF excimer laser (248 nm) onward, the image forming method referred to as a chemical amplification method has been adopted as a method of patterning resist. To illustrate an image forming method utilizing chemical amplification by a positive-working case, images are formed in a process that exposure is performed to cause decomposition of an acid generator in the exposed areas, thereby generating an acid, and conversion of alkali-insoluble groups (groups insoluble in an alkaline developer) into an alkali-soluble groups (groups soluble in an alkaline developer) by utilizing the acid generated as a reaction catalyst is caused by bake after exposure (PEB: Post Exposure Bake) to enable the exposed areas to be removed by an alkaline developer.

In a general resist process used for formation of resist patterns, a resist composition is coated evenly on a substrate by use of a spin coat method, the substrate is heated in order to evaporate a resist solvent, the substrate is cooled to room temperature; the resist coating is exposed to light via a mask bearing the desired patterns, PEB is carried out immediately after the exposure, the resist coating thus treated is immersed in a developer after cooling to room temperature, the developer is rinsed out with water, and then the thus patterned resist coating is dried by a spin dry method.

Application of immersion lithography to chemical amplification resist according to the foregoing general resist process requires further improvements in development defects appearing after development.

SUMMARY OF THE INVENTION

An object of the invention is to provide a patterning method which can ensure formation of patterns improved in development defects appearing after development in the case of performing immersion lithography.

Exemplary aspects of the invention are pattern forming methods described below, and thereby the aforesaid object of the invention is attained.

(1) A pattern forming method which uses a positive resist composition comprising:

(A) a fluorine-free resin capable of increasing its solubility in an alkaline developer under action of an acid;

(B) a compound capable of generating an acid upon irradiation with an actinic ray or radiation;

(C) a fluorine-containing resin having at least one group selected from the group consisting of (X) an alkali-soluble group, (XI) a group capable of decomposing under action of an alkali developer and increasing solubility of the resin (C) in an alkaline developer and (XII) a group capable of decomposing under action of an acid and increasing solubility of the resin (C) in an alkaline developer; and (D) a solvent, the method comprising:

(i) a step of applying the positive resist composition to a substrate to form a resist coating;

(ii) a step of exposing the resist coating to light via an immersion liquid;

(iii) a step of removing the immersion liquid remaining on the resist coating;

(iv) a step of heating the resist coating; and (v) a step of developing the resist coating.

(2) The pattern forming method as described in (1), wherein the resin (A) has a mononuclear or polynuclear alicyclic hydrocarbon structure.

(3) The pattern forming method as described in (1) or (2), wherein the resist coating is exposed to light of a wavelength of 193 nm.

(4) The pattern forming method as described in any of (1) to (3), further comprising a step of cleaning the resist coating surface prior to (ii) the step of exposing the resist coating to light via an immersion liquid.

(5) The pattern forming method as described in any of (1) to (4); wherein (iii) the step of removing the immersion liquid remaining on the resist coating is a step of removing the immersion liquid by feeding a water-miscible organic solvent onto the resist coating.

(6) The pattern forming method as described in (5), wherein the water-miscible organic solvent is isopropyl alcohol.

In addition, the following are preferred embodiments of the invention.

(7) The pattern forming method as described in any of (1) to (6), wherein the resin (C) has a weight average molecular weight of 1,000 to 100,000.

(8) The pattern forming method as described in any of (1) to (7), wherein the resin (C) is added in an amount of 0.1 to 5 mass % based on the total solids in the positive resist composition.

(9) The pattern forming method as described in any of (1) to (4), (7) and (8), wherein (iii) the step of removing the immersion liquid remaining on the resist coating comprises forming a liquid film (puddle) of the immersion liquid and then removing the liquid film so as not to left any liquid drops.

(10) The pattern forming method as described in (9), wherein the step of removing the liquid film is a step of removing the liquid film while rotating the substrate at 500 rpm or above.

(11) The pattern forming method as described in any of (1) to (10), wherein the resin (A) comprises a repeating unit having a polycyclic hydrocarbon group substituted by a hydroxyl group or a cyano group.

(12) The pattern forming method as described in any of (1) to (11), wherein the resin (C) is an alkali-soluble resin having the alkali-soluble group (X), and the alkali-soluble group (X) is represented by —$C(CF_3)(CF_3)(OH)$.

(13) The pattern forming method as described in any of (1) to (12), wherein the resin (A) comprises:

a repeating unit represented by formula (A1);

a repeating unit represented by formula (A2); and a repeating unit represented by formula (A3),

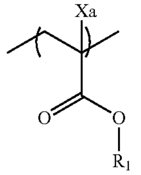

(A1)

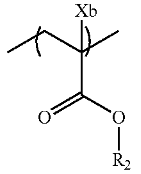

(A2)

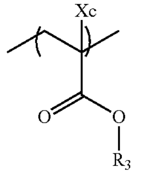

(A3)

wherein Xa, Xb and Xc each independently represents a hydrogen atom or a methyl group, $R_1$ represents a univalent organic group having a lactone structure, $R_2$ represents a univalent organic group having a hydroxyl group or a cyano group, and $R_3$ represents a univalent organic group capable of splitting off by the action of an acid.

DETAILED DESCRIPTION OF THE INVENTION

The invention is described below in detail.

Additionally, the term "group (atomic group)" used in this specification is intended to include both unsubstituted and substituted ones when neither word substituted nor unsubstituted is added thereto. For instance, the term "alkyl group" is intended to include not only an alkyl group having no substituent (an unsubstituted alkyl group) but also an alkyl group having a substituent or substituents (a substituted alkyl group).

[1] Fluorine-Free Resin (A) that can Increase Solubility in Alkali Developer Under Reaction of Acid One of resins used in a positive resist composition according to the invention is a fluorine-free resin capable of increasing solubility in an alkaline developer under action of an acid.

Such a resin is preferably a fluorine-free resin having mononuclear or polynuclear alicyclic hydrocarbon structures and capable of decomposing under action of an acid to increase its solubility in an alkaline developer (an acid-decomposable resin), and the resin is far preferably a resin having groups capable of decomposing under action of an acid to produce alkali-soluble groups (hereinafter referred to as "acid-decomposable groups") in either its main chain, or side chains, or both (hereinafter referred to as "an alicyclic hydrocarbon-containing acid-decomposable resin").

Examples of an alkali-soluble group include groups respectively having a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group and a tris(alkylsulfonyl)methylene group.

Of these alkali-soluble groups, a carboxylic acid group, a fluorinated alcohol group (preferably a hexafluoroisopropanol group) and a sulfonic acid group is preferred over the others.

Groups suitable as groups capable of decomposing by an acid (acid-decomposable groups) are those obtained by substituting groups capable of splitting off under action of an acid for hydrogen atoms of the alkali-soluble groups as recited above.

Examples of a group capable of splitting off under action of an acid include groups of formula —C($R_{36}$)($R_{37}$)($R_{38}$), groups of formula —C($R_{36}$)($R_{37}$)($RO_{39}$), and groups of formula —C($R_{01}$)($R_{02}$)($RO_{39}$).

In those formulae, $R_{36}$ to $R_{39}$ each represent an alkyl group, a cycloalkyl group, an aryl group, an aralkyl group or an alkenyl group independently. $R_{36}$ and $R_{37}$ may combine with each other to form a ring. $R_{01}$ and $R_{02}$ each represent a hydrogen atom, an alkyl group, a cycloalkyl group, an aryl group, an aralkyl group or an alkenyl group independently.

Examples of a group suitable as an acid decomposable group include cumyl ester groups, enol ester groups, acetal ester groups and tertiary alkyl ester groups. Of these groups, tertiary alkyl ester groups are preferred over the others.

The alicyclic hydrocarbon-containing acid-decomposable resin is preferably a resin having at least one kind of repeating units selected from repeating units having partial structures containing alicyclic hydrocarbon groups represented by the following formulae (pI) to (pV) or repeating units represented by the following formula (II-AB).

(pI)

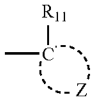

(pII)

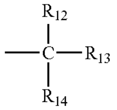

(pIII)

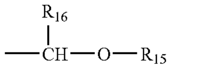

(pIV)

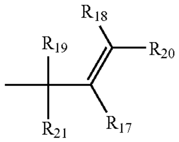

(pV)

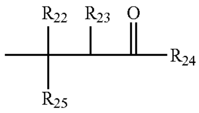

In the formulae (pI) to (pV), $R_{11}$ represents a methyl group, an ethyl group, an n-propyl group, an isopropyl group, an n-butyl group, an isobutyl group or a sec-butyl group, and Z represents atoms forming a cycloalkyl group together with the carbon atom.

$R_{12}$ to $R_{16}$ each represent a straight-chain or branched alkyl group or a cycloalkyl group independently, provided that at least one of $R_{12}$ to $R_{14}$, or either $R_{15}$ or $R_{16}$ represents a cycloalkyl group.

$R_{17}$ to $R_{21}$ each represent a hydrogen atom, a straight-chain or branched alkyl group or a cycloalkyl group independently, provided that at least one of $R_{17}$ to $R_{21}$ represents a cycloalkyl group. Further, either $R_{19}$ or $R_{21}$ is required to represent a straight-chain or branched alkyl group or a cycloalkyl group.

$R_{22}$ to $R_{24}$ each represent a hydrogen atom, a straight-chain or branched alkyl group or a cycloalkyl group independently, provided that at least one of $R_{22}$ to $R_{24}$ represents a cycloalkyl group. Alternatively, $R_{23}$ and $R_{24}$ may combine with each other to form a ring.

(II-AB)

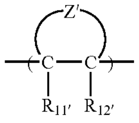

In the formula (II-AB), $R_{11}'$ and $R_{12}'$ each represent a hydrogen atom, a cyano group, a halogen atom or an alkyl group independently.

Z' represents atoms forming an alicyclic structure together with the two bonded carbon atoms (C—C).

The formula (II-AB) is preferably the following formula (II-AB1) or formula (II-AB2).

(II-AB1)

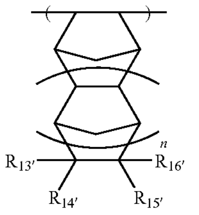

(II-AB2)

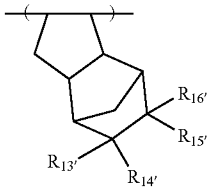

In the formulae (II-AB1) and (II-AB2), $R_{13}'$ to $R_{16}'$ each independently represent a hydrogen atom, a halogen atom, a cyano group, —COOH, —$COOR_5$, a group capable of decomposing under action of an acid, —C(═O)—X-A'-$R_{17}'$, an alkyl group or a cycloalkyl group. At least two of $R_{13}'$ to $R_{16}'$ may combine with each other to form a ring.

$R_5$ represents an alkyl group, a cycloalkyl group or a group having a lactone structure.

X represents an oxygen atom, a sulfur atom, —NH—, —$NHSO_2$— or —$NHSO_2NH$—.

A' represents a single bond or a divalent linkage group.

$R_{17}'$ represents —COOH, —$COOR_5$, —CN, a hydroxyl group, an alkoxy group, —CO—NH—$R_6$, —CO—NH—$SO_2$—$R_6$ or a group having a lactone structure.

$R_6$ represents an alkyl group or a cycloalkyl group.

n represents 0 or 1.

The alkyl group which $R_{12}$ to $R_{25}$ each can represent in the formulae (pI) to (pV) is preferably a 1-4C straight-chain or branched alkyl group, with examples including a methyl group, an ethyl group, an n-propyl group, an isopropyl group, an n-butyl group, an isobutyl group and a sec-butyl group.

The cycloalkyl group which $R_{12}$ to $R_{25}$ each can represent or the cycloalkyl group which can be formed of Z and the carbon atom may be monocyclic or polycyclic. Examples of such a cycloalkyl group include groups each containing at least 5 carbon atoms and having a monocyclo, bicyclo, tricyclo or tetracyclo structure. The number of carbon atoms in such a structure is preferably from 6 to 30, particularly preferably from 7 to 25.

Suitable examples of such a cycloalkyl group include an adamantyl group, a noradamantyl group, a decaline residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Of these groups, an adamantyl group, a norbornyl group, a cyclohexyl group, a cyclopentyl group, a tetradecanyl group and a tricyclodecanyl group are preferred over the others.

Each of these alkyl groups and cycloalkyl groups may further have a substituent. Examples of such a substituent include an alkyl group (1-4C), a halogen atom, a hydroxyl group, an alkoxy group (1-4C), a carboxyl group and an alkoxycarbonyl group (2-6C). Herein, the alkyl, alkoxy and alkoxycarbonyl groups each may further have a substituent, such as a hydroxyl group, a halogen atom or an alkoxy group.

The structures represented by the formulae (pI) to (pV) in the resins can be used for protection of alkali-soluble groups. Examples of alkali-soluble groups which can be protected by such structures include various groups which are known in this technical field.

More specifically, such a protected alkali-soluble group has a structure formed by substituting the structure represented by any of the formulae (pI) to (pV) for the hydrogen atom of carboxylic acid, sulfonic acid, phenol or thiol. Suitable examples of such a structure include structures formed by substituting the structures represented by formulae (pI) to (pV) for the hydrogen atoms of carboxylic acid groups or sulfonic acid groups.

As repeating units having alkali-soluble groups protected by the structures of formulae (pI) to (pV), repeating units represented by the following formula (pA) are preferred.

(pA)

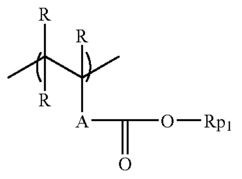

In the formula (pA), each R represents a hydrogen atom, a halogen atom or a 1-4C straight-chain or branched alkyl group. A plurality of Rs may be the same or different.

A represents a single bond, an alkylene group, an ether group, a thioether group, a carbonyl group, an ester group, an amido group, a sulfonamido group, a urethane group, a urea group, or a combination of two or more of the groups recited above, preferably a single bond.

$Rp_1$ represents any of the formulae (pI) to (pV).

The most suitable of repeating units represented by the formula (pA) is a repeating unit derived from 2-alkyl-2-adamantyl(meth)acrylate or dialkyl(1-adamantyl)methyl(meth)acrylate.

Examples of a repeating unit represented by the formula (pA) are illustrated below, but these examples should not construed as limiting the scope of the invention.

(In the following formulae, Rx is H, $CH_3$, $CF_3$ or $CH_2OH$, and Rxa and Rxb are each a 1-4C alkyl group.)

1

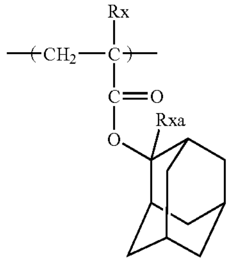

2

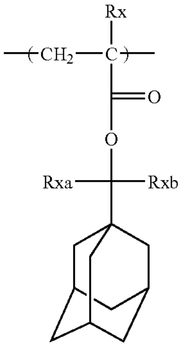

3

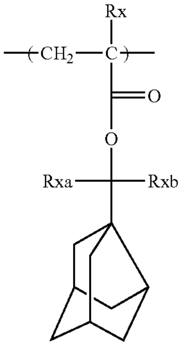

4

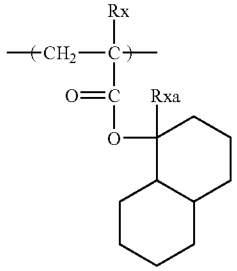

5

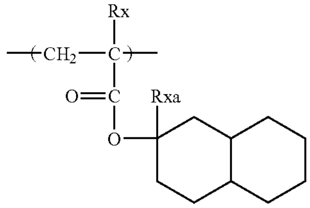

-continued
6
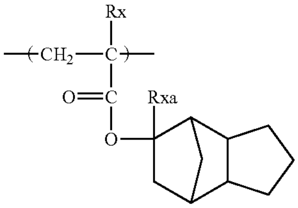
7
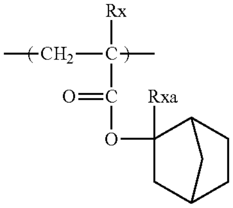
8
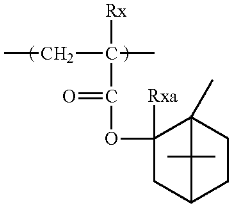
9
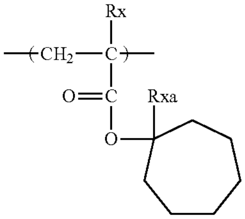
10
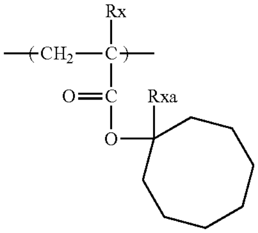
11
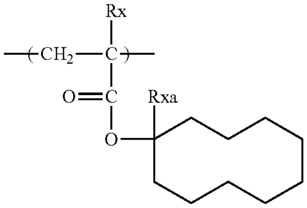
12
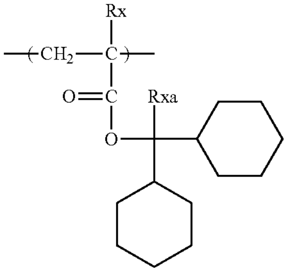
-continued
13
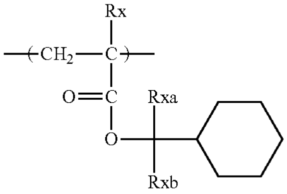
14
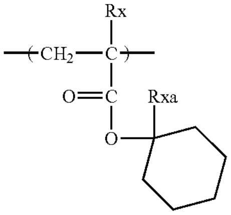
15
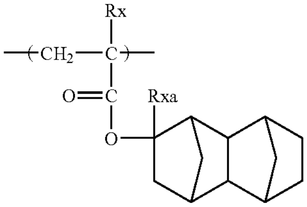
16
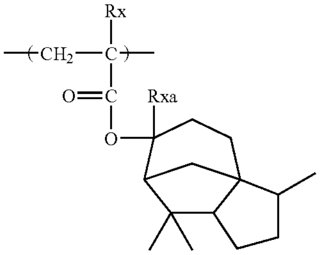
17
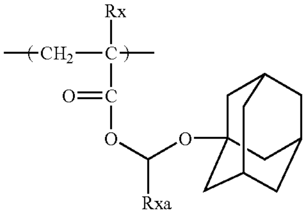
18
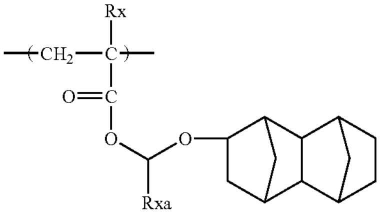
19
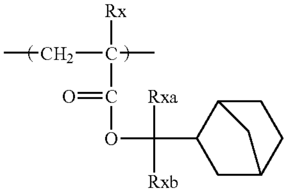

-continued

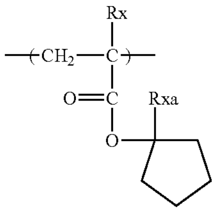

20

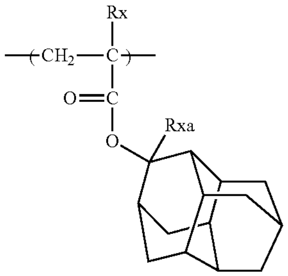

21

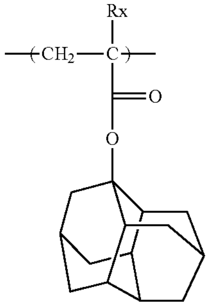

22

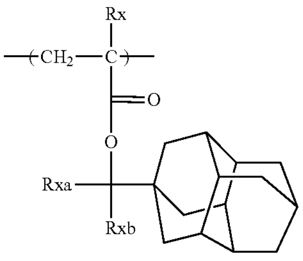

23

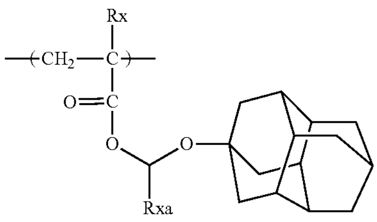

24

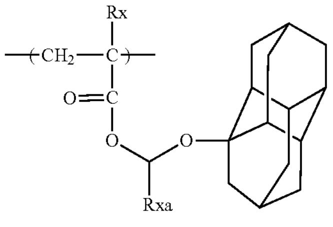

25

Examples of a halogen atom which $R_{11}$' and $R_{12}$' each can represent in the formula (II-AB) include a chlorine atom, a bromine atom, a fluorine atom and an iodine atom.

Examples of an alkyl group which $R_{11}$' and $R_{12}$' each can represent include 1-10C straight-chain or branched alkyl groups.

The atoms Z' for forming an alicyclic structure are atoms forming a repeating unit having an alicyclic hydrocarbon structure which may have a substituent, particularly preferably atoms forming a repeating unit having a bridged alicyclic hydrocarbon structure.

Examples of a skeleton of the alicyclic hydrocarbon formed include the same ones as alicyclic hydrocarbon groups which $R_{12}$ to $R_{25}$ can represent in the formulae (pI) to (pV).

The skeleton of the alicyclic hydrocarbon structure may have a substituent. Examples of such a substituent include $R_{13}$' to $R_{16}$' in the formulae (II-AB1) and (II-AB2).

In the alicyclic hydrocarbon-containing acid-decomposable resin for use in the invention, groups capable of decomposing under action of an acid can be incorporated in at least one type of repeating units chosen from repeating units having partial structures containing aliphatic hydrocarbons represented by the formulae (pI) to (pV), repeating units represented by the formula (II-AB) or repeating units of copolymerization components described hereinafter.

Various kinds of substituents as $R_{13}$' to $R_{16}$' in the formula (II-AB1) or (II-AB2) may also become substituents of atoms Z forming an alicyclic hydrocarbon structure or a bridged alicyclic hydrocarbon structure in the formula (II-AB).

Examples of repeating units represented by the formulae (II-AB1) and (II-AB2) are illustrated below, but these examples should not be construed as limiting the scope of the invention.

[II-1]

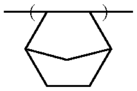

[II-2]

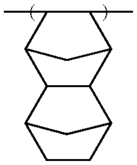

[II-3]

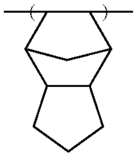

{II-4]

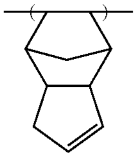

[II-5]

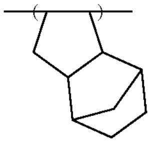

-continued
[II-6]
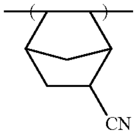
[II-7]
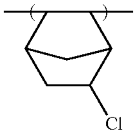
[II-8]
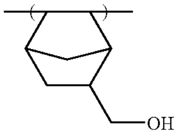
[II-9]
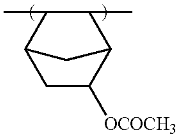
[II-10]
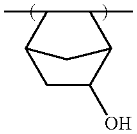
[II-11]
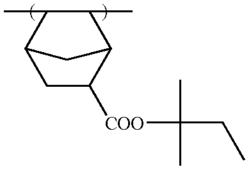
[II-12]
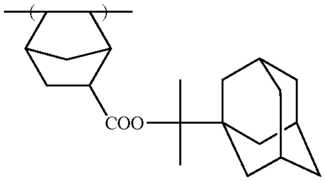
[II-13]
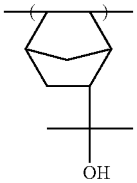
[II-14]
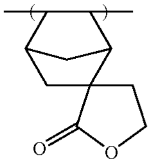
[II-15]
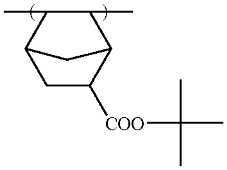
-continued
[II-16]
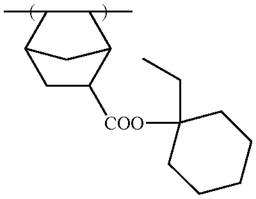
[II-17]
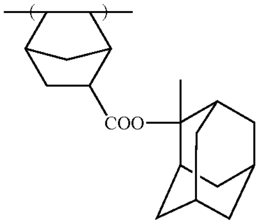
[II-18]
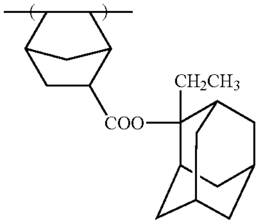
[II-19]
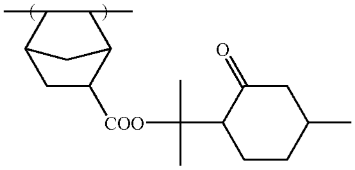
[II-20]
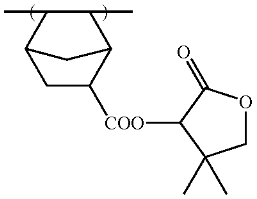
[II-21]
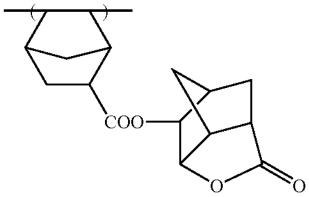
[II-22]
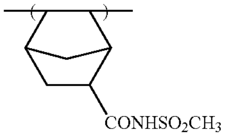
[II-23]
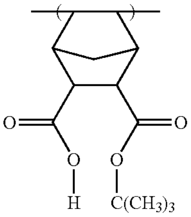

-continued

[II-24]

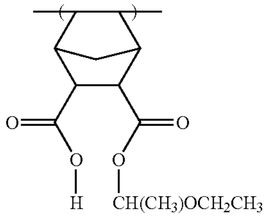

[II-25]

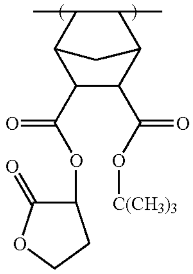

[II-26]

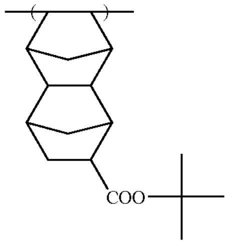

[II-27]

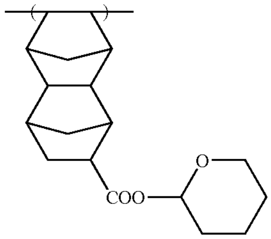

[II-28]

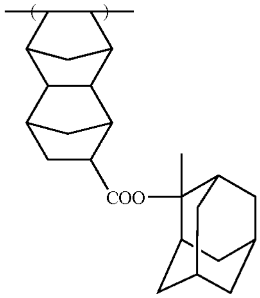

[II-29]

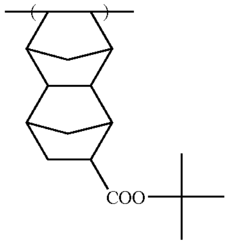

-continued

[II-30]

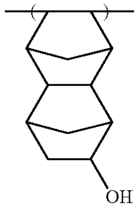

[II-31]

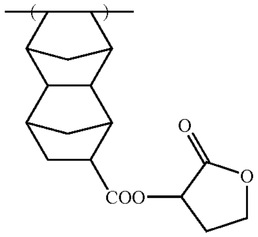

[II-32]

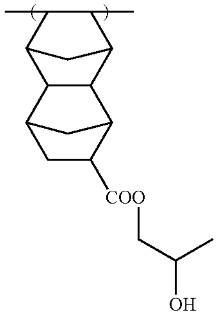

The alicyclic hydrocarbon-containing acid-decomposable resin for use in the invention preferably has repeating units each containing a group having a lactone structure. As the group having a lactone structure, any group can be used as far as it has a lactone structure. Suitable examples of a group having a lactone structure include groups having 5- to 7-membered ring lactone structures, preferably those which fuse with other ring structures to form bicyclo or Spiro structures. Of the groups having lactone structures, the groups having lactone structures represented by the following formulae (LC1-1) to (LC1-16) are preferred over the others. Alternatively, the groups having lactone structures may be bonded directly to the main chain. The lactone structures used to advantage are (LC1-1), (LC1-4), (LC1-5), (LC1-6), (LC1-13) and (LC1-14), and the use of specified lactone structures contributes to improvements in line edge roughness and development defects.

LCI-1

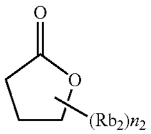

LCI-2

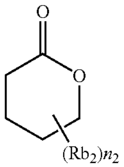

-continued

LCI-3

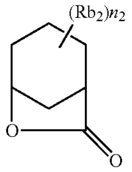

LCI-4

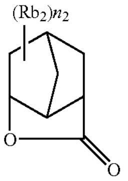

LCI-5

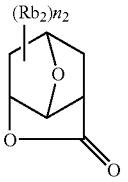

LCI-6

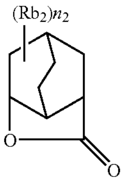

LCI-7

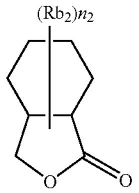

LCI-8

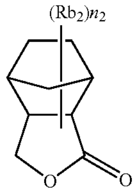

LCI-9

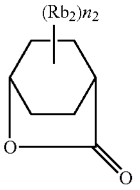

LCI-10

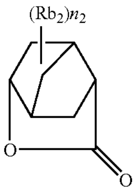

-continued

LCI-11

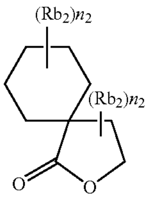

LCI-12

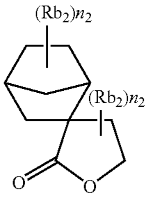

LCI-13

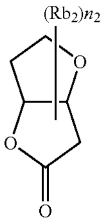

LCI-14

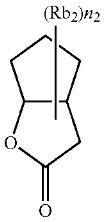

LCI-15

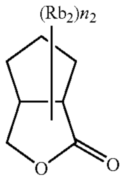

LCI-16

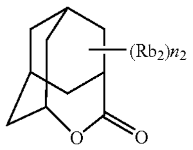

Each lactone structure moiety may have a substituent ($Rb_2$) or needn't. Suitable examples of a substituent ($Rb_2$) include 1-8C alkyl groups, 3-7C cycloalkyl groups, 1-8C alkoxy groups, 1-8C alkoxycarbonyl groups, a carboxyl group, halogen atoms, a hydroxyl group, a cyano group and acid-decomposable groups. $n_2$ represents an integer of 0 to 4. When $n_2$ is 2 or above, a plurality of $Rb_2$s may be the same or different, or they may combine with each other to form a ring.

Examples of a repeating unit containing a group having a lactone structure represented by any of the formulae (LC1-1) to (LC1-16) include the repeating units represented by the formula (II-AB1) or (II-AB2) wherein at least one of $R_{13}$' to $R_{16}$' is a group having the lactone structure represented by any of the formulae (LC1-1) to (LC1-16) (for instance, $R_5$ in —$COOR_5$ represents a group having the lactone structure represented by any of the formulae (LC1-1) to (LC1-16)), and repeating units represented by the following formula (AI).

(AI)

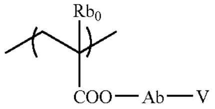

In the formula (AI), $Rb_0$ represents a hydrogen atom, a halogen atom or a 1-4C alkyl group. Examples of a suitable substituent the alkyl group represented by $Rb_0$ may have include a hydroxyl group and halogen atoms.

Examples of a halogen atom represented by $Rb_0$ include a fluorine atom, a chlorine atom, a bromine atom and an iodine atom.

$Rb_0$ is preferably a hydrogen atom or a methyl group.

Ab represents a single bond, an alkylene group, a divalent linkage group having a mononuclear or polynuclear alicyclic hydrocarbon structure, an ether group, an ester group, a carbonyl group, or a divalent group formed by combining two or more of the groups recited above.

Ab is preferably a single bond or a linkage group represented by $-Ab_1-CO_2$, $Ab_1$ is a straight-chain or branched alkylene group or a monocyclic or polycyclic cycloalkylene group, preferably a methylene group, an ethylene group, a cyclohexylene group, an adamantylene group or a norbornylene group.

V represents a group having a lactone structure represented by any of the formulae (LC1-1) to (LC1-16).

A repeating unit having a lactone structure generally has optical isomers, and any of the optical isomers may be used. Further, one optical isomer may be used by itself, or two or more of optical isomers may be used as a mixture. When one optical isomer is mainly used, the optical purity (ee) thereof is preferably 90 or above, far preferably 95 or above.

Examples of a repeating unit containing a group having a lactone structure are illustrated below, but these examples should not be construed as limiting the scope of the invention. (In each of the following formulae, Rx is H, $CH_3$, $CH_2OH$ or $CF_3$)

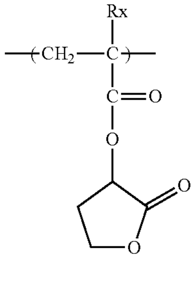
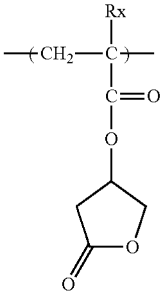
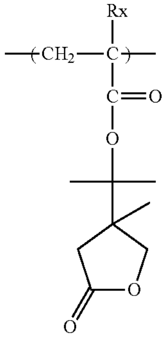
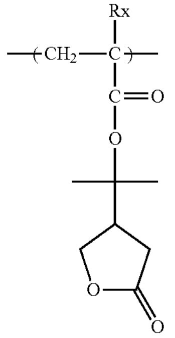

-continued

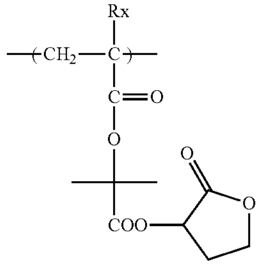
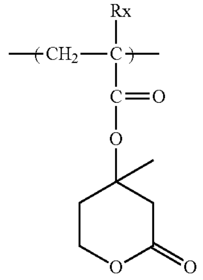
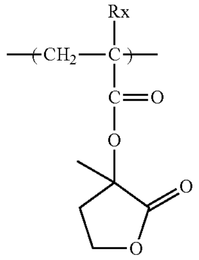
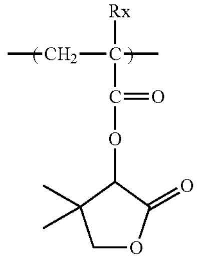
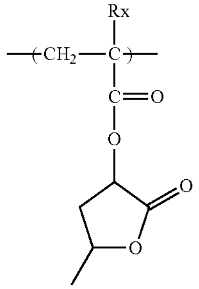
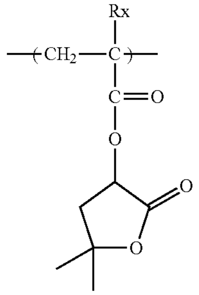
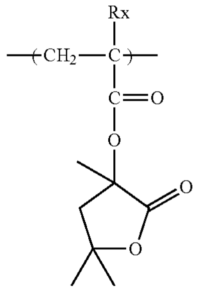
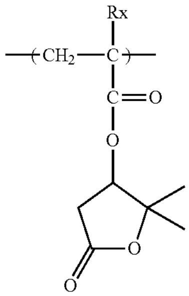
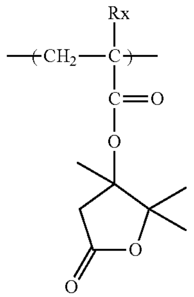
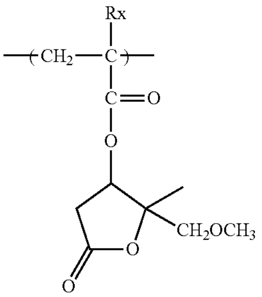
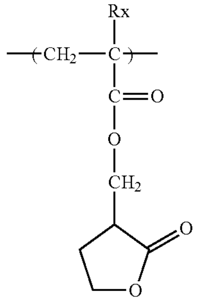
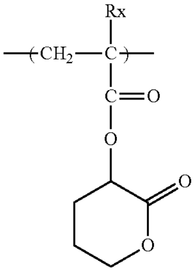

-continued
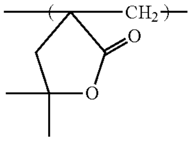
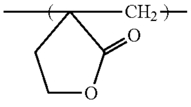
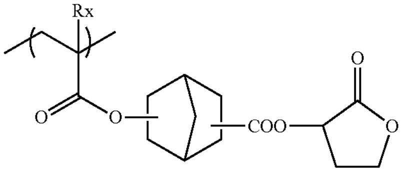
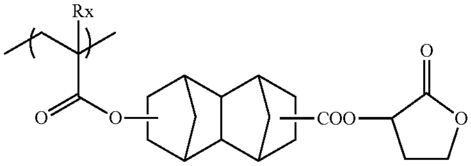
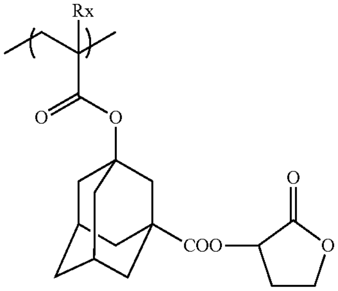
(In each of the following formulae, Rx is H, $CH_3$, $CH_2OH$ or $CF_3$)
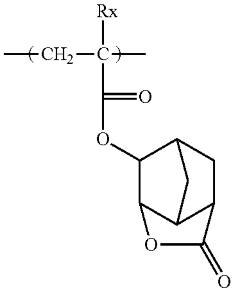
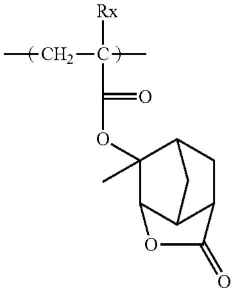
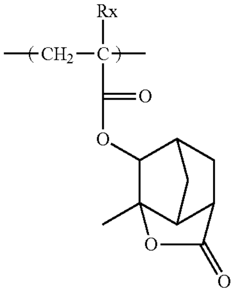
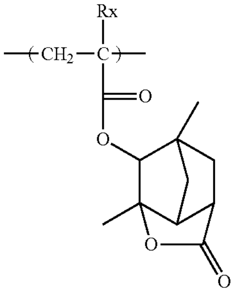
-continued
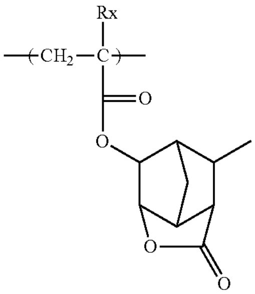
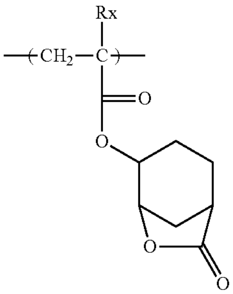
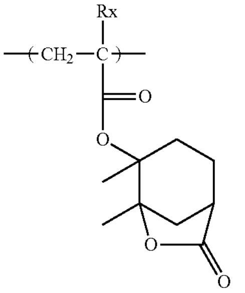
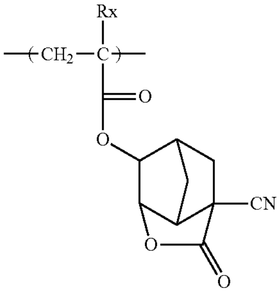
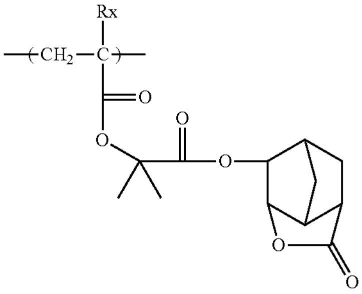
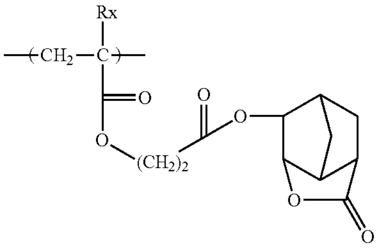
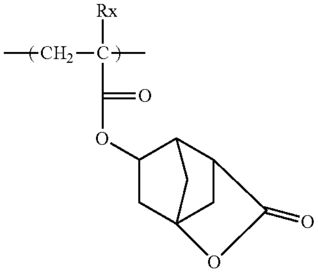
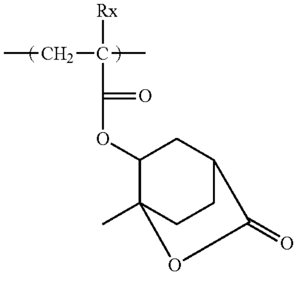
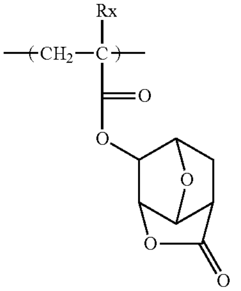

-continued
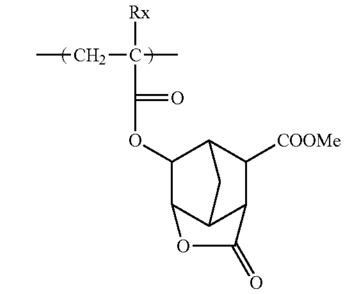
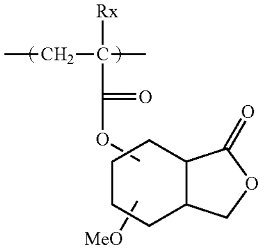
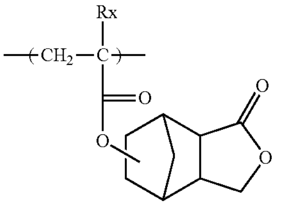
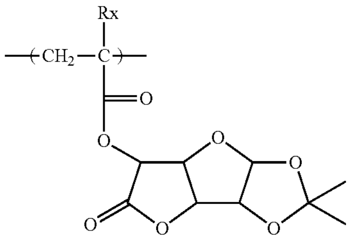
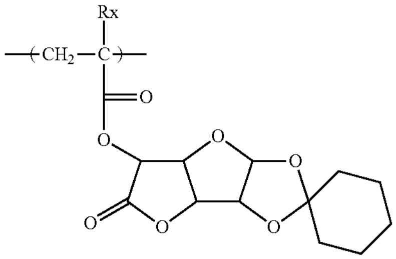
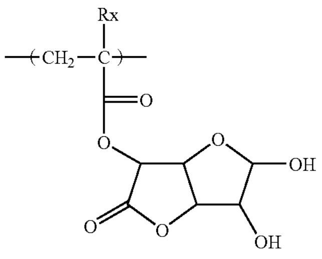
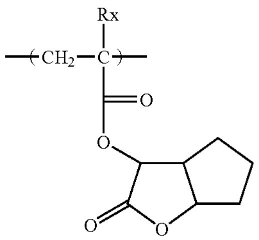
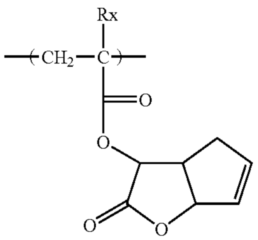
-continued
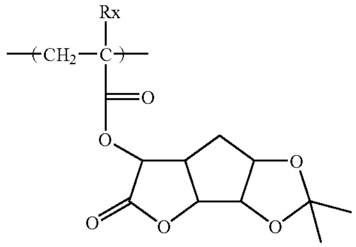
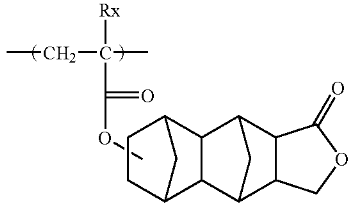
(In each of the following formulae, Rx is H, $CH_3$, $CH_2OH$ or $CF_3$)
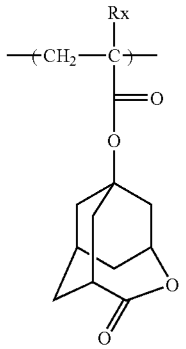
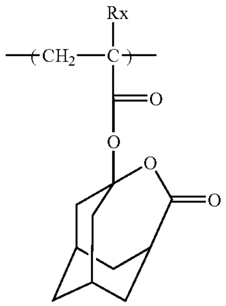
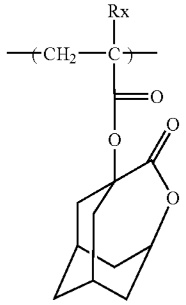
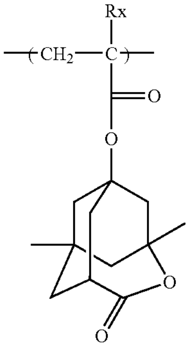
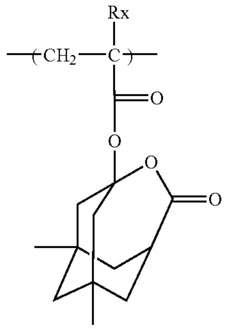
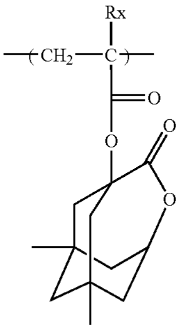

-continued

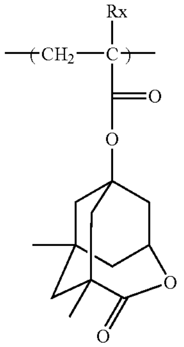

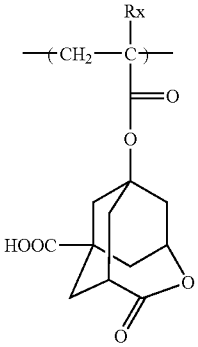

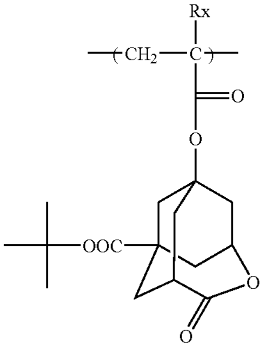

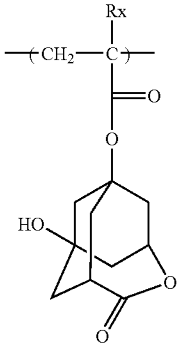

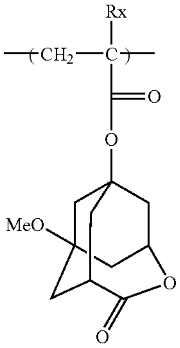

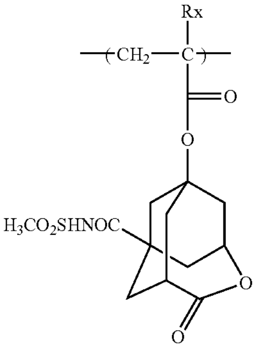

The alicyclic hydrocarbon-containing acid-decomposable resin for use in the invention preferably has repeating units containing groups having alicyclic hydrocarbon structures (preferably polycyclic hydrocarbon structure) substituted with polar groups. By introduction of such repeating units in the resin, adhesiveness to a substrate and affinity for a developer can be enhanced. Examples of an alicyclic hydrocarbon structure preferred in the alicyclic hydrocarbon structure substituted with a polar group include an adamantyl group, a diamantyl group and a norbornyl group, and examples of a polar group preferred in such a structure are a hydroxyl group and a cyano group. As groups having alicyclic hydrocarbon structures substituted with polar groups, those represented by the following formulae (VIIa) to (VIId) are suitable.

(VIIa)

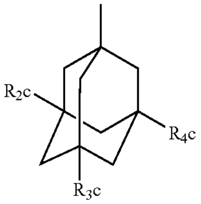

-continued (VIIb)

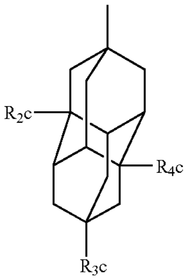

(VIIc)

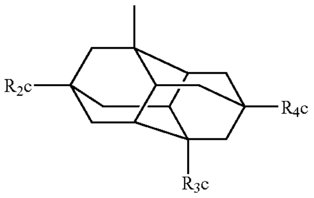

(VIId)

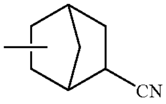

In the formulae (VIIa) to (VIIc), $R_{2C}$ to $R_{4C}$ each represent a hydrogen atom, a hydroxyl group or a cyano group independently, provided that at least one of them represents a hydroxyl group or a cyan group. The case where one of $R_{2C}$ to $R_{4C}$ is a hydroxyl group and the remainder are hydrogen atoms and the case where two of $R_{2C}$ to $R_{4C}$ are hydroxyl groups and the remainder is a hydrogen atom are preferable. In the formula (VIIa), it is far preferred that two of $R_{2C}$ to $R_{4C}$ are hydroxyl groups and the remainder is a hydrogen atom.

Examples of repeating units containing groups represented by the formulae (VIIa) to (VIId) include the repeating units represented by the formula (II-AB1) or (II-AB2) wherein at least one of $R_{13}'$ to $R_{16}'$ is a group represented by any of the formulae (VIIa) to (VIId) (for instance, $R_5$ in —$COOR_5$ represents a group represented by any of the formulae (VIIa) to (VIId)), and repeating units represented by the following formulae (AIIa) to (AIId).

(AIIa)

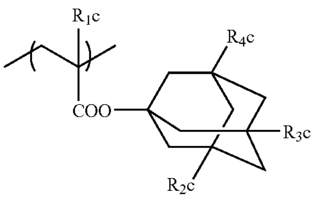

-continued
(AIIb)
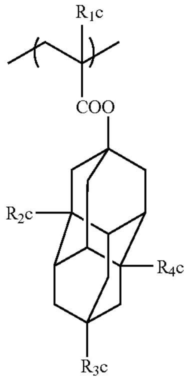
(AIIc)
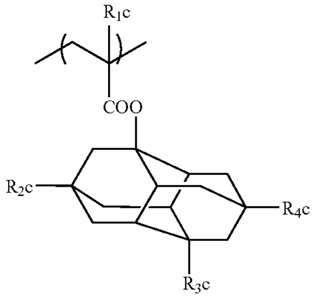
(AIId)
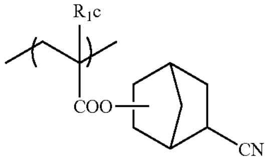
In the formula (AIIa) to (AIId), $R_{1C}$ represents a hydrogen atom, a methyl group, a trifluoromethyl group or a hydroxymethyl group.
Examples of repeating units represented by the formulae (AIIa) to (AIId) are illustrated below, but these examples should not be construed as limiting the scope of the invention.
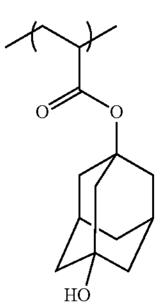
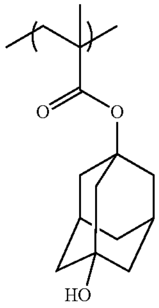
-continued
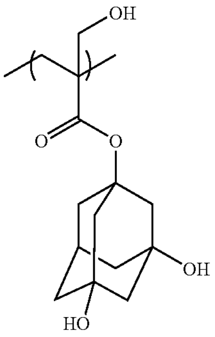
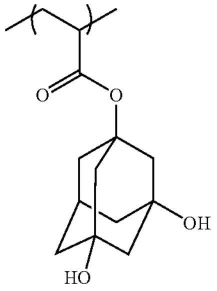
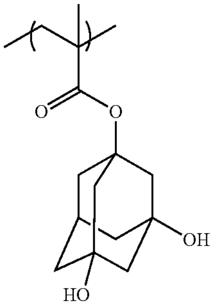
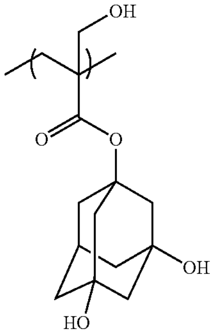
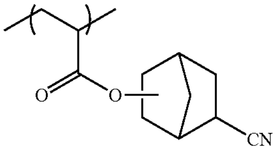
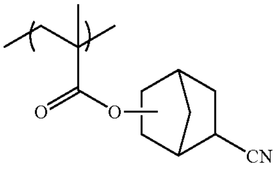
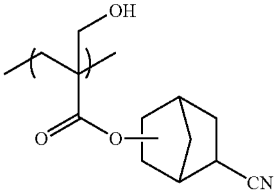
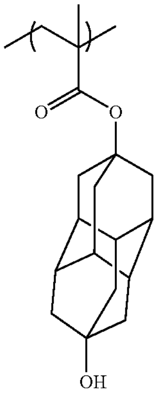
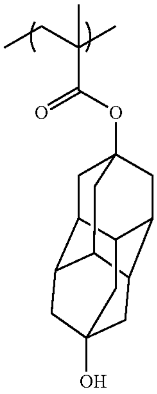
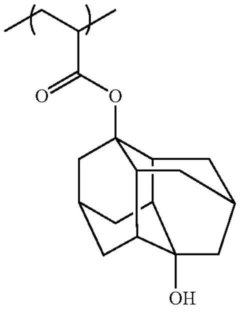

-continued

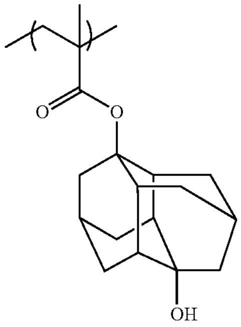

The alicyclic hydrocarbon-containing acid-decomposable resin for use in the invention may have repeating units represented by the following formula (VIII).

(VIII)

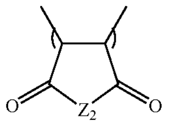

In the formula (VIII), $Z_2$ represents —O— or —N($R_{41}$)—. $R_{41}$ represents a hydrogen atom, a hydroxyl group, an alkyl group or —$OSO_2$—$R_{42}$. $R_{42}$ represent an alkyl group, a cycloalkyl group or a camphor residue. The alkyl groups of $R_{41}$ and $R_{42}$ may be substituted with halogen atoms (preferably fluorine atoms).

Examples of a repeating unit represented by the formula (VIII) are illustrated below, but these examples should not be construed as limiting the scope of the invention.

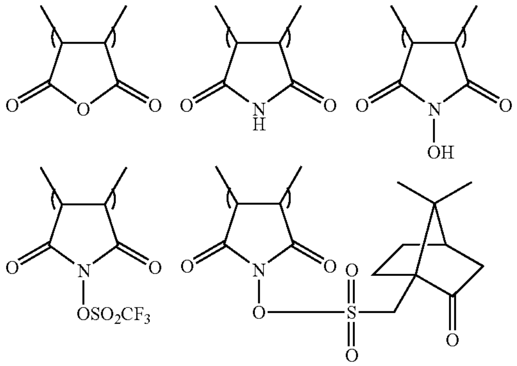

The alicyclic hydrocarbon-containing acid-decomposable resin for use in the invention preferably has repeating units containing alkali-soluble groups, far preferably repeating units containing carboxyl groups. By containing such groups in the repeating units, resolution in contact hole uses is enhanced. Suitable examples of repeating units containing carboxyl groups include repeating units containing carboxyl groups in a state that they are bonded directly to the resin's main chain, such as repeating units derived from acrylic acid and methacrylic acid, repeating units containing carboxyl groups in a state that they are attached to the resin's main chain via linkage groups, and polymer chain terminals wherein alkali-soluble groups are introduced by using a polymerization initiator or chain transfer agent having an alkali-soluble group at the time of polymerization. Therein, the linkage groups may have mononuclear or polynuclear cyclic hydrocarbon structures. However, repeating units derived from acrylic acid and methacrylic acid in particular are preferred.

The alicyclic hydrocarbon-containing acid-decomposable resin for use in the invention may further contain repeating units having alicyclic hydrocarbon structures and not showing acid decomposability. By introduction of such repeating units, elution of low molecular components from a resist coating into an immersion liquid at the time of performance of immersion lithography can be reduced. Examples of such repeating units include those derived from 1-adamantyl (meth)acrylate, tricyclodecanyl(meth)acrylate and cyclohexyl(meth)acrylate.

In addition to the repeating structural units recited above, the alicyclic hydrocarbon-containing acid-decomposable resin for use in the invention can contain a wide variety of repeating structural units for the purpose of controlling resistance to dry etching, suitability for standard developers, adhesiveness to substrates, resist profile, and besides, characteristics generally required for resist, such as resolution, thermal resistance and sensitivity.

Examples of such repeating structural units include repeating structural units corresponding to the monomers as recited below, but these examples should not be construed as limiting the scope of the invention.

By containing those repeating units, it becomes possible to make fine adjustments to properties required for the alicyclic hydrocarbon-containing acid-decomposable resin, especially to:

(1) solubility in coating solvents, (2) film formability (glass transition temperature), (3) alkali developability, (4) thinning of film (hydrophilic-hydrophobic balance, alkali-soluble group selection), (5) adhesion of unexposed areas to a substrate, and (6) dry etching resistance.

Examples of monomers suitable for the foregoing purposes include compounds which each have one addition-polymerizable unsaturated bond and are selected from acrylic acid esters, methacrylic acid esters, acrylamides, methacrylamides, allyl compounds, vinyl ethers, or vinyl esters.

In addition to those monomers, any other monomers may be copolymerized so long as they are addition-polymerizable unsaturated compounds capable of forming copolymers together with monomers corresponding to the various repeating structural units mentioned above.

The molar content of each repeating structural unit in the alicyclic hydrocarbon-containing acid-decomposable resin can be chosen appropriately for adjusting dry etching resistance, standard developer suitability, adhesion to substrates, resist profile, and characteristics generally required for resist, such as resolution, thermal resistance and sensitivity.

Examples of a preferred state of the alicyclic hydrocarbon-containing acid-decomposable resin for use in the invention include the following.

(1) A state of containing repeating units each having a partial structure containing an alicyclic hydrocarbon represented by any of the formulae (pI) to (pV) (side-chain type).

The repeating units contained therein are preferably (meth) acrylate repeating units each having a structure containing any of (pI) to (pV).

(2) A state of containing repeating units represented by the formula (II-AB) (main-chain type). However, the state (2) further includes the following.

(3) A state of having repeating units represented by the formula (II-Ab) and maleic anhydride derivative and (meth) acrylate structures (hybrid type).

The content of repeating units having acid-decomposable groups in the alicyclic hydrocarbon-containing acid-decomposable resin is preferably 10 to 60 mole %, far preferably 20 to 50 mole %, further preferably 25 to 40 mole %, of the total repeating structural units.

The content of repeating units having partial structures containing alicyclic hydrocarbons represented by the formulae (pI) to (pV) in the alicyclic hydrocarbon-containing acid-decomposable resin is preferably 20 to 70 mole %, far preferably 20 to 50 mole %, further preferably 25 to 40 mole %, of the total repeating structural units.

The content of repeating units represented by the formula (II-AB) in the alicyclic hydrocarbon-containing acid-decomposable resin is preferably 10 to 60 mole %, far preferably 15 to 55 mole %, further preferably 20 to 50 mole %, of the total repeating structural units.

In the resin, the content of repeating structural units based on the monomers as further copolymerizing components can also be chosen appropriately according to the intended resist performance. In general, the proportion of such repeating structural units is preferably 99 mole % or below, far preferably 90 mole % or below, further preferably 80 mole % or below, based on the total mole number of the repeating structural units having partial structures containing alicyclic hydrocarbons represented by the formulae (pI) to (pV) and the repeating units represented by the formula (II-AB).

When the composition according to the invention is designed for ArF exposure use, it is appropriate to adopt resins not having aromatic groups in point of transparency to ArF light.

As to the alicyclic hydrocarbon-containing acid-decomposable resin for use in the invention, all of its repeating units are preferably constituted of (meth)acrylate repeating units. Herein, all the repeating units may be either acrylate repeating units alone, or methacrylate repeating units alone, or a mixture of acrylate and methacrylate repeating units. However, it is preferable that the acrylate repeating units is at most 50 mole % of the total repeating units. The alicyclic hydrocarbon-containing acid-decomposable resin is far preferably a ternary copolymer containing 20 to 50 mole % of repeating units having partial structures containing alicyclic hydrocarbons represented by any of the formulae (pI) to (pV), 20 to 50 mole % of repeating units containing lactone structures and 5 to 30 mole % of repeating units having alicyclic hydrocarbon structures substituted with polar groups, or a quaternary copolymer further containing 0 to 20 mole % of other repeating units.

The resin preferred in particular is a ternary copolymer containing 20 to 50 mole % of repeating units having acid-decomposable groups, which are represented by any of the following formulae (ARA-1) to (ARA-5), 20 to 50 mole % of repeating units having lactone groups, which are represented by any of the following formulae (ARL-1) to (ARL-6), and 5 to 30 mole % of repeating units having alicyclic hydrocarbon structures substituted with polar groups, which are represented by any of the following formulae (ARH-1) to (ARH-3), or a quaternary copolymer further containing 5 to 20 mole % of repeating units having carboxyl groups, or repeating units having alicyclic hydrocarbon structures but not showing acid decomposability.

ARA-1

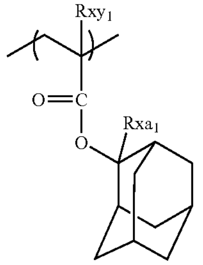

ARA-2

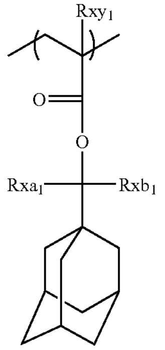

ARA-3

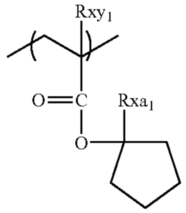

ARA-4

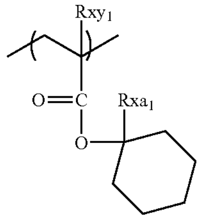

ARA-5

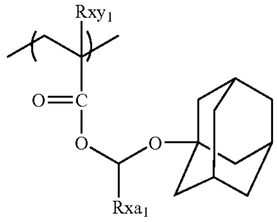

ARL-1

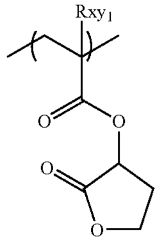

-continued

ARL-2

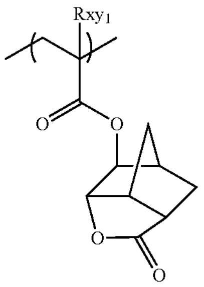

ARL-3

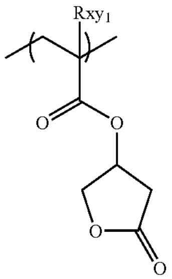

ARL-4

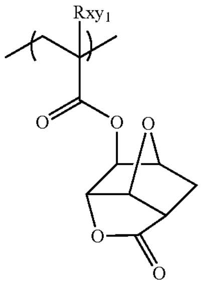

ARL-5

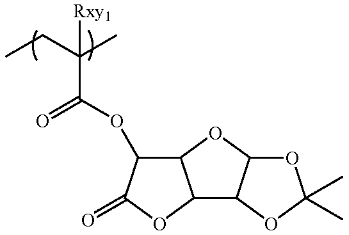

ARL-6

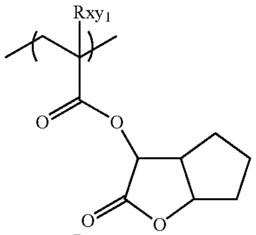

ARH-1

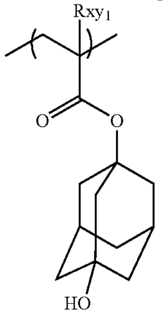

-continued

ARH-2

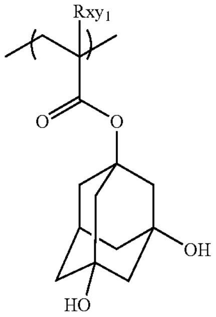

ARH-3

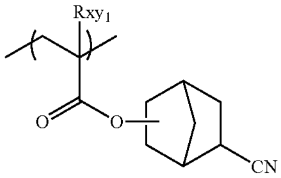

In the above concrete examples each, $Rxy_1$ represents a hydrogen atom or a methyl group.

$Rxa_1$ and $Rxb_1$ each represent a methyl group or an ethyl group independently.

The alicyclic hydrocarbon-containing acid-decomposable resin preferably has repeating units represented by the following formula (A1), repeating units represented by the following formula (A2) and repeating units represented by the following formula (A3).

(A1)

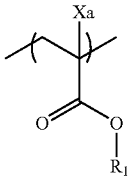

(A2)

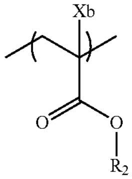

(A3)

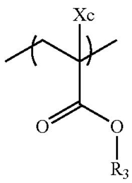

In the formulae (A1) to (A3), Xa, Xb and Xc each represent a hydrogen atom or a methyl group independently.

$R_1$ represents a univalent organic group having a lactone structure.

$R_2$ represents a univalent organic group having a hydroxyl group or a cyano group.

$R_3$ represents a group capable of splitting off under action of an acid.

The repeating units represented by the formula (A1) are preferably the repeating units represented by the formula (AI) illustrated hereinbefore.

The proportion of the repeating units represented by the formula (A1) is preferably 25 to 50 mole % of the total repeating units in the alicyclic hydrocarbon-containing acid-decomposable resin.

The repeating units represented by the formula (A2) are preferably the repeating units represented by the formula (AIIa) or (AIIb) illustrated hereinbefore.

The proportion of the repeating units represented by the formula (A2) is preferably 5 to 30 mole % of the total repeating units in the alicyclic hydrocarbon-containing acid-decomposable resin.

The repeating units represented by the formula (A3) are preferably the repeating units represented by the formula (pA) illustrated hereinbefore.

The proportion of the repeating units represented by the formula (A3) is preferably 25 to 50 mole % of the total repeating units in the alicyclic hydrocarbon-containing acid-decomposable resin.

The alicyclic hydrocarbon-containing acid-decomposable resin for use in the invention can be synthesized according to general methods (e.g., radical polymerization). As examples of a general synthesis method, there are known a batch polymerization method in which polymerization is carried out by dissolving monomer species and an initiator in a solvent and heating, and a drop polymerization method in which a solution containing monomer species and an initiator is added dropwise to a heated solvent over 1 to 10 hours. However, it is preferable to use the drop polymerization method. Examples of a reaction solvent usable herein include ethers, such as tetrahydrofuran, 1,4-dioxane and diisopropyl ether; ketones, such as methyl ethyl ketone and methyl isobutyl ketone; ester solvents, such as ethyl acetate; amide solvents, such as dimethylformamide and dimethylacetamide; and solvents described later in which the present composition can be dissolved, such as propylene glycol monomethyl ether acetate, propylene glycol monomethyl ether and cyclohexanone. It is preferable to perform polymerization by use of the same solvent as used in the present resist composition. By doing so, development of particles during storage can be retarded.

The polymerization reaction is preferably carried out in an atmosphere of inert gas, such as nitrogen or argon. And the polymerization is initiated using a commercially available radical initiator (e.g., an azo-type initiator or peroxide) as polymerization initiator. As the radical initiator, an azo-type initiator is suitable, and an azo-type initiator having an ester group, a cyano group or a carboxyl group is preferable. Examples of such a preferable azo-type initiator include azobisisobutyronitrile, azobisdimethylvaleronitrile and dimethyl 2,2'-azobis(2-methylpropionate). Such an initiator may be added additionally in the course of polymerization, or may be added in several portions, if desired. After the conclusion of the reaction, the reaction solution is poured into a solvent, and the intended polymer is collected as a powder or a solid. The concentration of a reaction system is from 5 to 50 mass %, preferably from 10 to 30 mass %, and the reaction temperature is generally from 10° C. to 150° C., preferably from 30° C. to 120° C., far preferably from 60° C. to 100° C.

When the composition according to the invention is used for the upper-layer resist of a multilayer resist, it is preferable that the resin of Component (A) contains silicon atoms.

As a resin containing silicon atoms and capable of decomposing under action of an acid to increase the solubility in an alkaline developer, a resin containing silicon atoms in at least either its main chain or side chains can be used. An example of a resin containing siloxane structures in its side chains is a copolymer of an olefin monomer having silicon atoms in side chains, maleic anhydride and a (meth)acrylic acid monomer containing an acid-decomposable group as its side chain.

The resin having silicon atoms is preferably a resin having trialkylsilyl structures or mono- or polynuclear cyclosiloxane structures, far preferably a resin containing repeating units having structures represented by any of the following formulae (SS-1) to (SS-4), further preferably a resin containing (meth)acrylate, vinyl or allyl repeating units having structures represented by any of the formulae (SS-1) to (SS-4).

SS-1

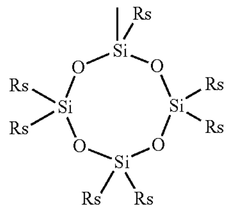

SS-2

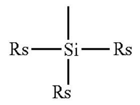

SS-3

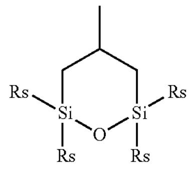

SS-4

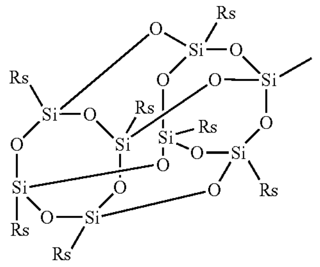

In the formulae (SS-1) to (SS-4), each Rs represents a 1-5C alkyl groups, preferably a methyl group or an ethyl group.

The resin having silicon atoms is preferably a resin containing at least two different types of repeating units having silicon atoms, far preferably a resin containing both (Sa) repeating units each having 1 to 4 silicon atoms and (Sb) repeating units each having 5 to 10 carbon atoms, further preferably a resin containing at least one type of repeating units chosen from those having structures represented by the formulae (SS-1) to (SS-3) and repeating units having structures represented by the formula (SS-4).

As to the resin of Component (A), the weight average molecular weight thereof is preferably from 1,500 to 100,000, far preferably from 2,000 to 70,000, particularly preferably from 3,000 to 50,000. The dispersion degree thereof is preferably from 1.0 to 3.0, far preferably from 1.0 to 2.5, further preferably from 1.0 to 2.0.

The addition amount of resin of Component (A) is from 50 to 99.7 mass %, preferably from 70 to 99.5 mass %, of the total solids in the positive resist composition.

[2] Compound (B) that can Generate Acid Upon Irradiation with Actinic Ray or Radiation The positive resist composition according to the invention contains a compound capable of generating an acid upon irradiation with an actinic ray or radiation (which is also referred to as "an acid generator").

The compound usable as such an acid generator can be selected appropriately from photo-initiators for cationic photopolymerization, photo-initiators for radical photopolymerization, photodecoloring agents for dyes, photodiscoloring agents, compounds used in microresist and known to generate acids upon irradiation with an actinic ray or radiation, or mixtures of two or more thereof.

Examples of such compounds include diazonium salts, phosphonium salts, sulfonium salts, iodonium salts, imide sulfonates, oxime sulfonates, diazodisulfone, disulfone and o-nitrobenzylsulfonate.

In addition, polymeric compounds having those groups or compounds capable of generating acids upon irradiation with an actinic ray or radiation in a state of being introduced in their main or side chains can also be used. Examples of such polymeric compounds include the compounds as disclosed in U.S. Pat. No. 3,849,137, German Patent No. 3914407, JP-A-63-26653, JP-A-55-164824, JP-A-62-69263, JP-A-63-146038, JP-A-63-163452, JP-A-62-153853 and JP-A-63-146029.

Further, the compounds capable of generating acids by the action of light as disclosed in U.S. Pat. No. 3,779,778 and European Patent No. 126,712 can also be used.

Of the compounds capable of decomposing upon irradiation with an actinic ray or radiation to generate acids; compounds represented by the following formulae (ZI), (ZII) and (ZIII) respectively are preferred.

ZI

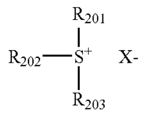

ZII

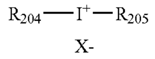

ZIII

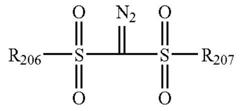

In the formula (ZI), $R_{201}$, $R_{202}$ and $R_{203}$ each represent an organic group independently.

$X^-$ represents a non-nucleophilic anion, preferably a sulfonic acid anion, a carboxylic acid anion, a bis(alkylsulfonyl) amide anion, a tris(alkylsulfonyl)methide anion, $BF_4^-$, $PF_6^-$ or $SbF_6^-$, far preferably an organic anion having at least one carbon atom.

Suitable examples of an organic anion include organic anions represented by the following formulae.

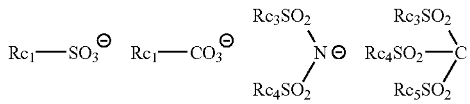

In the above formulae, $Rc_1$ represents an organic group.

Examples of an organic group as $Rc_1$ include those containing 1 to 30 carbon atoms, preferably alkyl groups, aryl groups and groups formed by connecting two or more of those groups via one or more of linkage groups, such as a single bond, —O—, —$CO_2$—, —S—, —$SO_3$— and —$SO_2N$($Rd_1$)—. $Rd_1$ represents a hydrogen atom or an alkyl group.

$Rc_3$, $Rc_4$ and $Rc_5$ each represents an organic group. Examples of such an organic group include the same organic groups as recited as those preferred by $Rc_1$, particularly preferably 1-4C perfluoroalkyl groups.

$Rc_3$ and $Rc_4$ may combine with each other to form a ring. The group formed by combining $Rc_3$ with $Rc_4$ is an alkylene group or an arylene group, preferably a 2-4C perfluoroalkylene group.

The organic groups particularly preferred as $Rc_1$ and $Rc_3$ to $Rc_5$ are alkyl groups substituted with fluorine atoms or fluoroalkyl groups at their respective 1-positions and phenyl groups substituted with fluorine atoms or fluoroalkyl groups. When a fluorine atom or a fluoroalkyl group is present, the acid generated by irradiation with light can have high acidity to result in enhancement of the sensitivity. On the other hand, when $Rc_3$ and $Rc_4$ combine with each other to form a ring, the acid generated by irradiation with light can also increase its acidity to result in enhancement of the sensitivity.

The number of carbon atoms in the organic group of $R_{201}$, $R_{202}$ and $R_{203}$ each is generally from 1 to 30, preferably from 1 to 20.

Two of $R_{201}$ to $R_{203}$ may combine with each other to form a ring structure, and the ring formed may contain an oxygen atom, a sulfur atom, an ester linkage, an amide linkage or a carbonyl group. Examples of a group formed by combining two of $R_{201}$, $R_{202}$ and $R_{203}$ include alkylene groups (such as a butylene group and a pentylene group).

Examples of organic groups as $R_{201}$, $R_{202}$ and $R_{203}$ include corresponding groups in compounds (Z1-1), (Z1-2) and (Z1-3) described below.

The acid generator may be a compound having two or more of structures represented by formula (ZI). For instance, it may be a compound having a structure that at least one of $R_{201}$, $R_{202}$ and $R_{203}$ in one compound represented by formula (ZI) is bound to at least one of $R_{201}$, $R_{202}$ and $R_{203}$ in another compound represented by formula (ZI).

Examples of a further preferred component (ZI) include compounds (ZI-1), (ZI-2) and (ZI-3).

The compound (Z1-1) is an arylsulfonium compound represented by the formula (ZI) in which at least one of $R_{201}$ to $R_{203}$ is an aryl group, namely a compound having an arylsulfonium as its cation.

In such an arylsulfonium compound, all of $R_{201}$ to $R_{203}$ may be aryl groups, or one or two of $R_{201}$ to $R_{203}$ may be aryl groups and the remainder may be an alkyl group or a cycloalkyl group.

Examples of such an arylsulfonium compound include a triarylsulfonium compound, a diarylalkylsulfonium compound, an aryldialkylsulfonium compound, a diarylcycloalkylsulfonium and an aryldicycloalkylsulfonium compound.

The aryl group in the arylsulfonium compound is preferably an aryl group such as a phenyl group or a naphthyl group, or a heteroaryl group such as an indole residue or a pyrrole residue, far preferably a phenyl group or an indole residue. When the arylsulfonium compound has two or more aryl groups, the two or more aryl groups may be the same or different.

One or two alkyl groups which the arylsulfonium compound has as required are preferably 1-15C straight-chain or branched alkyl groups, with examples including a methyl group, an ethyl group, a propyl group, an n-butyl group, a sec-butyl group and a t-butyl group.

One or two cycloalkyl groups which the arylsulfonium compound has as required are preferably 3-15C cycloalkyl groups, with examples including a cyclopropyl group, a cyclobutyl group and a cyclohexyl group.

The aryl group, the alkyl group or the cycloalkyl group represented by any of $R_{201}$ to $R_{203}$ may have as a substituent an alkyl group (containing, e.g., 1 to 15 carbon atoms), a cycloalkyl group (containing, e.g., 3 to 15 carbon atoms), an aryl group (containing, e.g., 6 to 14 carbon atoms), an alkoxy group (containing, e.g., 1 to 15 carbon atoms), a halogen atom, a hydroxyl group or a phenylthio group. Suitable examples of such substituents include 1-12C straight-chain or branched alkyl groups, 3-12C cycloalkyl groups and 1-12C straight-chain, branched or cyclic alkoxy groups. Of these substituents, 1-4C alkyl groups and 1-4C alkoxy groups are preferred over the others. One of $R_{201}$ to $R_{203}$ may have such a substituent, or all of $R_{201}$ to $R_{203}$ may have such substituents. When $R_{201}$ to $R_{203}$ are aryl groups, it is preferable that such a substituent is situated in the p-position of each aryl group.

Next, the compound (ZI-2) is described below.

The compound (ZI-2) is a compound represented by the formula (ZI) wherein $R_{201}$ to $R_{203}$ each independently represent an organic group having no aromatic ring. The term "aromatic ring" as used herein is intended to also include aromatic rings containing hetero atoms.

The number of carbon atoms in an aromatic ring-free organic group as each of $R_{201}$ to $R_{203}$ is generally from 1 to 30, preferably from 1 to 20.

Each of $R_{201}$ to $R_{202}$ is preferably an alkyl group, a cycloalkyl group, an allyl group or a vinyl group, far preferably a straight-chain, branched or cyclic 2-oxoalkyl group, or an alkoxycarbonylmethyl group, further preferably a straight-chain or branched 2-oxoalkyl group.

The alkyl group as each of $R_{201}$ to $R_{203}$ may have either a straight-chain or a branched form, with suitable examples including 1-10C straight-chain and branched alkyl groups (such as a methyl group, an ethyl group, a propyl group, a butyl group and a pentyl group). The alkyl group as each of $R_{201}$ to $R_{203}$ is far preferably a straight-chain or branched 2-oxoalkyl group or an alkoxycarbonylmethyl group.

The cycloalkyl group as each of $R_{201}$ to $R_{203}$ is preferably a 3-10C cycloalkyl group (such as a cyclopentyl group; a cyclohexyl group or a norbornyl group). The cycloalkyl group as each of $R_{201}$ to $R_{203}$ is far preferably a cyclic 2-oxoalkyl group.

Suitable examples of a straight-chain, branched and cyclic 2-oxoalkyl group as each of $R_{201}$ to $R_{203}$ include the above-recited alkyl and cycloalkyl groups having >C=O at their respective 2-positions.

The alkoxy moiety in an alkoxycarbonylmethyl group as each of $R_{201}$ to $R_{203}$ is preferably a 1-5C alkoxy group (such as a methoxy, ethoxy, propoxy, butoxy or pentoxy group).

Each of groups represented by $R_{201}$ to $R_{203}$ may further be substituted with a halogen atom, an alkoxy group (containing, e.g., 1 to 5 carbon atoms), a hydroxyl group, a cyano group or a nitro group.

The compound (ZI-3) is a compound represented by the following formula (ZI-3), namely a compound having a phenacylsulfonium salt structure.

(ZI-3)

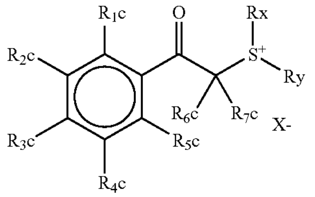

In the formula (ZI-3), $R_{1c}$ to $R_{5c}$ each represent a hydrogen atom, an alkyl group, a cycloalkyl group, an alkoxy group or a halogen atom independently.

$R_{6c}$ and $R_{7c}$ each represent a hydrogen atom, an alkyl group or a cycloalkyl group independently.

$R_x$ and $R_y$ each represent an alkyl group, a cycloalkyl group, an allyl group or a vinyl group independently.

Any two or more of $R_{1c}$ to $R_{7c}$ may combine with one another to form a ring structure, and $R_x$ and $R_y$ may also combine with each other to form a ring structure. In such a ring structure, an oxygen atom, a sulfur atom, an ester linkage or an amide linkage may be contained. The group formed by combining any two or more of $R_{1c}$ to $R_{7c}$ or by combining $R_x$ and $R_y$ may be a butylene group or a pentylene group.

$X^-$ represents a non-nucleophilic anion, and examples thereof include the same non-nucleophilic anions as examples of $X^-$ in formula (ZI).

The alkyl group as each of $R_{1c}$ to $R_{7c}$ may have either a straight-chain form or a branched form, and suitable examples thereof include 1-20C straight-chain and branched alkyl groups, preferably 1-12C straight-chain and branched alkyl groups (such as a methyl group, an ethyl group, a straight-chain or branched propyl group, straight-chain or branched butyl groups, and straight-chain or branched pentyl groups).

Suitable examples of the cycloalkyl group as each of $R_{1c}$ to $R_{7c}$ include 3-8C cycloalkyl groups (such as a cyclopentyl group and a cyclohexyl group).

The alkoxy group as each of $R_{1c}$ to $R_{5c}$ may have either a straight-chain form, or a branched form, or a cyclic form, and examples thereof include 1-10C alkoxy groups, preferably 1-5C straight-chain and branched alkoxy groups (such as a methoxy group, an ethoxy group, a straight-chain or branched propoxy group, straight-chain or branched butoxy groups, and straight-chain or branched pentoxy groups) and 3-8C cycloalkoxy groups (such as a cyclopentyloxy group and a cyclohexyloxy group).

It is preferable that any of $R_{1c}$ to $R_{5c}$ is a straight-chain or branched alkyl group, a cycloalkyl group, or a straight-chain, branched or cyclic alkoxy group, and it is far preferable that the number of total carbon atoms in $R_{1c}$ to $R_{5c}$ is from 2 to 15. By respond to this request, the solvent solubility can be enhanced, and development of particles during storage can be inhibited.

Examples of the alkyl group as each of $R_x$ and $R_y$ include the same groups as examples of the alkyl group as each of $R_{1c}$ to $R_{7c}$, preferably straight-chain and branched 2-oxoalkyl groups and alkoxycarbonylmethyl groups.

Examples of the cycloalkyl group as each of $R_x$ and $R_y$ include the same groups as examples of the cycloalkyl group as each of $R_{1c}$ to $R_{7c}$, preferably cyclic 2-oxoalkyl groups Examples of the straight-chain, branched and cyclic 2-oxoalkyl groups include the same alkyl and cycloalkyl groups as $R_{1c}$ to $R_{7c}$ may represent, except that they have >C=O at their respective 2-positions.

The alkoxy moiety in the alkoxycarbonylmethyl group includes the same alkoxy groups as $R_{1c}$ to $R_{5c}$ each may represent.

Each of $R_x$ and $R_y$ is preferably an alkyl group containing at least 4 carbon atoms, far preferably an alkyl group containing at least 6 carbon atoms, further preferably an alkyl group containing at least 8 carbon atoms.

In the formulae (ZII) and (ZIII) each, $R_{204}$ to $R_{207}$ each represent an aryl group, an alkyl group or a cycloalkyl group independently.

The aryl group as each of $R_{204}$ to $R_{207}$ is preferably a phenyl group or a naphthyl group, far preferably a phenyl group.

The alkyl group as each of $R_{204}$ to $R_{207}$ may have either a straight-chain form or a branched form, with suitable examples including 1-10C straight-chain and branched alkyl groups (such as a methyl group, an ethyl group, a propyl group, a butyl group and a pentyl group).

Suitable examples of the cycloalkyl group as each of $R_{204}$ to $R_{207}$ include 3-10C cycloalkyl groups (such as a cyclopentyl group, a cyclohexyl group and a norbornyl group).

Examples of a substituent that $R_{204}$ to $R_{207}$ each may have include an alkyl group (containing, e.g., 1 to 15 carbon atoms), a cycloalkyl group (containing, e.g., 3 to 15 carbon atoms), an aryl group (containing, e.g., 6 to 15 carbon atoms), an alkoxy group (containing, e.g., 1 to 15 carbon atoms), a halogen atom, a hydroxyl group and a phenylthio group.

$X^-$ represents a non-nucleophilic anion, and examples thereof include the same non-nucleophilic anions as the $X^-$ in the formula (ZI) represents.

As examples of preferred ones of compounds which can decompose upon irradiation with an actinic ray or radiation to generate acids, compounds represented by the following formulae (ZIV), (ZV) and (ZVI) can be further given.

ZIV $$Ar_3—SO_2—SO_2—Ar_4$$

ZV

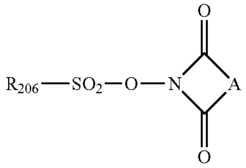

ZVI

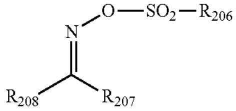

In the formulae (ZIV) to (ZVI), $Ar_3$ and $Ar_4$ each represent an aryl group independently.

$R_{206}$ represents an alkyl group or an aryl group.

$R_{207}$ and $R_{208}$ each represent an alkyl group, an aryl group or an electron-attracting group. $R_{207}$ is preferably an aryl group. $R_{208}$ is preferably an electron-attracting group, far preferably a cyano group or a fluoroalkyl group.

A represents an alkylene group, an alkenylene group or an arylene group.

Of the compounds that can decompose upon irradiation with an actinic ray or radiation to generate acids, the compounds represented by (ZI) to (ZIII) are preferred over the others.

Examples of particularly preferred ones of compounds that can decompose upon irradiation with an actinic ray or radiation to generate acids are illustrated below.

(z1)

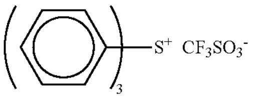

(z2)

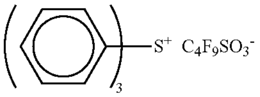

(z3)

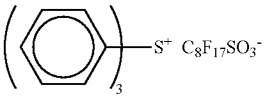

(z4)

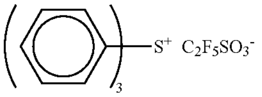

(z5)

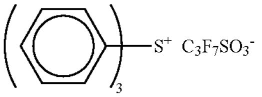

(z6)

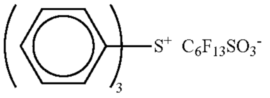

(z7)

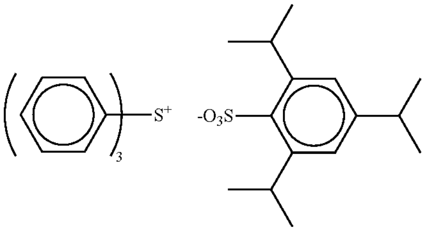

(z8)

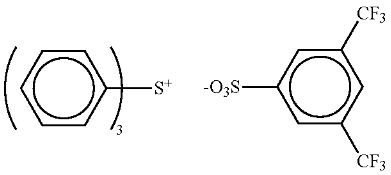

(z9)

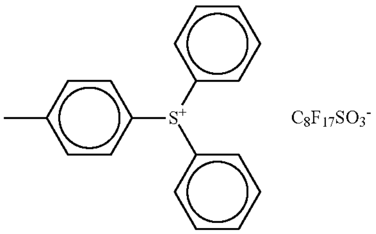

(z10)

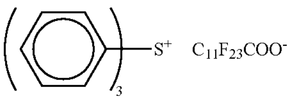

(z11)

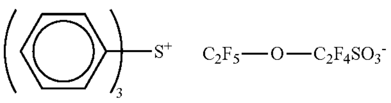

-continued
(z12)
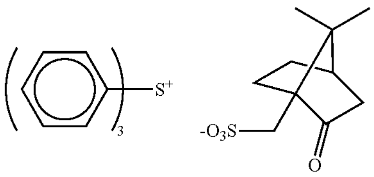
(Z13)
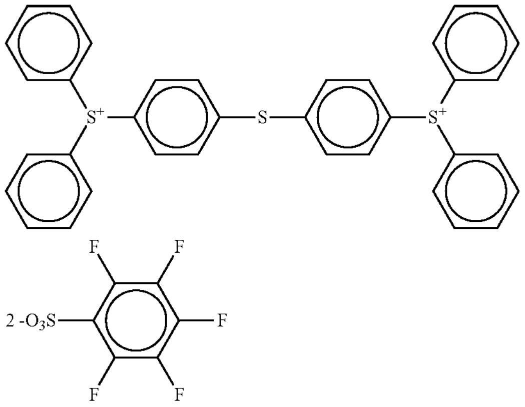
(z14)
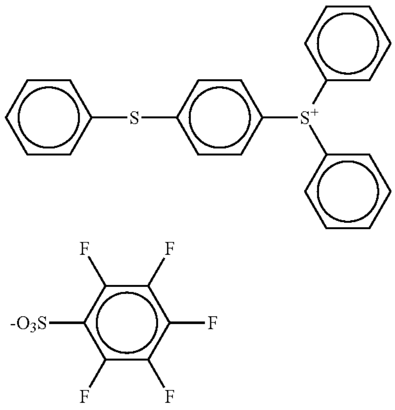
(z15)
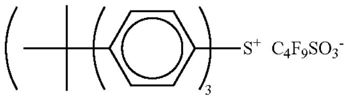
(z16)
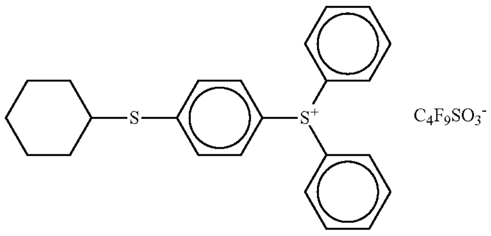
(z17)
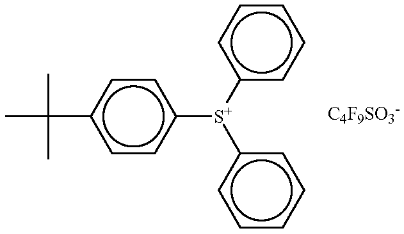
-continued
(z18)
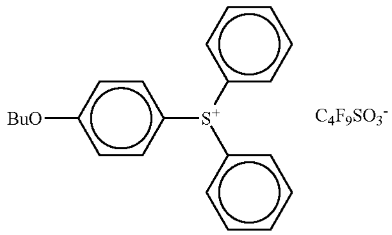
(z19)
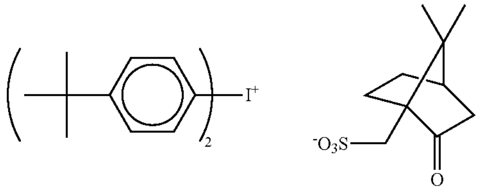
(z20)
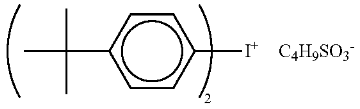
(z21)
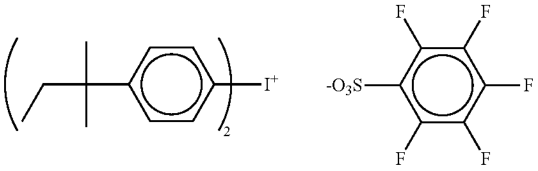
(z22)
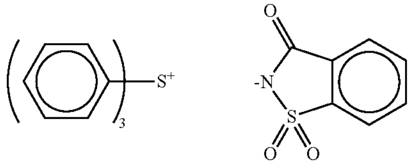
(z23)
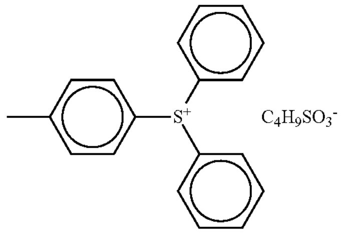
(z24)
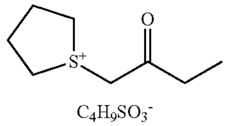
(z25)
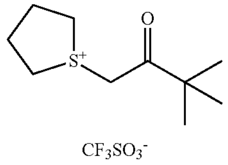

-continued
(z26)
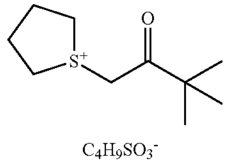
(z27)
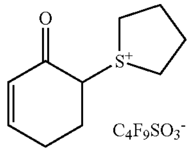
(z28)
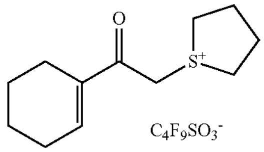
(z29)
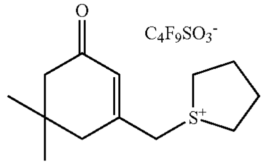
(z30)
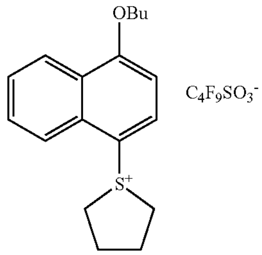
(z31)
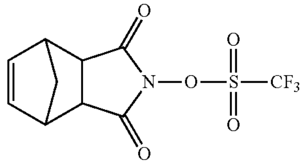
(z32)
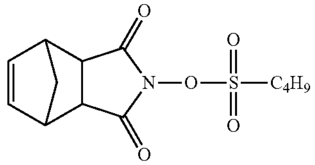
(z33)
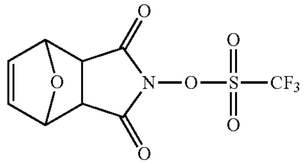
(z34)
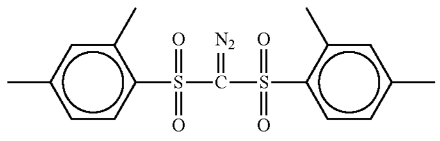
-continued
(z35)
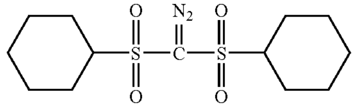
(z36)
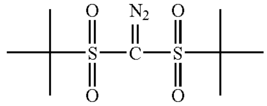
(z37)
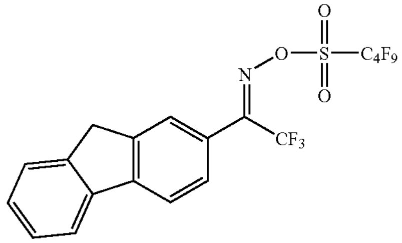
(z38)
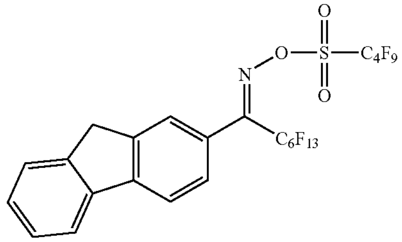
(z39)
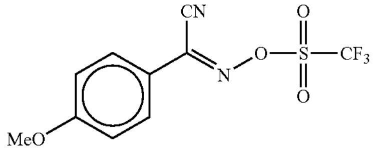
(z40)
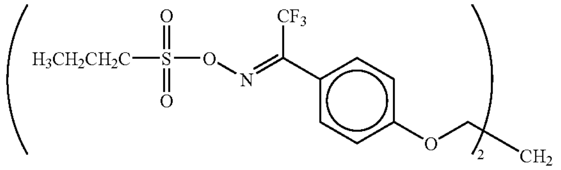
(z41)
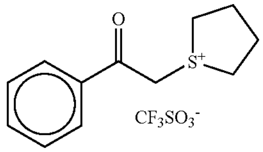
(z42)
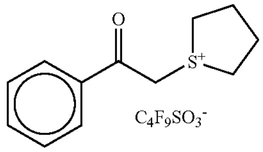

-continued
(z43)
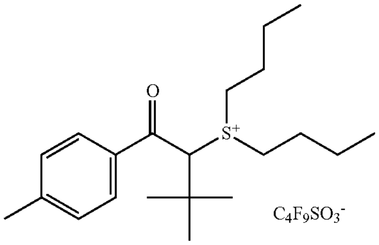
(z44)
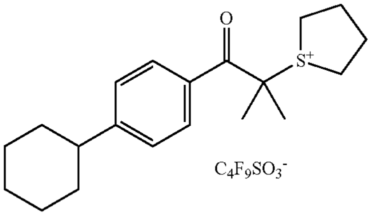
(z45)
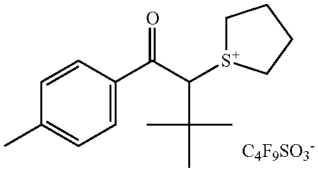
(z46)
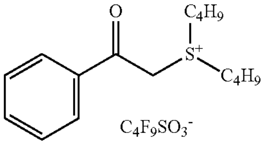
(z47)
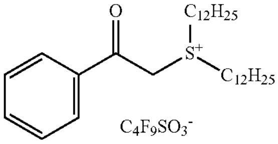
(z48)
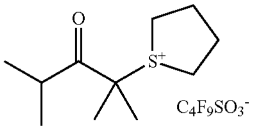
(z49)
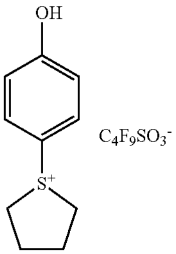
(z50)
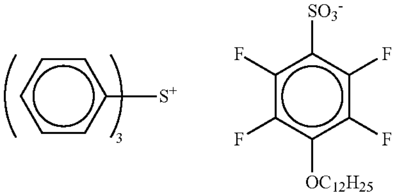
-continued
(z51)
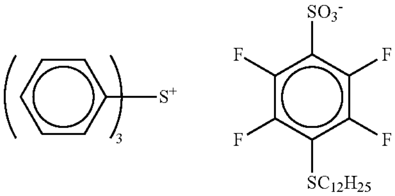
(z52)
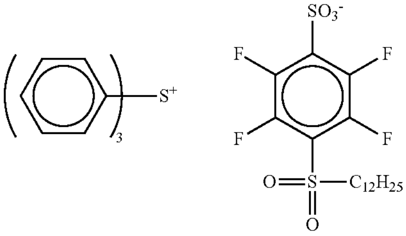
(z53)
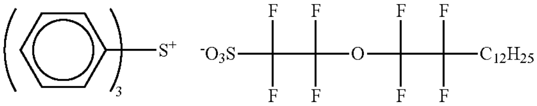
(z54)
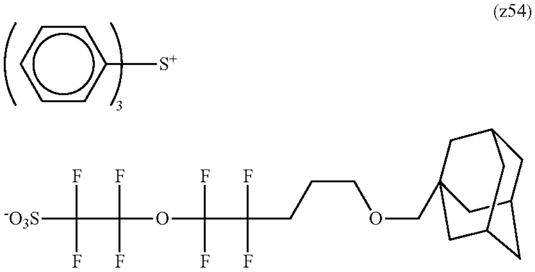
(z55)
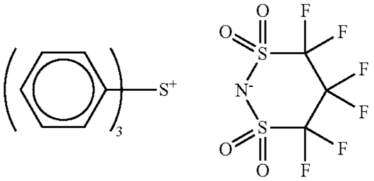
(z56)
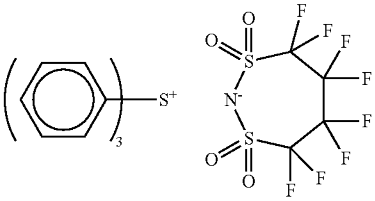
(z57)
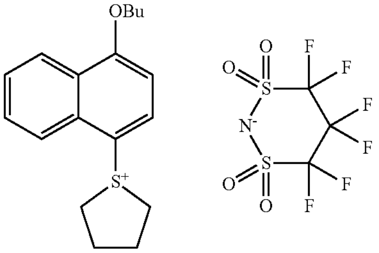

-continued (z58)

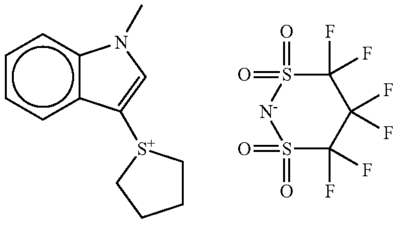

(z59)

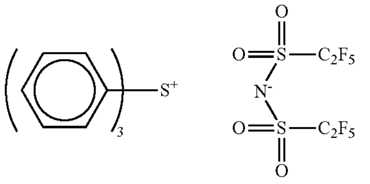

(z60)

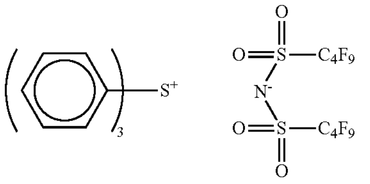

(z61)

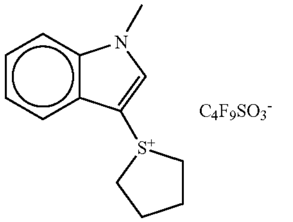

(z62)

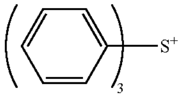

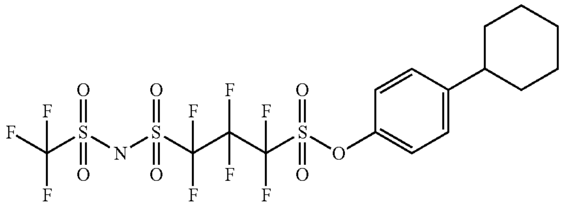

(z63)

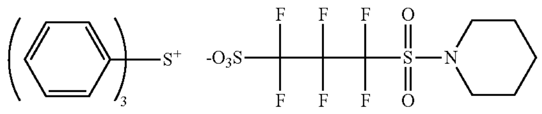

(z64)

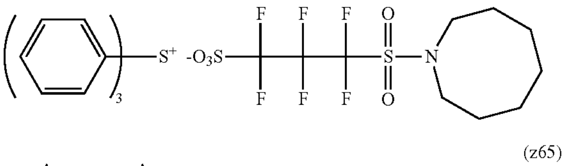

(z65)

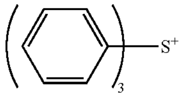

-continued

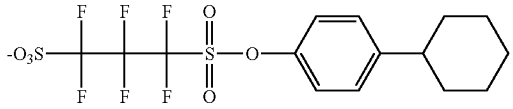

(z66)

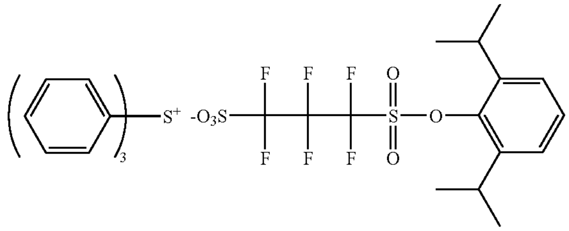

Acid generators can be used singly or as combinations of two or more thereof. When two or more types of acid generators are used in combination, it is preferable that compounds generating two types of organic acids differing from each other by at least two in the total number of atoms, except for hydrogen atoms, are used in combination.

The content of acid generators in a positive resist composition is preferably from 0.1 to 20 mass %, far preferably from 0.5 to 10 mass %, further preferably from 1 to 7 mass %, based on the total solids in the composition.

[3] Fluorine-Containing Resin (C)

The positive resist composition according to the invention contains a fluorine-containing resin having at least one group selected from the following category (X), (XI) or (XII).

(X): Alkali-soluble groups.

(XI): Groups capable of decomposing under action of an alkali developer and increasing resin (C) solubility in an alkaline developer.

(XII): Groups capable of decomposing under action of an acid and increasing resin (C) solubility in an alkaline developer.

(X) Alkali-Soluble Group

Examples of an alkali-soluble group include a phenolic hydroxyl group, a carboxylic group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group and a tris(alkylsulfonyl)methylene group.

Of these alkali-soluble groups, a fluorinated alcohol group (preferably a hexafluoroisopropanol group or $-C(CF_3)(CF_3)(OH)$), a sulfonimido group and a bis(alkylcarbonyl)methylene group are preferred over the others.

(XI) Group Capable of Decomposing Under Action of Alkali Developer and Increasing Resin (C) Solubility in Alkaline Developer Examples of a group capable of decomposing under action of an alkali developer and increasing resin (C) solubility in an alkaline developer include a lactone group, an acid anhydride group and an acid imide group.

(XII) Group Capable of Decomposing Under Action of Acid and Increasing Resin (C) Solubility in Alkaline Developer Examples of a group capable of decomposing under action of an acid and increasing resin (C) solubility in an alkaline developer include the same acid-decomposable groups as recited in the description of alicyclic hydrocarbon-containing acid-decomposable resins.

In a fluorine-containing resin (C), fluorine atoms may be contained in any of groups falling under the categories (X) to (XII), or may be contained in other moieties. Fluorine atoms, though may be contained in either main chain or side chains of the resin, are preferably contained in side chains. Additionally, fluorine atoms may be contained in repeating units having groups falling under any of the categories (X) to (XII), or may be contained in other repeating units.

The fluorine-containing resin (C) is preferably a resin having fluorine-containing 1-4C alkyl groups, fluorine-containing cycloalkyl groups, or fluorine-containing aryl groups.

The alkali-soluble resin (C) among fluorine-containing resins is a resin having alkali solubility, or a resin soluble in an alkali developer as mentioned below (an alkaline aqueous solution having a pH of 10.0 to 15.0 at 23° C.).

Therefore, the alkali-soluble resin (C) has alkali-soluble groups (X) and/or groups (XI) that can decompose under action of an alkali developer and increase alkali developer solubility of the resin of Component (C).

Examples of groups (X) and (XI) include the same ones as the foregoing groups.

The fluorine-containing 1-4C alkyl groups are 1-4C straight-chain or branched alkyl groups which each are substituted with at least one fluorine atom and may further have another substituent.

The fluorine-containing cycloalkyl groups are mononuclear or polynuclear cycloalkyl groups which each are substituted with at least one fluorine atom and may further have another substituent.

The fluorine-containing aryl groups are aryl groups, such as a phenyl group or a naphthyl group, which each are substituted with at least one fluorine atom and may further have another substituent.

Examples of the fluorine-containing resin (C) include resins having repeating units represented by any of the following formulae (C1) to (C5).

(C1)

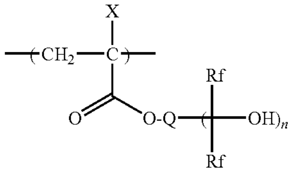

(C2)

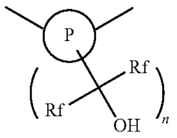

(C3)

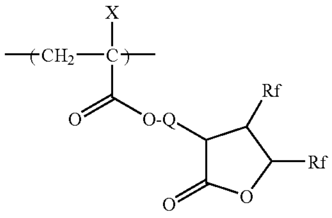

(C4)

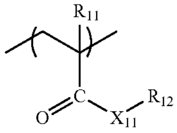

(C5)

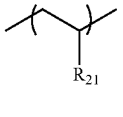

In the formulae (C1) to (C5), Rfs each represent a group having a 1-4C fluoroalkyl group or a hydrogen atom independently.

P represents a straight-chain or branched alkylene group, or a mononuclear or polynuclear cycloalkylene group, preferably a methylene group, an ethylene group, a cyclohexylene group, an adamantylene group or a norbornylene group.

X represents a hydrogen atom, a halogen atom, or an alkyl group. The alkyl group may have a straight-chain or branched form, and may also have a substituent, such as a halogen atom.

Q represents a single bond, an alkylene group, a divalent linkage group having a mononuclear or polynuclear alicyclic hydrocarbon structure, an ether group, an ester group, a carbonyl group, or a divalent group formed by combining two or more of the groups recited above. When n is 2 or 3, however, Q represents any of the groups recited above which each are further substituted with one or two groups represented by —$C(Rf)_2$—OH. Q is preferably a single bond or a linkage group represented by -$Q_1$-$CO_2$—. $Q_1$ is a straight-chain or branched alkylene group, or a mononuclear or polynuclear cycloalkylene group, preferably a methylene group, an ethylene group, a cyclohexylene group, an adamantylene group or a norbornylene group.

$X_{11}$ represents an oxygen atom or a —$N(R_{13})$— group. $R_{13}$ represents a hydrogen atom, a halogen atom, or an alkyl group. The alkyl group may have a straight-chain or branched form, and may also have a substituent, such as a halogen atom.

$R_{12}$ and $R_{21}$ each represent an organic group having at least one fluorine atom.

n represents a natural number of 1 to 3.

Suitable examples of fluorine-containing repeating units in the fluorine-containing resin (C) are illustrated below, but these examples should not be construed as limiting the scope of the invention.

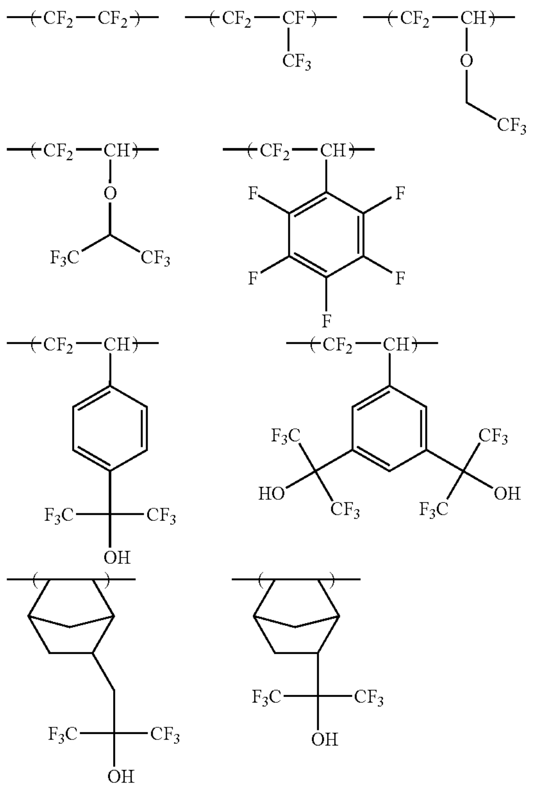

-continued
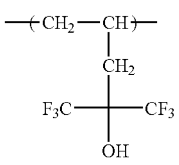
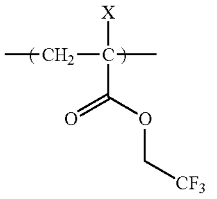
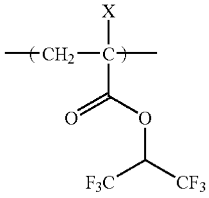
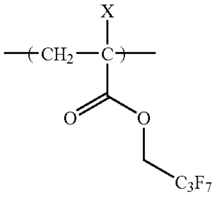
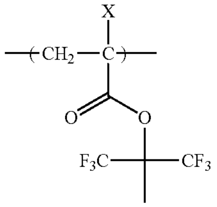
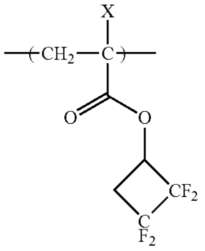
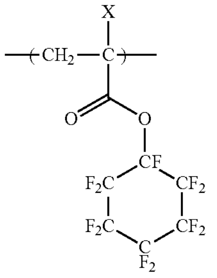
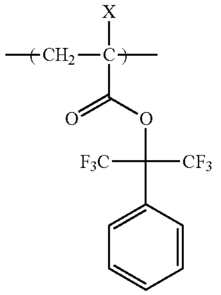
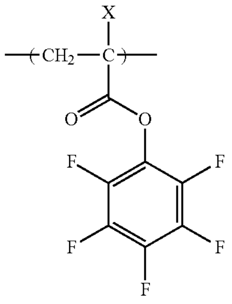
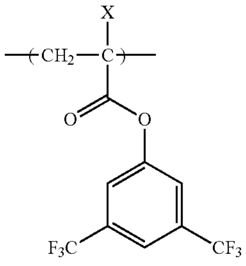
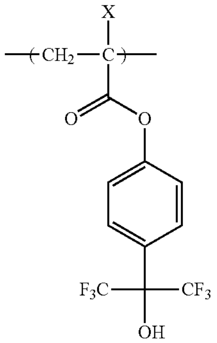
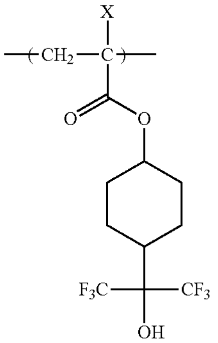
-continued
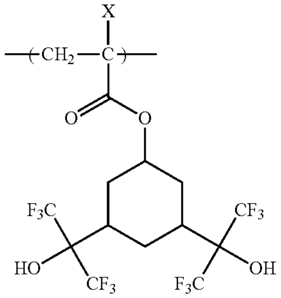
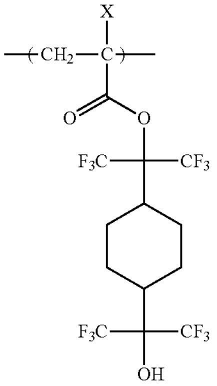
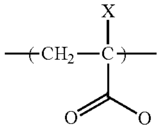
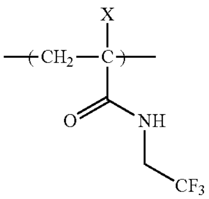
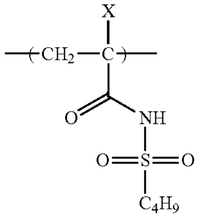
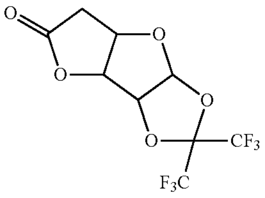
Examples of the fluorine-containing resin (C) are illustrated below, but these examples should not be construed as limiting the scope of the invention.
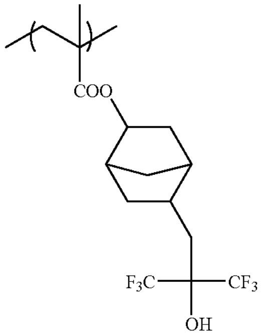
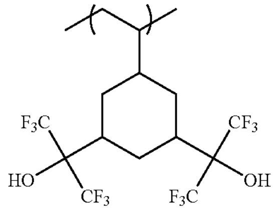
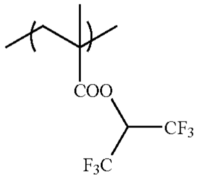
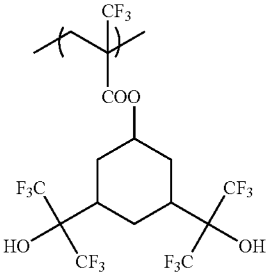

-continued
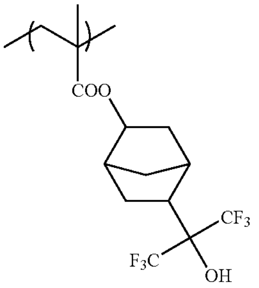
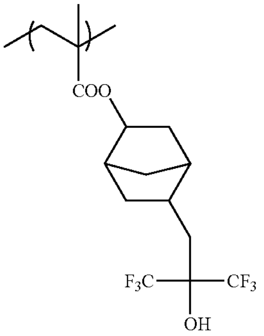
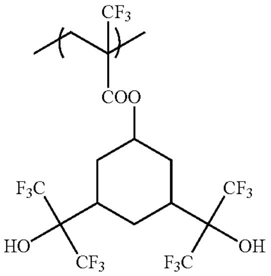
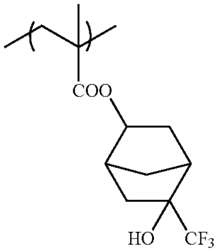
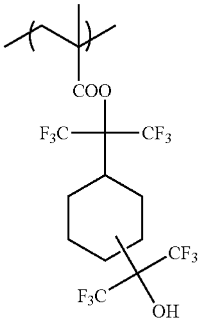
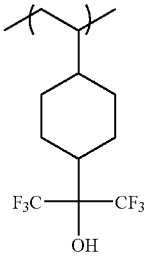
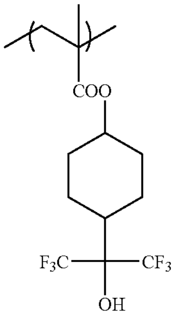
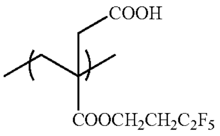
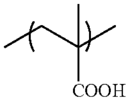
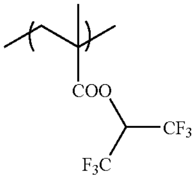
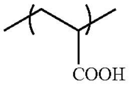
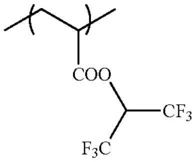
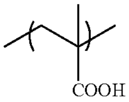
-continued
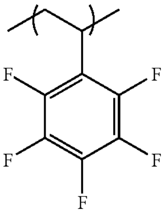
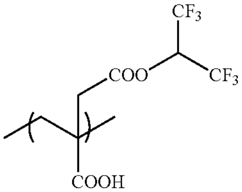
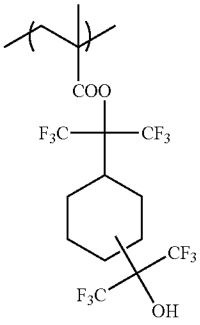
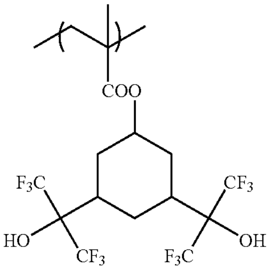
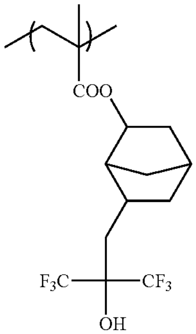
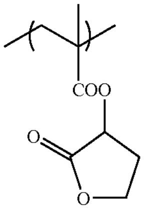
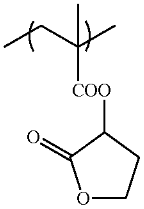
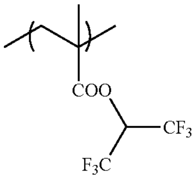
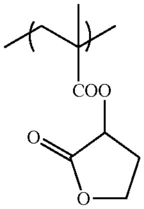
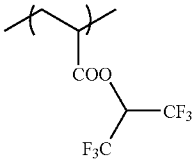
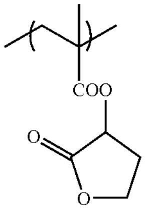
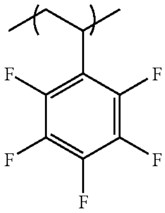
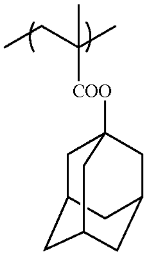
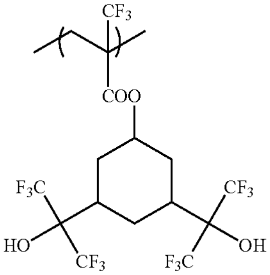

-continued
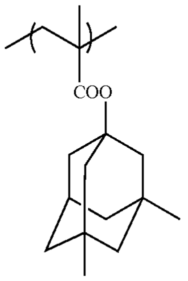
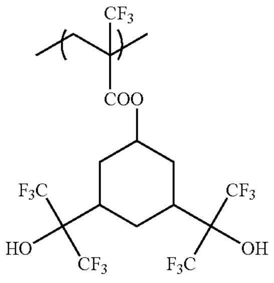
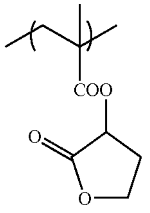
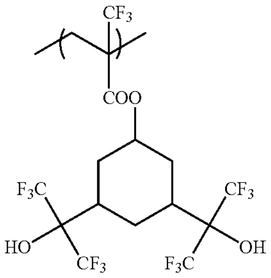
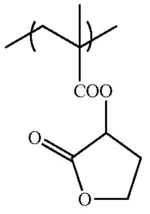
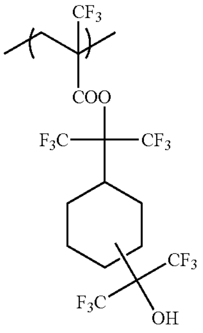
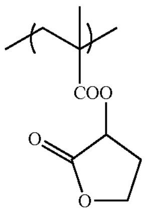
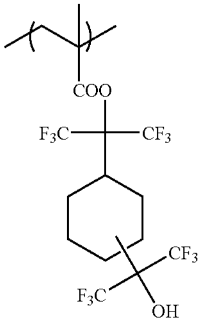
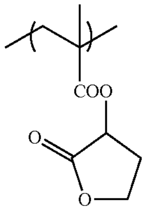
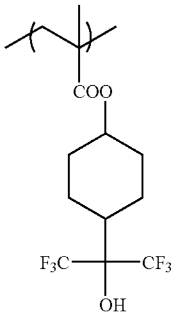
-continued
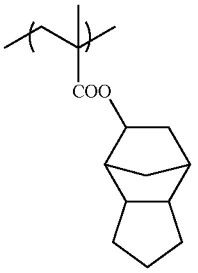
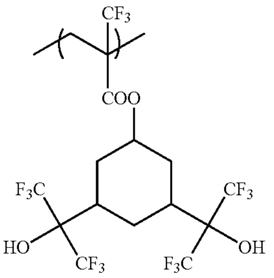
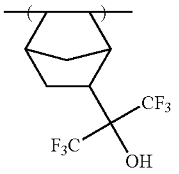
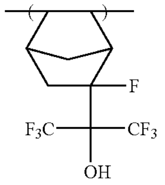
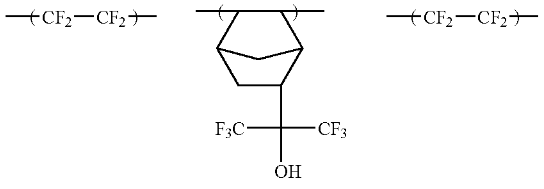
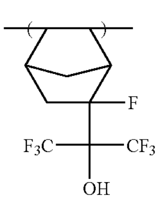
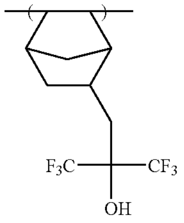
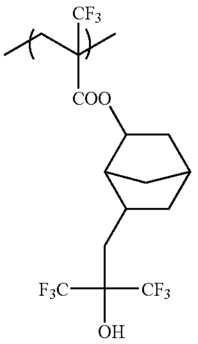
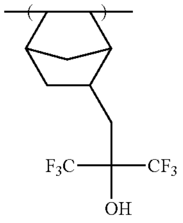
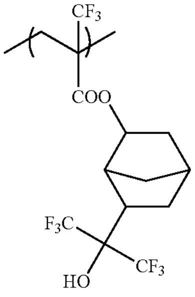
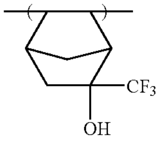
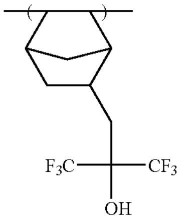

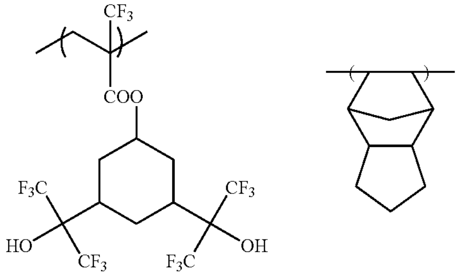
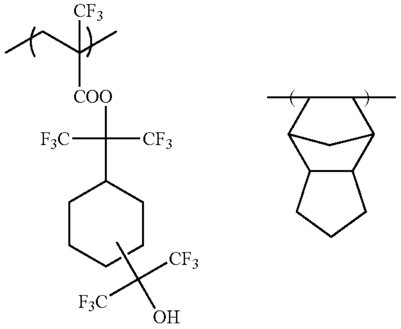
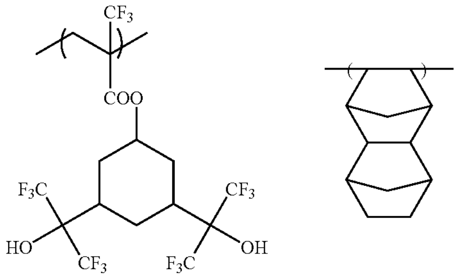
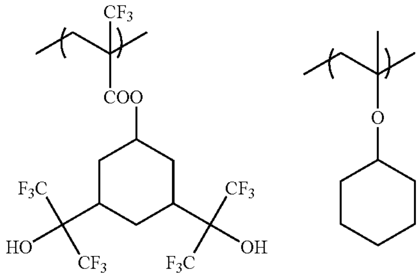
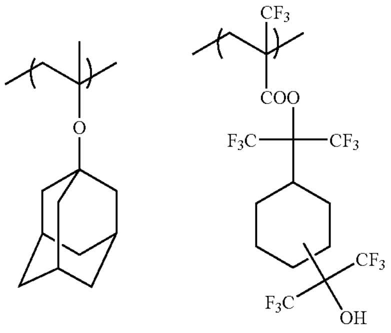
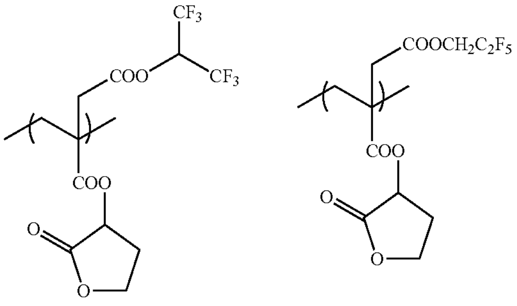
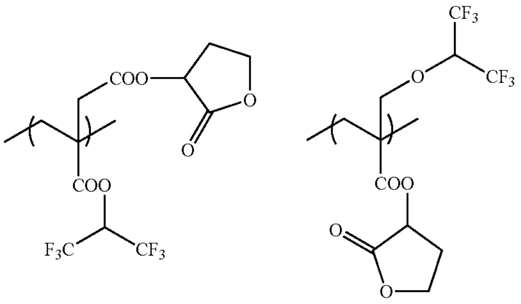
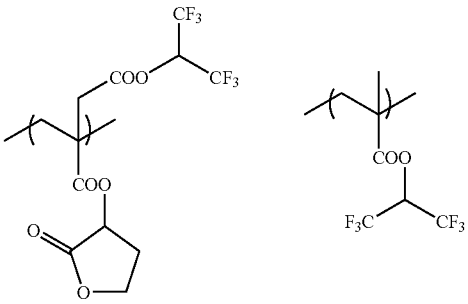
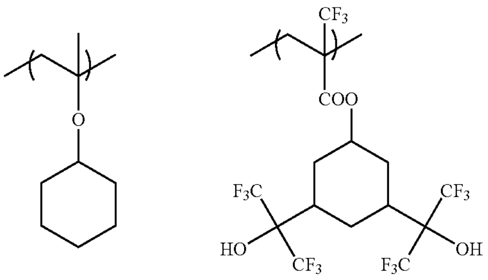
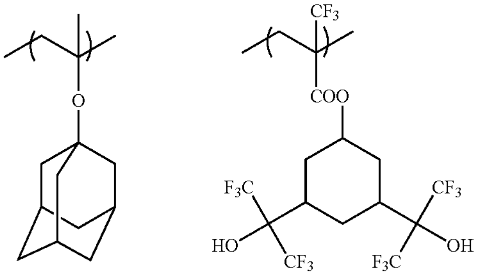

-continued
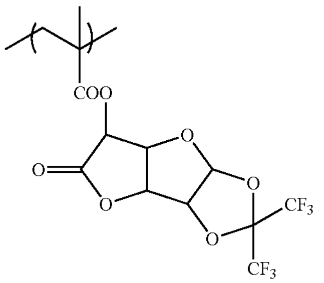
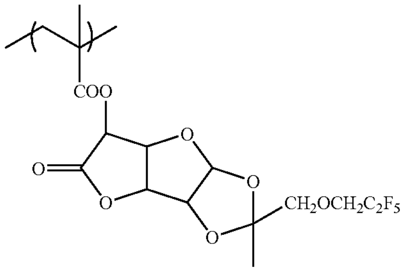
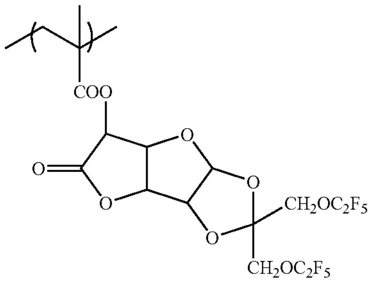
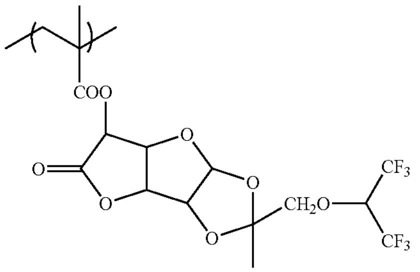
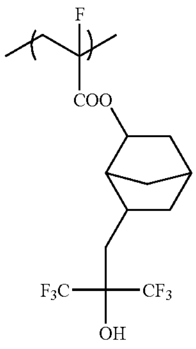
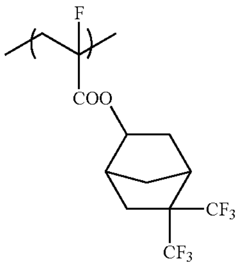
-continued
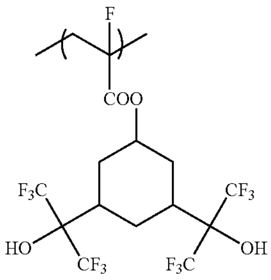
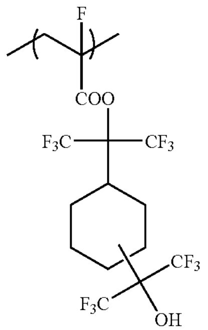
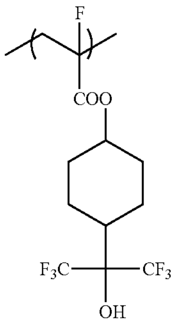
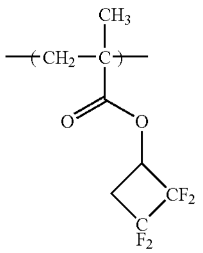
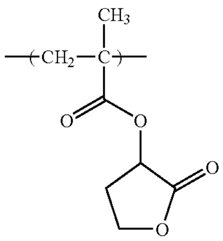
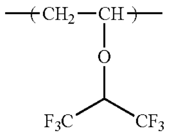
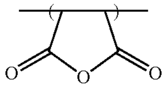
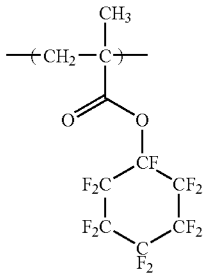
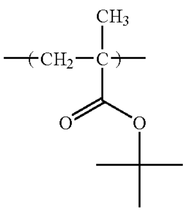
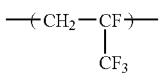
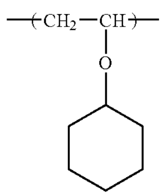
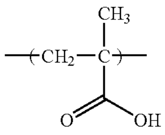
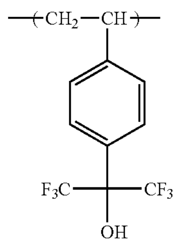

-continued

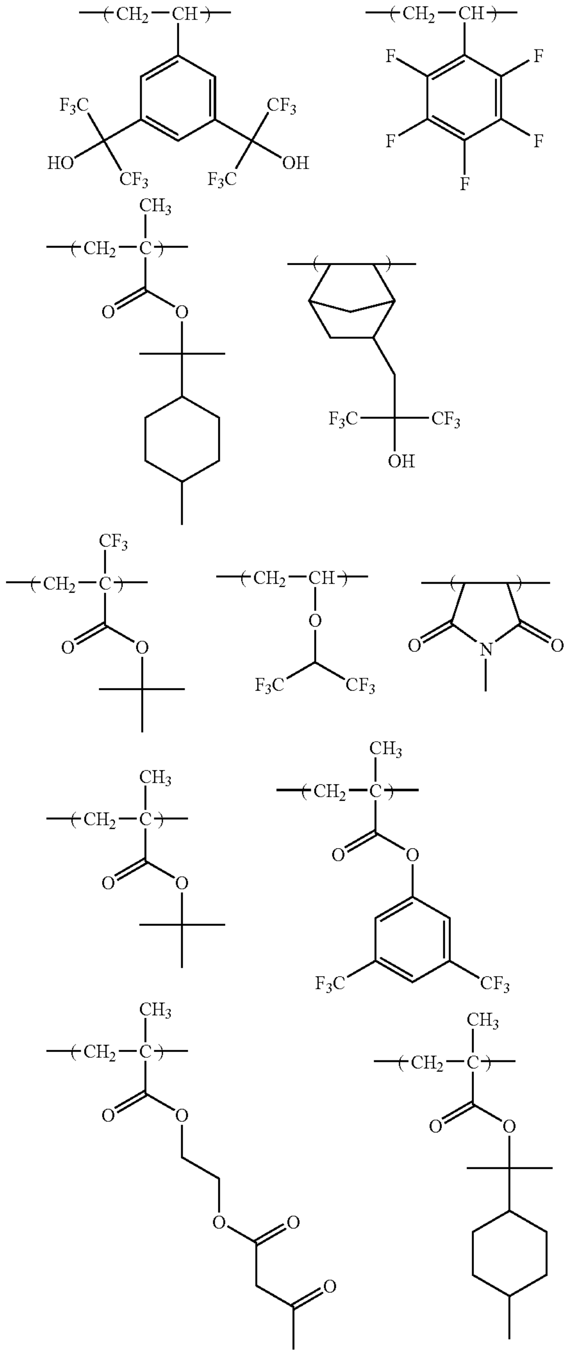

When the fluorine-containing resin (C) is an alkali-soluble resin, the amount of alkali-soluble groups (acid groups) is preferably from 2 to 10 milliequivalent/g, far preferably from 2 to 8 milliequivalent/g, in terms of an acid value of the alkali-soluble resin (C). The acid value of a compound is determined by measurement of the amount (mg) of potassium hydroxide required for neutralizing the compound.

The fluorine-containing resin (C) contains fluorine atoms in a proportion of preferably 5 to 80 mass %, far preferably 10 to 80 mass %, further preferably 20 to 60 mass %, based on the molecular weight thereof.

The weight-average molecular weight of the fluorine-containing resin (C) is preferably from 1,000 to 100,000, far preferably from 1,000 to 50,000.

The content of residual monomers in the fluorine-containing resin (C) is preferably from 0 to 10 mass %, far preferably from 0 to 5 mass %. Further, it is preferable to use the fluorine-containing resin (C) having a molecular weight distribution (Mw/Mn, also referred to as the dispersion degree) in the range of 1 to 5, especially 1 to 3, from the viewpoints of resolution, resist profile and sidewall of resist pattern and roughness.

The amount of fluorine-containing resin (C) added to a positive resist composition is preferably from 0.1 to 30 mass %, far preferably from 0.1 to 1.0 mass %, further preferably from 0.1 to 5 mass %, based on the total solids in the resist composition.

As to the fluorine-containing resin of Component (C), fluorine-containing resins may be used singly or as a Mixture of two or more thereof.

It is possible to utilize various commercial products as the fluorine-containing resin (C) or synthesize fluorine-containing resins for Component (C) in usual ways. For instance, fluorine-containing resins for Component (C) can be obtained by radical polymerization and general purification as with the aforementioned synthesis of alicyclic hydrocarbon-containing acid-decomposable resin.

It is natural for the fluorine-containing resin (C), as with the case of alicyclic hydrocarbon-containing acid-decomposable resins, to be reduced in impurities including metals, and besides, it is preferable that the content of residual monomers and oligomer components therein is below a prescribed value, e.g., below 0.1 mass % in HPLC terms. By meeting these requirements, the fluorine-containing resin (C) can contribute to not only improvements in resist sensitivity, resolution, process stability and pattern profile but also realization of resist suffering neither increase in extraneous matter nor change in sensitivity with the passage of time.

[4] Solvent (D)

Examples of a solvent which can be used in dissolving each ingredient therein to prepare a positive resist composition include organic solvents, such as an alkylene glycol monoalkyl ether carboxylate, an alkylene glycol monoalkyl ether, an alkyl lactate, an alkyl alkoxypropionate, a 4-10C cyclic lactone, a 4-10C monoketone compound which may contain a ring, an alkylene carbonate, an alkyl alkoxyacetate and an alkyl pyruvate.

Suitable examples of an alkylene glycol monoalkyl ether carbonate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Suitable examples of an alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol ethyl ether.

Suitable examples of an alkyl lactate include methyl lactate, ethyl lactate, propyl lactate, and butyl lactate.

Suitable examples of an alkyl alkoxypropionate include ethyl 3-ethoxypropionate, methyl 3-methoxypropionate, methyl 3-ethoxypropionate, and ethyl 3-methoxypropionate.

Suitable examples of a 4-10C cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Suitable examples of a 4-10C monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Suitable examples of an alkylene carbonate include propylene carbonate, vinylene carbonate, ethylene carbonate, and butylene carbonate.

Suitable examples of an alkyl alkoxyacetate include acetate-2-methoxyethyl, acetate-2-ethoxyethyl, acetate-2-(2-ethoxyethoxy)ethyl, acetate-3-methoxy-3-methylfutyl, and acetate-1-methoxy-2-propyl.

Suitable examples of an alkyl pyruvate include methyl pyruvate, ethyl pyruvate, and propyl pyruvate.

Solvents used to advantage include solvents having boiling points of 130° C. or above at ordinary temperatures and under normal atmospheric pressure. Examples of such solvents include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetate-2-ethoxyethyl, acetate-2-(2-ethoxyethoxy)ethyl, and propylene carbonate.

In the invention, the solvents recited above may be used alone, or as combinations of two or more thereof.

The solvent used in the invention may also be a mixture of a solvent having a hydroxyl group in its structure and a solvent having no hydroxyl group.

Examples of a solvent having a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Of these solvents, propylene glycol monomethyl ether and ethyl lactate are especially preferred.

Examples of a solvent having no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Of these solvents, propylene glycol monomethyl ether acetate, ethyl ethoxypropionate, 2-heptanone, γ-butyrolactone, cyclohexanone and butyl acetate are preferred over the others. Further, propylene glycol monomethyl ether acetate, ethyl ethoxypropionate and 2-heptanone in particular are used to advantage.

The mixing ratio (by mass) between the solvent containing a hydroxyl group and the solvent containing no hydroxyl group is from 1/99 to 99/1, preferably from 10/90 to 90/10, far preferably from 20/80 to 60/40. A mixed solvent containing a solvent having no hydroxyl group in a proportion of 50 weight % or above is particularly preferred from the viewpoint of evenness in coating.

[5] (E): Dissolution-Inhibiting Compound that can Decompose Under Action of Acid to Increase Solubility in Alkali Developer and has Molecular Weight of 3,000 or Below (Also Abbreviated as "Dissolution-Inhibiting Compound")

The positive resist composition according to the invention may contain a dissolution-inhibiting compound that can decompose under action of an acid to increase solubility in an alkali developer and has a molecule weight of 3,000 or below (hereinafter referred to as "a dissolution inhibitor" also).

As dissolution inhibitors, alicyclic or aliphatic compounds having acid-decomposable groups, such as the cholic acid derivatives containing acid-decomposable groups described in *Proceeding of SPIE,* 2724, 355 (1996), are suitable because they causes no lowering of transmittance at wavelengths of 220 nm or below. Examples of acid-decomposable groups and those of alicyclic structures include the same ones as recited in the description of the resin of Component (A).

The molecular weight of a dissolution inhibitor which can be used in the invention is 3,000 or below, preferably from 300 to 3,000, far preferably from 500 to 2,500.

Such a dissolution inhibitor is added in an amount of preferably 1 to 30 mass %, far preferably 2 to 20 mass %, based on the total solids in the positive resist composition.

Examples of a dissolution inhibitor are illustrated below, but these examples should not be construed as limiting the scope of the invention.

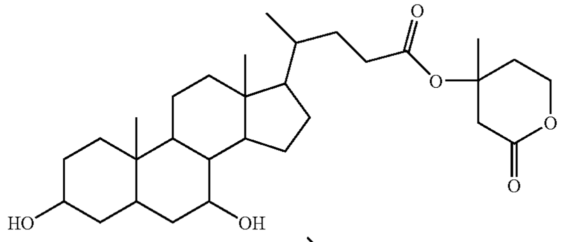

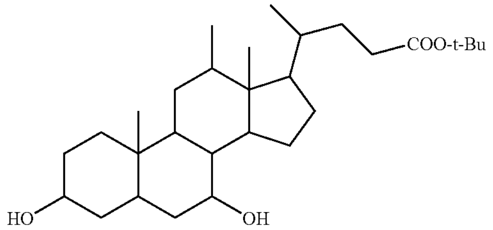

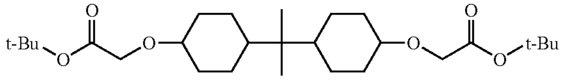

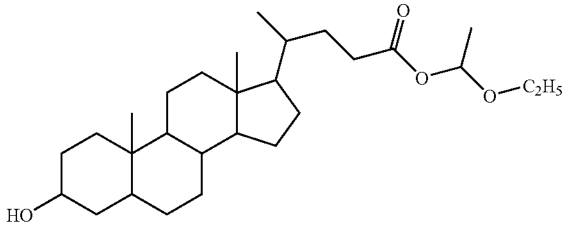

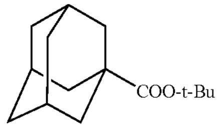

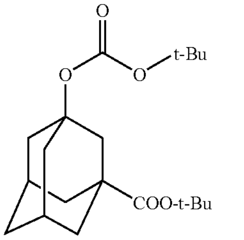

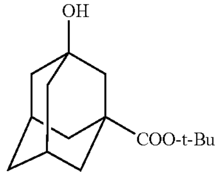

[6] (F): Basic Compound

For the purpose of reducing performance changes with the passage of time from exposure to heating, it is preferable that the positive resist composition according to the invention contains a basic compound.

Examples of such a basic compound include compounds having the following structures (A) to (E).

(A)

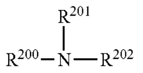

(B)

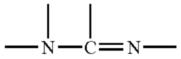

(C)

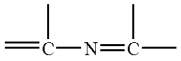

(D)

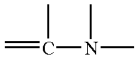

(E)

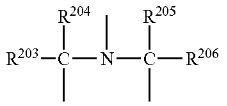

In the formula (A), $R^{200}$, $R^{201}$ and $R^{202}$, which may be the same or different, each represent a hydrogen atom, a 1-20C alkyl group, a 3-20C cycloalkyl group or a 6-20C aryl group independently. Herein, $R^{201}$ and $R^{202}$ may combine with each other to form a ring. The alkyl group may be an unsubstituted one, or may have a substituent. Suitable examples of an alkyl group having a substituent include 1-20C aminoalkyl groups, 1-20C hydroxyalkyl groups and 1-20C cyanoalkyl groups.

In the formula (E), $R^{203}$, $R^{204}$, $R^{205}$ and $R^{206}$, which may be the same or different, each represent a 1-20C alkyl group.

The alkyl groups in the formulae (A) and (E) are preferably unsubstituted alkyl groups.

Examples of such basic compounds include substituted or unsubstituted primary, secondary and tertiary aliphatic amines, aromatic amines, heterocyclic amines, amide derivatives, imide derivatives, and nitrogen-containing compounds having cyano groups. Of these compounds, aliphatic amines, aromatic amines and heterocyclic amines are preferred over the others. Suitable examples of substituents which those compounds may have include amino groups, alkyl groups, alkoxy groups, acyl groups, acyloxy groups, aryl groups, aryloxy groups, a nitro group, a cyano group, ester groups and lactone groups.

Examples of favorable compounds include guanidine, aminopyrrolidine, pyrazole, pyrazoline, piperazine, aminomorpholine, aminoalkylmorpholines and piperidine, and these compounds may have substituents. Examples of more favorable compounds include compounds having an imidazole structure, a diazabicyclo structure, an onium hydroxide structure, an onium carboxylate structure, a trialkylamine structure, an aniline structure and a pyridine structure, respectively, an alkylamine derivative having a hydroxyl group and/or an ether linkage, and an aniline derivative having a hydroxyl group and/or an ether linkage.

Examples of the compound having an imidazole structure include imidazole, 2,4,5-triphenylimidazole and benzimidazole. Examples of the compound having a diazabicyclo structure include 1,4-diazabicyclo[2.2.2]octane, 1,5-diazabicyclo[4.3.0]nona-5-ene and 1,8-diazabicyclo[5.4.0]undeca-7-ene. Examples of the compound having an onium hydroxide structure include triarylsulfonium hydroxides, phenacylsulfonium hydroxides and sulfonium hydroxides having 2-oxoalkyl groups, more specifically triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is the compound having the structure corresponding to the substitution of carboxylate for the anion moiety of the compound having an onium hydroxide structure, and examples thereof include acetate, adamantane-1-carboxylate and perfluoroalkylcarboxylates. Examples of the compound having a trialkylamine structure include tri(n-butyl)amine and tri(n-octyl)amine. Examples of the aniline compounds include 2,6-diisopropylaniline and N,N-dimethylaniline. Examples of the alkylamine derivative having a hydroxyl group and/or an ether linkage include ethanolamine, diethanolamine, triethanolamine and tris(methoxyethoxyethyl)amine. As an example of the aniline derivative having a hydroxyl group and/or an ether linkage, N,N-bis(hydroxyethyl)aniline can be given.

These basic compounds are used alone or as combinations of two or more thereof.

The amount of basic compound or compounds used is generally from 0.001 to 10 mass %, preferably 0.01 to 5 mass %, based on the total solids in the positive resist composition.

As to the usage ratio of acid generator(s) to basic compound(s) in the composition, the acid generator/basic compound ratio (by mole)=2.5 to 300 is appropriate. More specifically, it is appropriate that the ratio by mole be adjusted to at least 2.5 in point of sensitivity and resolution, while it be adjusted to at most 300 from the viewpoint of preventing the resolution from decreasing by thickening of resist patterns with the passage of time from the end of exposure to heating treatment. The acid generator/basic compound ratio (by mole) is preferably from 5.0 to 200, far preferably from 7.0 to 150.

[7] (G): Surfactant

It is preferable that the positive resist composition according to the invention further contains a surfactant, specifically a surfactant containing at least one fluorine atom and/or at least one silicon atom (namely either a surfactant containing at least one fluorine atom, or a surfactant containing at least one silicon atom, or a surfactant containing both fluorine and silicon atoms), or a combination of at least two of these surfactants.

Incorporation of such a surfactant in the positive resist composition according to the invention makes it possible to provide resist patterns having strong adhesion and reduced development defect while ensuring the composition both satisfactory sensitivity and high resolution in the case of using an exposure light source of 250 nm or below, especially 220 nm or below.

Examples of a surfactant containing at least one fluorine atom and/or at least one silicon atom include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants which can be used include fluorine-containing surfactants, such as EFTOP EF301 and EF303 (produced by Shin-Akita Kasei K.K.), Florad FC430, 431 and 4430 (produced by Sumitomo 3M, Inc.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troysol S-366 (produced by Troy Chemical Industries, Inc.), GF300 and GF-150 (produced by Toagosei Co., Ltd.), Surflon S-393 (produced by Seimi Chemical Co., Ltd.), EFTOP EF121, EF122A, EF122B, RF122C, EF125M, EF135M, EF351, EF352, EF801, EF802 and EF601 (produced by JEMCO Inc.), PF636, PF656, PF6320 and PF6520 (produced by OMNOVA Solutions Inc.), and FTX-208G, 218G, 230G, 204D, 208D, 212D, 218D and 222D (produced by NEOS), or silicon-containing surfactants. Additionally, organosiloxane polymer KP-341 (produced by Shin-Etsu Chemical Co., Ltd.) can be used as a silicon-containing surfactant.

In addition to known surfactants as recited above, the surfactants usable in the invention include surfactants using polymers containing fluorinated aliphatic groups derived from fluorinated aliphatic compounds synthesized by a telomerization method (also referred to as a telomer method) or an oligomerization method (also referred to as an oligomer method). These fluorinated aliphatic compounds can be synthesized according to the methods disclosed in JP-A-2002-90991.

The polymers containing fluorinated aliphatic groups are preferably copolymers of fluorinated aliphatic group-containing monomers and poly(oxyalkylene)acrylates and/or poly(oxyalkylene)methacrylates, wherein the fluorinated aliphatic group-containing units may be distributed randomly or in blocks. Examples of such poly(oxyalkylene) groups include a poly(oxyethylene) group, a poly(oxypropylene) group and a poly(oxybutylene) group. In addition, the poly (oxyalkylene) groups may be units containing alkylene groups of different chain lengths in their respective oxyalkylene chains, such as poly(oxyethylene block-oxypropylene block-oxyethylene block combination) and poly(oxyethylene block-oxypropylene block combination). Further, the copolymers of fluorinated aliphatic group-containing monomers and poly(oxyalkylene)acrylates (or methacrylates) may be binary copolymers or at least ternary copolymers prepared by copolymerizing at least two different kinds of fluorinated aliphatic group-containing monomers and at least two different kinds of poly(oxyalkylene)acrylates (or methacrylates) at the same time.

Examples of commercially available surfactants of such types include Megafac F178, F-470, F-473, F-475, F-476 and F-472 (produced by Dainippon Ink & Chemicals, Inc.). Additional examples of surfactants of such types include a copolymer of $C_6F_{13}$ group-containing acrylate (or methacrylate) and poly(oxyalkylene)acrylate (or methacrylate), and a terpolymer of $C_3F_7$ group-containing acrylate (or methacrylate), poly(oxyethylene)acrylate (or methacrylate) and poly(oxypropylene)acrylate (or methacrylate).

On the other hand, surfactants other than the surfactants which each contain at least one fluorine atom and/or at least one silicon atom can also be used in the invention. Examples of such surfactants include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

These surfactants may be used alone, or as combinations of two or more thereof.

The amount of surfactants used is preferably from 0.01 to 10 mass %, preferably 0.1 to 5 mass %, based on the total ingredients (exclusive of a solvent) in the positive resist composition.

[8] (H): Alkali-Soluble Resin

The positive resist composition according to the invention can further contain a resin that has no acid-decomposable group and is insoluble in water but soluble in an alkaline developer, and thereby the sensitivity can be increased.

In the invention, novolak resins having molecular weight of the order of 1,000 to 20,000 and poly(hydroxystyrene) derivatives having molecular weight of the order of 3,000 to 50,000 can be used as the alkali-soluble resin of the foregoing type. However, since those resins absorb light with wavelengths of 250 nm or below to a great extent, it is preferable that they are used in a partially hydrogenated state or in proportion of 30 weight % or below to the total resins.

In addition, resins containing carboxyl groups as alkali-soluble groups can also be used. For the purpose of enhancing dry-etching resistance, it is advantageous for the resins to contain mononuclear or polynuclear alicyclic hydrocarbon groups. Examples of such resins include copolymers of methacrylic acid and methacrylic acid esters showing no acid-decomposability and having alicyclic hydrocarbon structures, and alicyclic hydrocarbyl(meth)acrylate resins having carboxyl groups at their terminals.

[9] (I): Onium Carboxylate

The positive resist composition according to the invention may further contain an onium carboxylate. Examples of such an onium carboxylate include sulfonium carboxylates, iodonium carboxylates and ammonium carboxylates. Of these onium salts, iodonium salts and sulfonium salts are especially preferred. In addition, it is preferable that neither aromatic groups nor carbon-carbon double bonds are contained in the carboxylate residues of onium carboxylates which may be used in the invention. Examples of an especially preferable anion moiety include 1-30C straight-chain and branched alkyl carboxylate anions and mononuclear or polynuclear cycloalkyl carboxylate anions. Of these anions, those preferred by far are the carboxylate anions whose alkyl groups are partially or entirely substituted by fluorine atoms. In addition, those alkyl chains may contain oxygen atoms. By containing an onium salt having such a carboxylate anion, the resist composition can ensure transparency to light with wavelengths of 220 nm or below, and can have increased sensitivity and resolution and improved pitch dependency and exposure margin.

Examples of a fluorinated carboxylate anion include fluoroacetate anion, difluoroacetate anion, trifluoroacetate anion, pentafluoropropionate anion, heptafluorobutyrate anion, nanofluoropentanate anion, perfluorododecanate anion, perfluorotridecanate anion, perfluorocyclohexanecarboxylate anion and 2,2-bistrifluoromethylpropionate anion.

These onium carboxylates can be synthesized by allowing sulfonium hydroxide, iodonium hydroxide or ammonium hydroxide and carboxylic acids to react with silver oxide in an appropriate solvent.

The suitable content of onium carboxylate in the resist composition is from 0.1 to 20 mass %, preferably from 0.5 to 10 mass %, far preferably from 1 to 7 mass %, on a solids basis.

Other Additives

The positive resist composition according to the invention can further contain, on an as needed basis, dyes, plasticizers, photosensitizers, light absorbents, and compounds which can further dissolution in developers (e.g., phenol compounds having molecular weights of 1,000 or below, alicyclic or aliphatic compounds having carboxyl groups).

Syntheses of such phenol compounds 1,000 or below in molecular weight are easy for persons skilled in the art by reference to the methods as disclosed in JP-A-4-122938, JP-A-2-28531, U.S. Pat. No. 4,916,210 and European Patent No. 219,294.

Examples of alicyclic and aliphatic compounds having carboxyl groups include carboxylic acid derivatives having steroid structures, such as cholic acid, deoxycholic acid and lithocholic acid, adamantanecarboxylic acid derivatives, adamantanedicarboxylic acid, cyclohexanecarboxylic acid and cyclohexanedicarboxylic acid, but not limited to the compounds recited above.

[Physical Properties of Positive Resist Composition]

From the viewpoint of improvement in resolution, it is favorable that the positive resist composition according to the invention is used in a coating thickness of 30 to 250 nm, preferably 30 to 200 nm. The coating thickness in such a range can be attained by imparting just right viscosity to the positive resist composition through adjustment of the solids concentration in the composition to an appropriate range, and performing enhancements of coating suitability and film formability.

The concentration of total solids in the positive resist composition is generally from 1 to 10 mass %, preferably from 1 to 8 mass %, far preferably from 1.0 to 7.0 mass %.

[Preparation of Positive Resist Composition]

The positive resist composition according to the invention is prepared by dissolving the ingredients as described above in a specified solvent, preferably the mixed solvent as described above, and passing the resulting solution through a filter. The filter suitably used for filtering is a polytetrafluoroethylene, polyethylene or nylon filter capable of filtering to 0.1 microns or below, preferably 0.05 microns or below, far preferably 0.03 microns or below.

[Pattern Forming Method]

The pattern forming method of the invention is described below in detail.

As a result of our intensive study of what gives rise to deterioration in resolution, which is traceable to topple of resist patterns, and sensitivity decrease when a chemical amplification resist is applied to immersion lithography, we have narrowed it down to immersion liquid permeation into a resist coating which occurs while the resist coating maintains contact with the immersion liquid, thereby achieving the invention.

The image forming method of the invention has steps of:

(i) applying the positive resist composition according to the invention to a substrate to form a resist coating, (ii) exposing the resist coating to light via an immersion liquid, (iii) removing the immersion liquid remaining on the resist coating, (iv) heating the resist coating, and (v) developing the resist coating, and is distinguished by having the step (iii) of removing the immersion liquid remaining on the resist coating after the step (ii) of exposing the resist coating to light via the immersion liquid and before the step (iv) of heating the resist coating.

Incidentally, the step (iv) of heating the resist coating is a step corresponding to the heating step generally performed after exposure and before development for the purpose of promoting conversion of alkali-insoluble groups in a resist coating to alkali-soluble groups, namely the step referred to as PEB (Post Exposure Bake).

Reaction for converting alkali-insoluble groups in a chemical amplification resist to alkali-soluble groups occurs at the time of PEB generally carried out during or after exposure, so reactions under PEB are important.

Although it was thought that water as the most suitable immersion liquid in the case of using ArF excimer laser is less prone to permeate into a resist coating for ArF excimer laser use since the resist coating is generally formed from resin and organic molecules, we have found that minute quantities of water actually permeated into upper part of the resist coating. Where the water permeates into the resist coating, the resist coating surface and the vicinity of the interface between the resist coating and the substrate come, to differ in water content to cause changes in diffusion distance of a generated acid and rate of conversion reaction from alkali-insoluble groups into alkali-soluble groups, thereby resulting in unevenness of chemical reaction in the space between the surface and the bottom of the resist coating. Therefore, there is a possibility that resist patterns of good quality cannot be obtained.

In the case of immersion lithography using exposure wavelengths other than the wavelength of ArF, it is also conceivable that minute quantities of immersion liquid will permeate into a resist coating, and there is a high possibility that resist patterns formed will become unsatisfactory.

A feature of the invention consists in that the step (iii) of removing the immersion liquid remaining on a resist coating is carried out before the step (iv) of heating the resist coating, or PEB, and thereby reaction for converting alkali-insoluble groups into alkali-soluble groups is made uniform throughout the coating to result in formation of satisfactory resist patterns.

As the step (iii) of removing the immersion liquid remaining on a resist coating, it is possible to adopt (iii-1) a step of removing the immersion liquid by spinning the substrate, (iii-2) a step of removing the immersion liquid by heating the substrate at temperatures on a level that there occurs no conversion from alkali-insoluble groups into alkali-soluble groups, or (iii-3) a step of removing the immersion liquid by blowing a gas from a nozzle. These steps can be performed by use of general apparatus for manufacturing semiconductors, liquid crystal displays and devices like thermal heads, so they don't require introduction of new devices and are practical in point of cost advantage. Alternatively, a device permitting hot-air drying may be installed in an exposure apparatus or a developing machine, and the hot air generated thereby may be used for drying the remaining immersion liquid.

In the step (iii-1) of removing the immersion liquid by spinning a substrate, the number of revolutions of the substrate is preferably 500 rpm or above since the low revs cannot induce a high velocity of air flow on the resist coating surface to result in prolongation of drying. The higher revs are favorable since they can make the drying time the shorter and thereby the higher throughput can be attained.

However, the setting of the revs is generally below the upper limit designated by the device used. So, for instance, the revs is generally adjusted to 3,000 rpm or below in the case of spinning a 12-inch circular silicon-wafer substrate or 4,000 rpm or below in the case of spinning an 8-inch circular wafer substrate.

For completion of the drying, it is appropriate that the spinning time of the substrate be adjusted to 5 seconds or longer, and the longer the better. However, with the intention of minimizing throughput penalty, the setting of the spinning time may be done with consideration given to the total time and number of devices required for other steps, such as exposure, PEB and development.

In order to eliminate the vaporized immersion liquid from apparatus; it is preferable that the apparatus is ventilated, and the ventilation pressure is preferably 20 Pa or above.

Although the device for spinning a substrate may be any device so long as it has a mechanism for spinning the substrate, a developing apparatus as general apparatus for manufacturing semiconductors, liquid crystal displays and devices like thermal heads is used to advantage from the viewpoint of simplicity in delivery of a substrate from exposure apparatus to developing apparatus, but the device should not be construed as being limited to such apparatus.

In the step (iii-2) of removing the immersion liquid by baking (heating) a resist coating, conversion of alkali-insoluble groups in the resin into alkali-soluble groups during the bake for removal of the immersion liquid allows chemical reaction to occur in a state that the immersion liquid is present in the resist coating, and raises the possibility of rendering the chemical reaction uneven in the space between the surface and bottom of the resist coating. Therefore, it is appropriate that the bake temperature be adjusted to temperatures at which the alkali-insoluble groups in the resin cannot be converted into alkali-soluble ones.

Further, it is required that the bake temperature be a temperature at which no conversion from alkali-insoluble groups into alkali-soluble groups is caused in the resist resin.

The temperature at which an alkali-insoluble group is converted into an alkali-soluble group differs depending on the kind of resist, commercially available resists have their recommended post-bake temperatures (namely the foregoing PEB temperatures), and they are generally in the range of 90-150° C. At temperatures higher than the recommended temperatures, the conversion reaction from alkali-insoluble groups into alkali-soluble groups occurs with efficiency.

Accordingly, it is preferable to choose the bake temperature for removal of immersion liquid from the temperatures at least 20° C. lower than the heating temperature in the step (iv) of heating the resist coating as the temperature at which alkali-insoluble groups cannot be converted into alkali-soluble groups.

The temperature required at the minimum differs depending on the kind of immersion liquid, and there is a high possibility of adopting water as an immersion liquid in immersion lithography utilizing ArF excimer laser. When water is used as an immersion liquid under these circumstances, the heating at a temperature of 40° C. or above is preferred. However, the immersion liquid should not be construed as being limited to water.

Since a short heating time cannot complete the removal of immersion liquid and a long heating time affects throughput, the heating time is preferably adjusted to the range of 10-120 seconds.

Further, it is preferable that the apparatus is ventilated for the purpose of eliminating the vaporized immersion liquid from apparatus, and the ventilation pressure is preferably 3 Pa or above. As to the device for heating the substrate, although any devices may be used as far as they have a heating mechanism, it is advantageous to use a heating unit attendant on a developing apparatus as general apparatus for manufacturing semiconductors, liquid crystal displays and devices like thermal heads from the viewpoint of simplicity in delivery of a substrate from the exposure apparatus to the developing apparatus, but the device should not be construed as being limited to such unit.

As another example of the step (iii) of removing the immersion liquid remaining on a resist coating, a step of feeding a water-miscible organic solvent to the resist coating surface for the removal can be given.

Examples of a water-miscible organic solvent usable therein include alcohol solvents, such as methyl alcohol, ethyl alcohol, n-propyl alcohol and isopropyl alcohol. Of these solvents, isopropyl alcohol is preferred over the others.

A water-miscible organic solvent may be fed onto a wafer surface via a dropping nozzle under a condition that the wafer is made to adsorb to a holding mount by means of a vacuum chuck. It is preferable that the solvent feeding is carried out in an amount of 0.1 to 2.0 kg/cm$^2$ so as to distribute the solvent over the whole surface of the wafer. The solvent feeding may be performed in a state that the wafer is standing still, or it may be performed as the water is rotated at a low speed (e.g., 30 rpm). After the solvent feeding is stopped, the water-miscible organic solvent may be dried by ventilation as the wafer is in a stationary state, or by spinning the wafer at 1,000 rpm or above.

The amount of immersion liquid remaining in the resist coating after completion of the step (iii) of removing the immersion liquid remaining a resist coating is preferably 0.1 mass % or below, far preferably 0.01 mass % or below.

As a method for measuring a water content in the case of using water or a water solution as the immersion liquid, there is known the method of scraping the resist coating away from the substrate by use of, e.g., a spatula and measuring its water content with a Karl Fischer Moisture Titrator (MKS-500, made by Kyoto Electronics Manufacturing Co., Ltd.). In the case where the immersion liquid is a non-aqueous solution, on the other hand, there is known the method of dissolving the resist coating scraped away from the substrate in a solvent, such as cyclohexanone, and determining the liquid content by gas chromatography (using, e.g., GC-17 Aver. 3, made by Shimadzu Corporation).

In the pattern forming method of the invention, the step (i) of applying a positive resist composition to the substrate to form a resist coating, the step (ii) of exposing the resist film via an immersion liquid, the step (iv) of heating the resist coating and the step (v) of developing the resist coating can be performed using generally known methods.

At the removal of the immersion liquid remaining on the resist coating, it is preferable that a liquid film (puddle) of the immersion liquid (preferably purified water) is formed on the resist coating, and then the liquid film is removed so as not to left any liquid drops.

By utilizing the surface tension of the immersion liquid, the puddle may be formed by putting the immersion liquid on the resist coating as the wafer is kept still.

In the invention, it is preferable that the surface of the resist coating is cleaned to the step (ii) of exposing the resist coating via the immersion liquid:

The cleaning is performed by bringing a liquid to contact with the resist coating surface and eliminating dirt and particles.

As the liquid brought into contact with the resist coating surface, the immersion liquid may be used, or a liquid for cleaning, other than the immersion liquid, may be used.

The heating of the resist coating in the step (iii-2) and the step (iv) is generally carried out by heating the substrate having the resist coating by means of a hot plate.

After heating the resist coating in the step (iv), the resist coating is generally cooled to the vicinity of room temperature (e.g., 23° C.), and then undergoes development in the step (v).

The wavelength of a light source used in exposure apparatus for immersion lithography has no particular limitations in the invention, but a start has been made in studying of immersion lithography at the wavelengths of ArF excimer laser (193 nm) and F2 excimer laser, and the invention can be applied to both wavelengths.

The liquid suitable as immersion liquid is transparent to exposure wavelengths, and the refractive index thereof preferably has the smallest possible temperature coefficient so that the distortion of optical images projected onto the resist coating is minimized. In the case where the exposure light source is ArF excimer laser (wavelength: 193 nm) in particular, it is preferable to use water from the viewpoints of availability and easiness of handling in addition to the aforesaid viewpoints.

When water is used as the immersion liquid, an additive (liquid) capable of reducing the surface tension of water and enhancing the surface activity may be added in a slight proportion. This additive is preferably a liquid not causing dissolution of the coating layer on the wafer and having a negligibly small effect on an optical coat provided on the underside of lens element.

Suitable examples of such an additive include aliphatic alcohol compounds having almost the same refractive indexes as that of water, such as methyl alcohol, ethyl alcohol and isopropyl alcohol. Addition of alcohol having almost the same refractive index as that of water can offer an advantage that a change in refractive index as the liquid in its entirety can be made minimal even when the alcohol concentration in the immersion liquid is altered by vaporization of the alcohol.

On the other hand, mixing of a substance opaque to light of 193 nm and an impurity greatly differing in refractive index from water brings about distortion of optical images projected onto the resist, so the water used is preferably distilled water. Further, purified water having undergone filtration by passage through an ion exchange filter may be used.

The substrate on which the resist coating is formed has no particular restriction in the invention, and it is possible to use an inorganic substrate, such as silicon, SiN, $SiO_2$ or $SiO_2$/SiN; a coating-type inorganic substrate, such as SOG; or a substrate generally used in a lithographic process for manufacturing semiconductors, such as ICs, circuit boards for LCDs and thermal heads, and for photofabrication of other devices. Further, an organic antireflective film may be formed between the resist coating and the substrate, if needed.

Examples of an alkali developer used in the step of carrying out development include aqueous alkaline solutions of inorganic alkalis, such as sodium hydroxide, potassium hydroxide, sodium carbonate, sodium silicate, sodium metasilicate and aqueous ammonia, primary amines, such as ethyl amine and n-propylamine, secondary amines, such as diethylamine and di-n-butylamine, tertiary amines, such as triethylamine and methyldiethylamine, alcohol amines, such as dimethylethanolamine and triethanolamine, quaternary ammonium salts, such as tetramethylammonium hydroxide and tetraethylammonium hydroxide, and cyclic amines, such as pyrrole and piperidine.

Further, it is possible to use the alkaline aqueous solution as recited above to which an alcohol compound and a surfactant are added in appropriate amounts.

The alkali concentration in an alkali developer is generally from 0.1 to 20 mass %.

The pH of the alkali developer is generally from 10.0 to 15.0.

As a rinse solution, purified water is used, but thereto an appropriate amount of surfactant may also be added.

After the development-processing or the processing with a rinse solution, treatment for eliminating the developer or the rinse solution adhering to patterns by use of a supercritical liquid can further be performed.

EXAMPLES

The invention will now be illustrated in greater detail by reference to the following examples, but these examples should not be construed as limiting the scope of the invention in any way.

The structures of alicyclic hydrocarbon-containing acid-decomposable resins (1) to (24) used in Examples and Comparative Examples are illustrated below. In addition, the compositions (which each are expressed in a ratio between proportions (by mole %) of repeating units arranged in the direction from the left to the right in each individual structural formula), weight-average molecular weights (Mw) and dispersion degrees (Mw/Mn) of the alicyclic hydrocarbon-containing acid-decomposable resins (1) to (24) are shown in the following Tables 1 and 2.

(1)

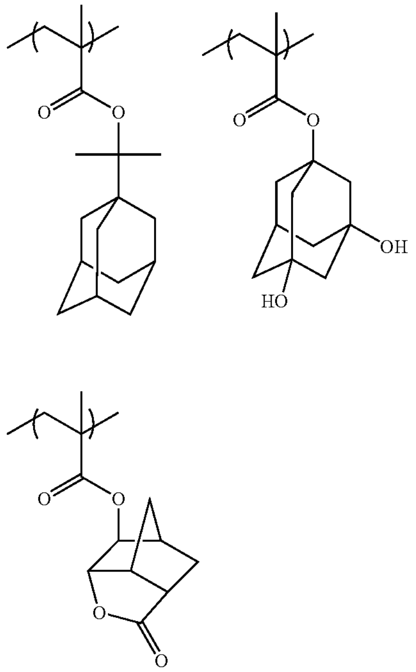

(2)

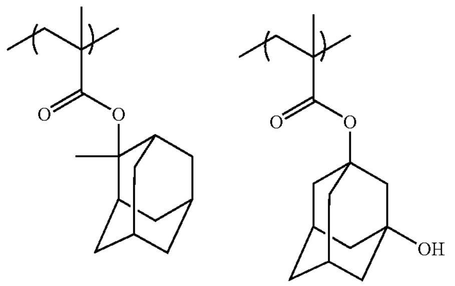

-continued
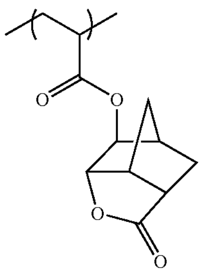
(3)
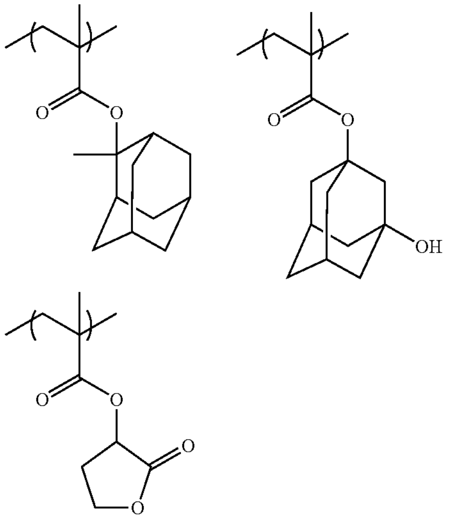
(4)
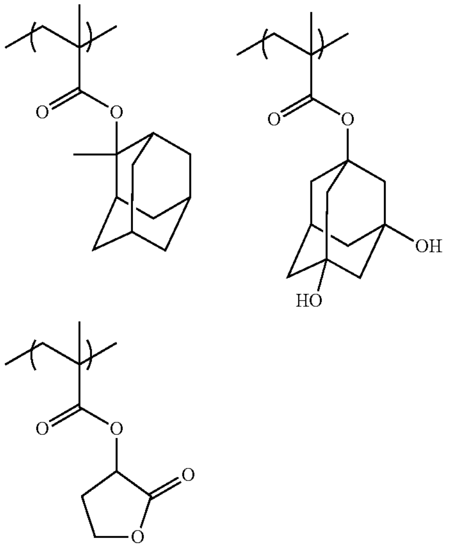
(5)
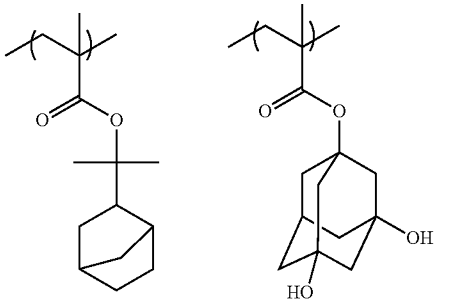
-continued
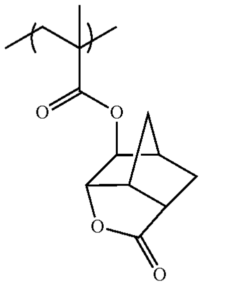
(6)
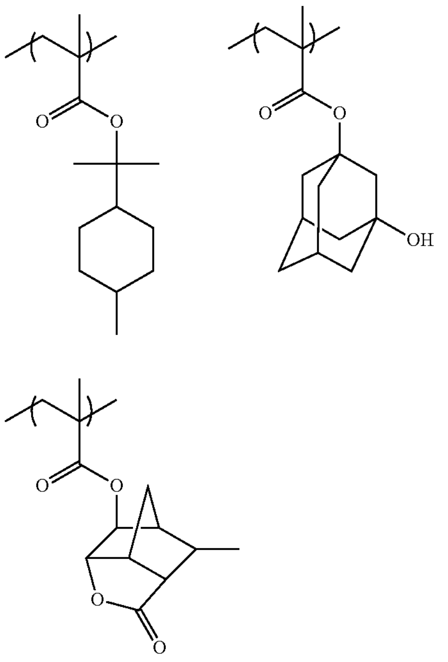
(7)
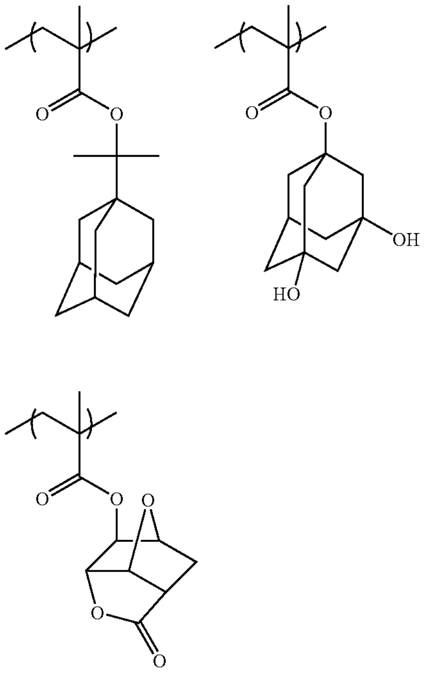

-continued
(8)
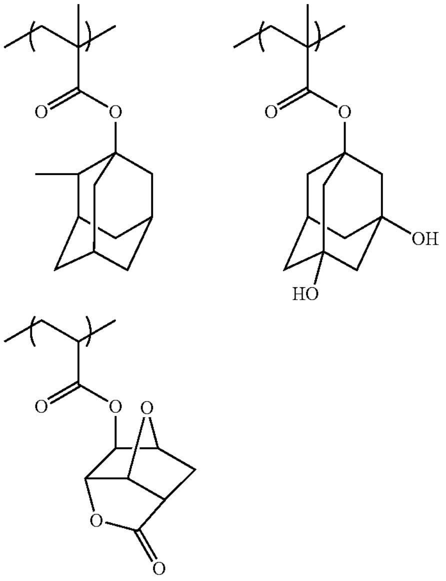
(9)
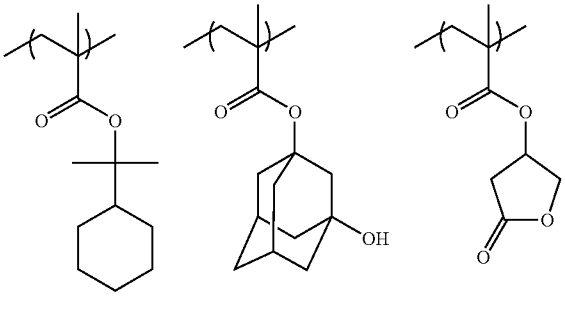
(10)
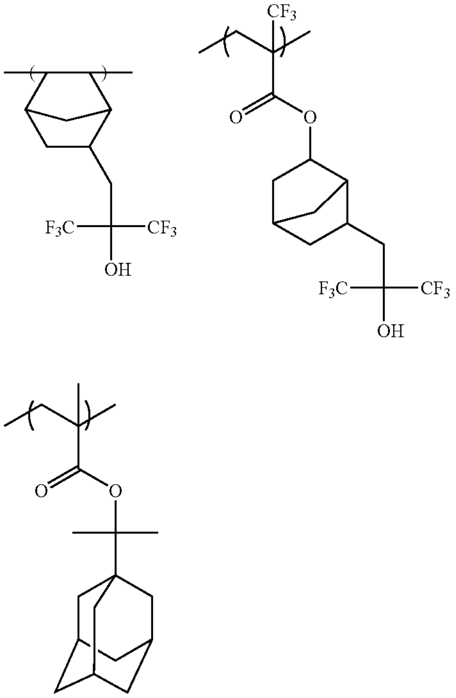
-continued
(11)
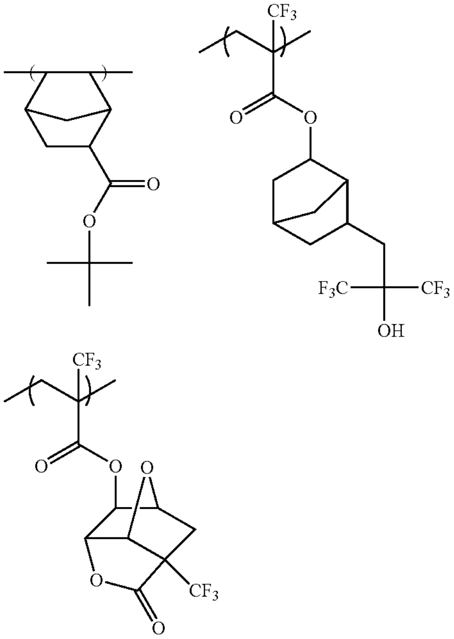
(12)
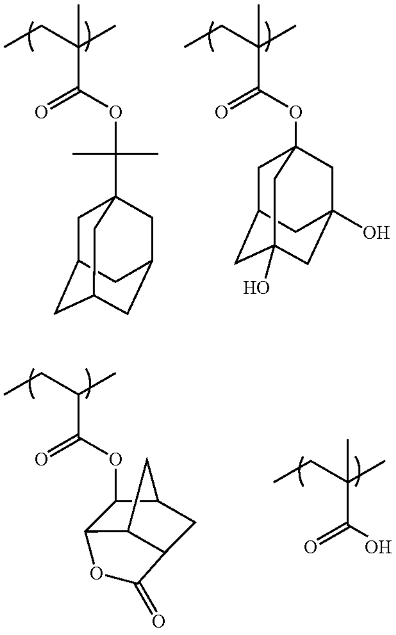
(13)
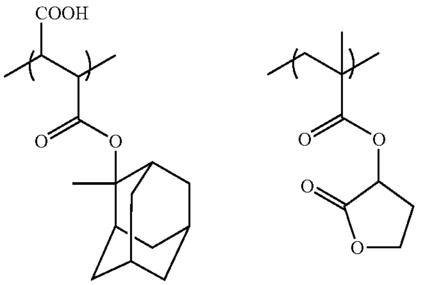

-continued
(14)
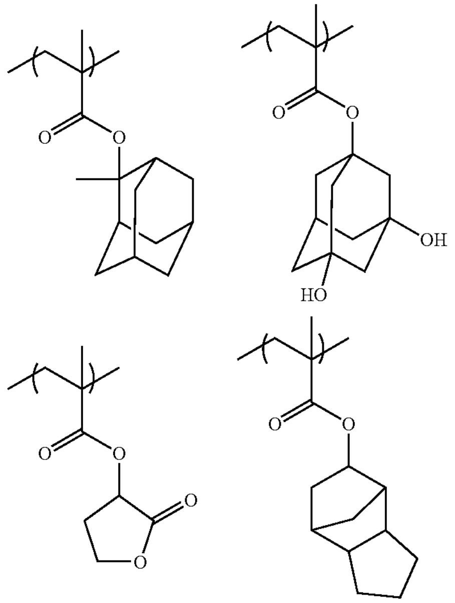
(15)
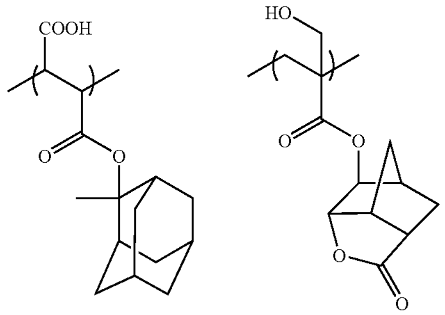
(16)
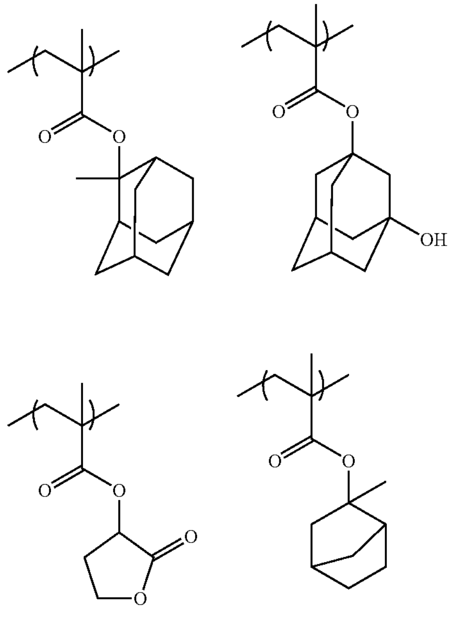
-continued
(17)
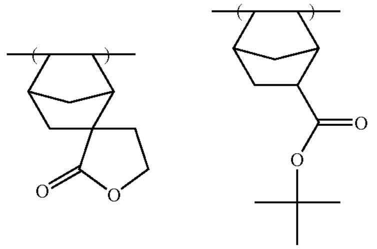
(18)
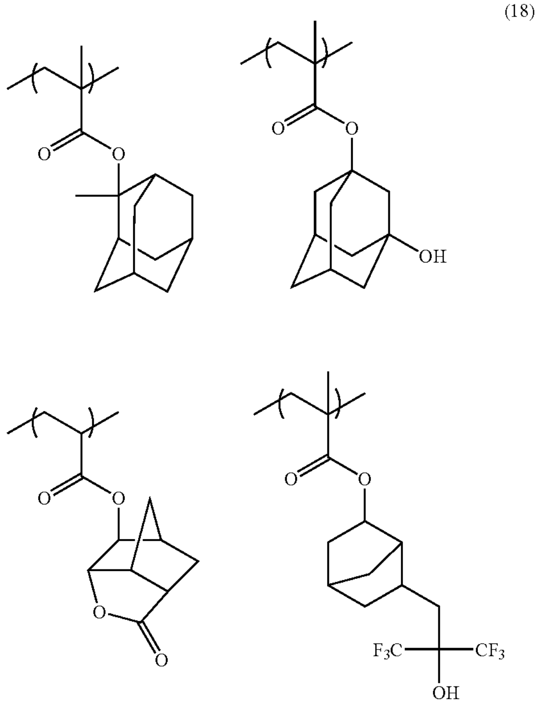
(19)
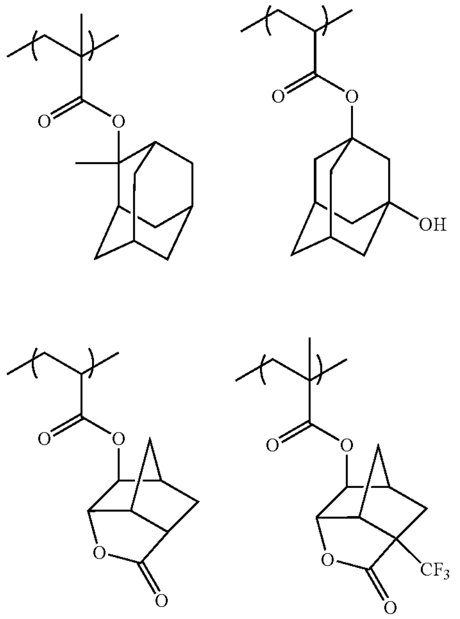

-continued
(20)
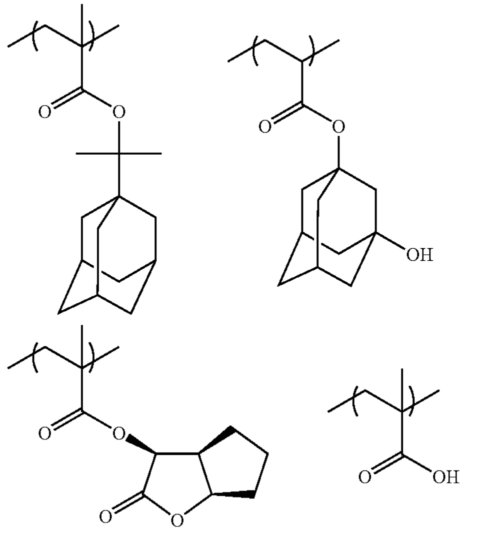
(21)
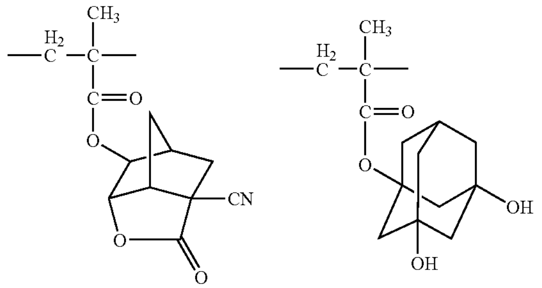
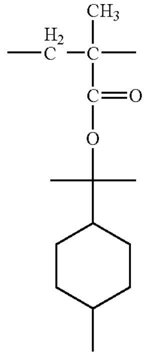
(22)
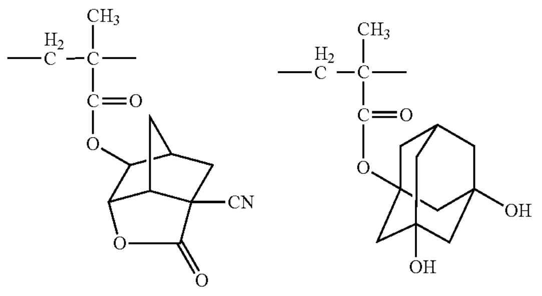
-continued
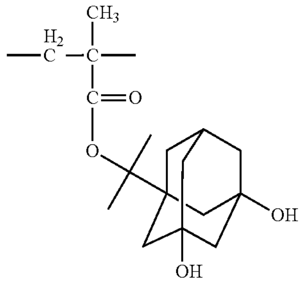
(23)
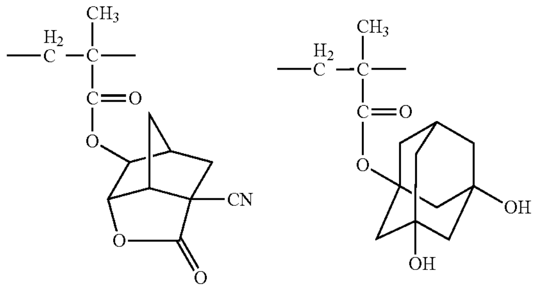
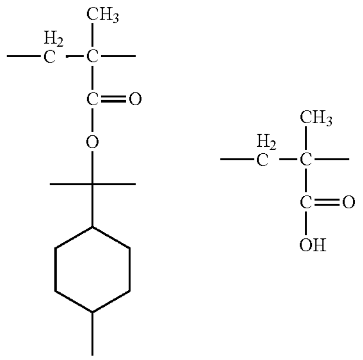
(24)
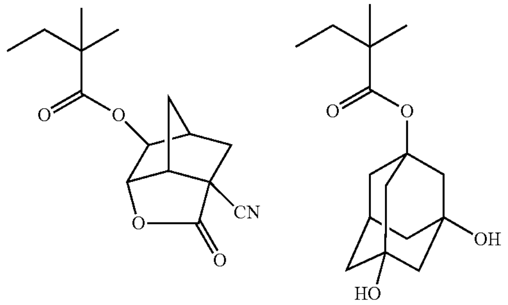
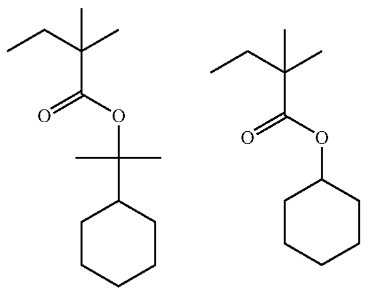 [SMILES: CCC(C)(C)C(=O)OC(C)(C)C1CCCCC1 ; CCC(C)(C)C(=O)OC1CCCCC1]

TABLE 1

| Resin | Composition | Mw | Mw/Mn |
|---|---|---|---|
| 1 | 39/20/41 | 9,800 | 1.9 |
| 2 | 40/22/38 | 12,000 | 2.0 |
| 3 | 34/33/33 | 11,000 | 2.3 |
| 4 | 45/15/40 | 10,500 | 2.1 |
| 5 | 35/15/50 | 6,700 | 2.2 |
| 6 | 30/25/45 | 8,400 | 2.3 |
| 7 | 39/20/41 | 10,500 | 2.1 |
| 8 | 49/10/41 | 9,500 | 2.5 |
| 9 | 35/32/33 | 14,000 | 2.6 |
| 10 | 35/35/30 | 6,700 | 2.3 |
| 11 | 40/22/38 | 8,500 | 2.5 |
| 12 | 40/20/35/5 | 12,500 | 2.4 |
| 13 | 50/50 | 14,000 | 1.9 |
| 14 | 40/15/40/5 | 10,000 | 1.8 |
| 15 | 50/50 | 8,300 | 1.5 |
| 16 | 40/15/40/5 | 9,800 | 2.3 |
| 17 | 50/50 | 5,200 | 2.1 |
| 18 | 35/20/40/5 | 6,100 | 2.3 |
| 19 | 30/30/30/10 | 8,600 | 2.5 |
| 20 | 40/20/35/5 | 12,000 | 2.1 |

TABLE 2

| Resin | Composition | Mw | Mw/Mn |
|---|---|---|---|
| 21 | 50/10/40 | 10,000 | 1.2 |
| 22 | 40/20/40 | 9,600 | 1.4 |
| 23 | 40/20/30/10 | 10,400 | 1.1 |
| 24 | 45/20/30/5 | 9,900 | 1.3 |

Synthesis Example 1

Syntheses of Resins (C-1) and (C-2)

3,5-Bis(1,1,1,3,3,3-hexafluoro-2-hydroxypropane-2-yl) cyclohexyl 2-trifluoromethylmethacrylate in an amount of 0.06 mole and (5-norbornene-2-methyl)-1,1,1,3,3,3-hexafluoropropane-2-ol in an amount of 0.04 mole were prepared, and mixed. This mixture was placed in an atmosphere of nitrogen and stirred at 80° C., and thereto 1.5 mole % of V-59, a polymerization initiator produced by Wako Pure Chemical Industries, Ltd., was added and stirred for additional 3 hours. Thereafter, the stirring was further continued for 12 hours while adding 1.5 mole % of the polymerization initiator V-59 at intervals of 3 hours. After completion of the reaction, the reaction solution (C-1) was dissolved in 20 mL of THF, and cooled to room temperature. The resulting solution was poured into 800 mL of hexane to result in precipitation of white powdery crystals. These crystals were filtered off, thereby collecting the intended resin (C-1) having the structure illustrated hereinafter.

The polymer's compositional ratio (by mole %) determined by $^{1}$H-NMR was 60/40 (corresponding to the arranging order (in the direction from the left to the right) of repeating units in the structural formula, as were the compositional ratios mentioned below). Further, the weight-average molecular weight of Resin (C-1) was found to be 8,800 as measured by GPC and calculated in terms of polystyrene, and the dispersion degree (Mw/Mn) was found to be 1.5.

Resin (C-2) having the structure illustrated hereinafter was synthesized in the same manner as the above, except that one of the monomers was replaced with a different one and the ratio between the amounts of monomers prepared was changed to 70/30 (by mole). The compositional ratio (by mole %) of Resin (C-2) determined by $^{1}$H-NMR was 68/32. Further, the weight-average molecular weight of Resin (C-2) was found to be 11,000 as measured by GPC and calculated in terms of polystyrene, and the dispersion degree (Mw/Mn) was found to be 1.7.

Synthesis Example 2

Synthesis of Resin (C-3)

Di-μ-chlorosyl-[(η-allyl)palladium(II)] in an amount of 0.262 g and silver antimonate in an amount of 0.488 g were dissolved in 44 mL of chlorobenzene, and stirred at room temperature. After a lapse of 20 minutes, the reaction mixture was filtered, and the filtrate was added to a mixture of 20 g of 5-norbornene-1,1,1,3,3,3-hexafluoropropane-2-ol, 0.2 mL of water and 170 mL of chlorobenzene. The resulting admixture was further stirred for 20 hours at room temperature, and poured into 1,200 mL of methanol. A resin thus precipitated was filtered off. The resin obtained was dissolved in 150 mL of chlorobenzene, and thereto 30 ml of methanol and 3.2 g of sodium boron hydride were added and stirred for 3 hours at room temperature. Further, the resulting reaction mixture was allowed to stand for 24 hours at room temperature. Pd(O) grains thus precipitated were filtered out, and the filtrate was poured into 800 mL of methanol. The thus precipitated resin was filtered off, thereby giving the intended Resin (C-3) having the structure illustrated hereinafter.

The weight-average molecular weight of Resin (C-3) was found to be 8,000 as measured by GPC and calculated in terms of polystyrene, and the dispersion degree (Mw/Mn) was found to be 1.4.

Synthesis Example 3

Syntheses of Resins (C-4) to (C-6)

1,1,1,3,3,3-Hexafluoro-2-(4-(1,1,3,3,3-hexafluoro-2-hydroxypropane-2-yl)cyclohexyl)propane-2-yl methacrylate in an amount of 20 g was dissolved in 70 mL of propylene glycol monomethyl ether acetate. To this solution, 3 mole % of a polymerization initiator V-601 produced by Wako Pure Chemical Industries, Ltd. was added. The resulting solution was added dropwise over a period of 6 hours to 10 ml of propylene glycol monomethyl ether acetate heated to 80° C. After conclusion of the addition, the reaction solution was stirred for 2 hours. The thus obtained reaction solution (C-4) was cooled to room temperature after completion of the reaction, and was poured into a 4.5-times amount of hexane to result in precipitation of white powdery crystals. These crystals were filtered off, thereby collecting the intended resin (C-4) having the structure illustrated hereinafter.

The weight-average molecular weight of Resin (C-4) was found to be 8,500 as measured by GPC and calculated in terms of polystyrene, and the dispersion degree (Mw/Mn) was found to be 1.4.

Resin (C-5) having the structure illustrated hereinafter was synthesized in the same manner as the above, except that the monomer was replaced with different ones and the ratio between the amounts of monomers prepared was changed to 80/20 (by mole). In addition, the solvent used for crystallization was changed to methanol. The compositional ratio (by mole %) of Resin (C-5) determined by $^{1}$H-NMR was 80/20. Further, the weight-average molecular weight of Resin (C-5) was found to be 13,000 as measured by GPC and calculated in terms of polystyrene, and the dispersion degree (Mw/Mn) was found to be 2.1.

Resin (C-6) having the structure illustrated hereinafter was synthesized in the same manner as Resin (C-4), except that a different monomer was further added and the ratio between the amounts of monomers prepared was changed to 70/30 (by mole). In addition, the solvent used for crystallization was changed to methanol. The compositional ratio (by mole %) of Resin (C-6) determined by $^{1}$H-NMR was 70/30. Further, the weight-average molecular weight of Resin (C-6) was found to be 18,000 as measured by GPC and calculated in terms of polystyrene, and the dispersion degree (Mw/Mn) was found to be 2.3.

Synthesis Example 4

Synthesis of Resin (C-7)

Resin (C-7) having the structure illustrated hereinafter was synthesized in the same manner as in Synthesis Example 1, except that the monomers were replaced with different ones and the ratio between the amounts of monomers prepared was changed to 50/50 (by mole). In addition, the solvent used for crystallization was changed to methanol. The compositional ratio (by mole %) of Resin (C-7) determined by $^{1}$H-NMR was 50/50. Further, the weight-average molecular weight of Resin (C-7) was found to be 5200 as measured by GPC and calculated in terms of polystyrene, and the dispersion degree (Mw/Mn) was found to be 1.9.

Synthesis Example 5

Synthesis of Resin (C-8)

Resin (C-8) having the structure illustrated hereinafter was synthesized in the same manner as in Synthesis Example 3, except that the monomer was replaced with different ones and the ratio between the amounts of monomers prepared was changed to 50/50 (by mole). In addition, the solvent used for crystallization was changed to methanol. The compositional ratio (by mole %) of Resin (C-8) determined by $^{1}$H-NMR was 50/50. Further, the weight-average molecular weight of Resin (C-8) was found to be 10,200 as measured by GPC and calculated in terms of polystyrene, and the dispersion degree (Mw/Mn) was found to be 2.2.

Synthesis Example 6

Synthesis of Resin (C-9)

Resin (C-9) having the structure illustrated hereinafter was synthesized in the same manner as in Synthesis Example 3, except that the monomer was replaced with different ones and the ratio between the amounts of monomers prepared was changed to 60/40 (by mole). The solvent used for crystallization was hexane. The compositional ratio (by mole %) of Resin (C-8) determined by $^{1}$H-NMR was 60/40. Further, the weight-average molecular weight of Resin (C-8) was found to be 7,200 as measured by GPC and calculated in terms of polystyrene, and the dispersion degree (Mw/Mn) was found to be 2.2.

Synthesis Example 7

Synthesis of Resin (C-10)

Resin (C-10) having the structure illustrated below was synthesized in the same manner as in Synthesis Example 1, except that the monomers were replaced with different ones and the ratio between the amounts of monomers prepared was changed to 30/30/40 (by mole). In addition, the solvent used for crystallization was changed to methanol. The compositional ratio (by mole %) of Resin (C-10) determined by $^{1}$H-NMR was 32/32/36. Further, the weight-average molecular weight of Resin (C-8) was found to be 5,600 as measured by GPC and calculated in terms of polystyrene, and the dispersion degree (Mw/Mn) was found to be 2.0.

(C-1)

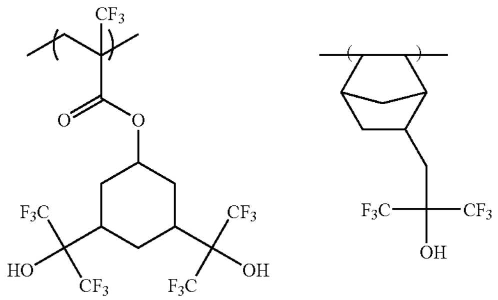

(C-2)

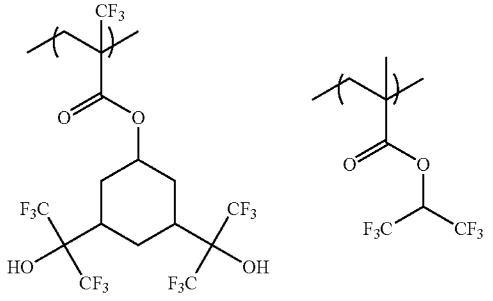

(C-3)

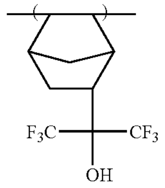

(C-4)

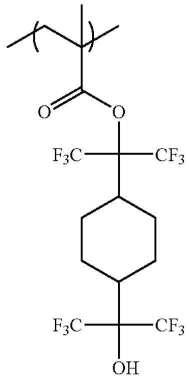

(C-5)

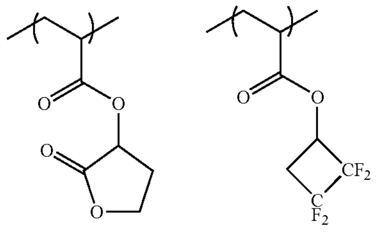

-continued (C-6)

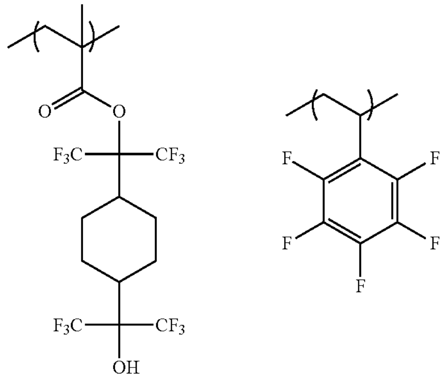

(C-7)

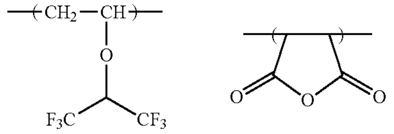

(C-8)

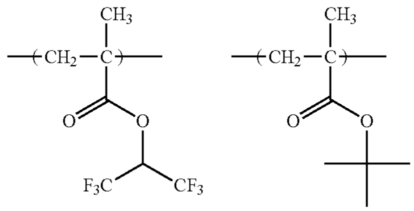

(C-9)

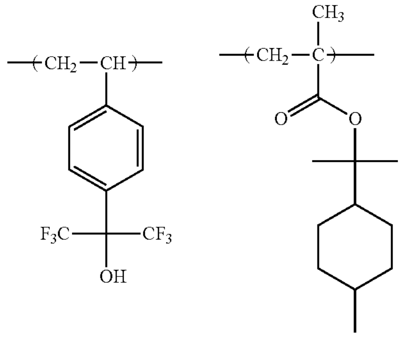

-continued (C-10)

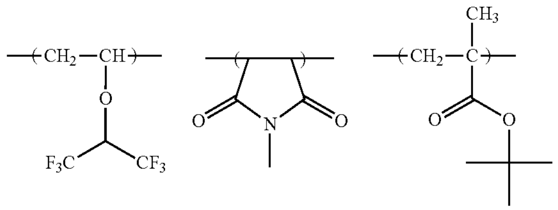

Examples 1 to 20 and Comparative Examples 1 to 3

Preparation of Resist

Positive resist compositions were each prepared by dissolving ingredients in solvents as shown in the following Tables 3 and 4 so as to prepare a resist solution having a solids concentration of 7 mass % and passing the resist solution through a 0.1-μm polyethylene filter. Patterns were formed using each of the thus prepared positive resist compositions in accordance with a method chosen from those described in Tables 5 and 6, and evaluated by the following method. Results obtained are shown in Tables 3 and 4.

[Evaluation of Development Defect]

A defect inspection system, KLA2360 (trade name, made by KLA-Tencor Corporation), was used, and measurements with the inspection system were made in a random mode under a setting that the pixel size was 0.16 μm and the threshold was 20. Specifically, development defects extracted from discrepancies developing by superposing images for comparison upon pixel units were detected, and the number of development defects per unit area was calculated.

TABLE 3

| | Composition | | | | | | Pattern | Number of |
|---|---|---|---|---|---|---|---|---|
| Example | Resin (A) 2 g | Acid generator (mg) | Resin (C) (mg) | Solvent (ratio by mass) | Basic compound (mg) | Surfactant (mg) | forming method | defects (per $cm^2$) |
| 1 | 1 | z2 (80) | C-1 (2) | SL-1/SL-2 (60/40) | N-5 (7) | W-1 (3) | (A) | 0.14 |
| 2 | 2 | z51 (100) | C-2 (2) | SL-2/SL-4/SL-6 (40/59/1) | N-6 (10) | W-4 (3) | (A) | 0.12 |
| 3 | 3 | z2/z62 (20/100) | C-1 (2) | SL-2/SL-4 (70/30) | N-3 (6) | W-6 (3) | (A) | 0.11 |
| 4 | 4 | z55/z65 (20/100) | C-1 (5) | SL-2/SL-4 (60/40) | — | — | (A) | 0.10 |
| 5 | 5 | z55/z51 (20/80) | C-2 (1) | SL-3/SL-4 (30/70) | N-6 (10) | W-6 (4) | (A) | 0.15 |
| 6 | 6 | z44/z65 (25/80) | C-3 (5) | SL-2/SL-4/SL-5 (40/58/2) | N-1 (7) | W-6 (4) | (B) | 0.11 |
| 7 | 7 | z55/z47 (30/60) | C-2 (10) | SL-1/SL-2 (60/40) | N-4 (13) | W-6 (4) | (A) | 0.10 |
| 8 | 8 | z65 (100) | C-4 (3) | SL-1/SL-2 (60/40) | N-3 (6) | W-2 (3) | (B) | 0.15 |
| 9 | 9 | z44/z65 (50/50) | C-3 (3) | SL-2/SL-4/SL-6 (40/59/1) | N-2 (9) | W-3 (3) | (A) | 0.14 |

TABLE 3-continued

| Example | Composition: Resin (A) 2 g | Acid generator (mg) | Resin (C) (mg) | Solvent (ratio by mass) | Basic compound (mg) | Surfactant (mg) | Pattern forming method | Number of defects (per $cm^2$) |
|---|---|---|---|---|---|---|---|---|
| 10 | 10 | z51 (100) | C-6 (3) | SL-2/SL-4 (70/30) | N-5 (7) | W-5 (3) | (A) | 0.15 |
| 11 | 11 | z55/z65 (40/60) | C-5 (3) | SL-2/SL-4 (60/40) | N-1 (7) | W-4 (3) | (A) | 0.16 |
| 12 | 12 | z55/z65 (20/80) | C-1 (3) | SL-1/SL-2 (50/50) | N-3 (6) | W-1 (3) | (A) | 0.15 |
| 13 | 13 | z37 (110) | C-5 (2) | SL-1/SL-2 (30/70) | N-5 (7) | W-1 (5) | (A) | 0.14 |
| 14 | 14 | z62 (120) | C-3 (2) | SL-2/SL-4/SL-6 (40/59/1) | N-1 (7) | W-4 (5) | (A) | 0.12 |
| 15 | 15 | z55/z51 (40/60) | C-2 (2) | SL-2/SL-4 (60/40) | N-3 (6) | W-6 (5) | (A) | 0.11 |

TABLE 4

| | Composition: Resin (A) 2 g | Acid generator (mg) | Resin (C) (mg) | Solvent (ratio by mass) | Basic compound (mg) | Surfactant (mg) | Pattern forming method | Number of defects (per $cm^2$) |
|---|---|---|---|---|---|---|---|---|
| Example | | | | | | | | |
| 16 | 16 | z65/z9 (100/10) | C-3 (3) | SL-2/SL-4 (60/40) | — | W-1 (5) | (A) | 0.10 |
| 17 | 17 | z66 (100) | C-1 (2) | SL-1/SL-2 (60/40) | N-5 (7) | W-1 (5) | (A) | 0.15 |
| 18 | 18 | z16 (90) | C-4 (2) | SL-2/SL-4/SL-6 (40/59/1) | N-6 (10) | W-4 (5) | (A) | 0.14 |
| 19 | 19 | z55 (80) | C-2 (3) | SL-2/SL-4 (70/30) | N-3 (6) | W-6 (5) | (A) | 0.15 |
| 20 | 20 | z51 (100) | C-1 (2) | SL-2/SL-4 (70/30) | — | — | (A) | 0.16 |
| Comparative Example | | | | | | | | |
| 1 | 1 | z2 (80) | — | SL-1/SL-2 (60/40) | N-5 (7) | W-1 (5) | (A) | 2.46 |
| 2 | 1 | z2 (80) | C-1 (2) | SL-1/SL-2 (60/40) | N-5 (7) | W-1 (3) | (C) | 0.95 |
| 3 | 2 | z51 (100) | C-2 (2) | SL-2/SL-4/SL-6 (40/59/1) | N-6 (10) | W-4 (3) | (C) | 0.99 |

The characters representing the ingredients in the above Tables stand for the following, respectively.

As to the acid generators, the characters used correspond to those standing for the compounds illustrated hereinbefore.

N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
W-1: Megafac F176 (produced by Dainippon Irk & chemicals, Inc., a surfactant of fluorine-containing type)
W-2: Megafac R08 (produced by Dainippon Ink & Chemicals, Inc., a surfactant of fluorine- and silicon-containing type)
W-3: Organosiloxane polymer KP-341 (produced by Shin-Etsu Chemical Co., Ltd., a surfactant of silicon-containing type)
W-4: Troysol S-366 (produced by Troy Chemical Industries, Inc.)
W-5: PF656 (produced by OMNOVA Solutions Inc., a surfactant of fluorine-containing type)
W-5: PF6320 (produced by OMNOVA Solutions Inc., a surfactant of fluorine-containing type)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate The pattern forming methods (A) to (D) specified in the tables are explained in the following Tables 5 and 6.

TABLE 5

| | Pattern forming method |
|---|---|
| (A) | An organic antireflective coating ARC29A (produced by Nissan Chemical Industries, Ltd.) is applied to a silicon wafer, and baked at 205° C. for 60 seconds, |

TABLE 5-continued

| Pattern forming method |
|---|
| thereby forming an antireflective coating with a thickness of 78 nm. Thereon, a prepared positive resist composition is coated, and baked at 120° C. for 60 seconds, thereby forming a resist coating having a thickness of 250 nm. The thus obtained wafer is subjected to pattern exposure by means of an ArF excimer laser immersion scanner (NA = 0.75) using purified water as an immersion liquid. Immediately after the exposure, water is fed onto the wafer surface to form puddles, and then the wafer is dried by being spun at 2,000 rpm to eliminate water. Next the wafer is heated at 120° C. for 60 seconds, and then developed with an aqueous solution of tetramethylammonium hydroxide (2.38 mass %) for 30 seconds, rinsed with purified water, and further spin-dried. Thus, resist patterns are formed. |
| (B) An organic antireflective coating ARC29A (produced by Nissan Chemical Industries, Ltd.) is applied to a silicon wafer, and baked at 205° C. for 60 seconds, thereby forming an antireflective coating with a thickness of 78 nm. Thereon, a prepared positive resist composition is coated, and baked at 120° C. for 60 seconds, thereby forming a resist coating having a thickness of 250 nm. The resist coating surface is cleaned by feeding purified water thereto and drying the water by spinning. The thus treated resist coating is subjected to pattern exposure by means of an ArF excimer laser immersion scanner (NA = 0.75) using purified water as an immersion liquid. Immediately after the exposure, water is fed onto the wafer surface to form puddles, and then the wafer is dried by being spun at 2,000 rpm to eliminate water. And the wafer is heated at 120° C. for 60 seconds, and then developed with an aqueous solution of tetramethylammonium hydroxide (2.38 mass %) for 30 seconds, rinsed with purified water, and further spin-dried. Thus, resist patterns are formed. |
| (C) An organic antireflective coating ARC29A (produced by Nissan Chemical Industries, Ltd.) is applied to a silicon wafer, and baked at 205° C. for 60 seconds, thereby forming an antireflective coating with a thickness of 78 nm. Thereon, a prepared positive resist composition is coated, and baked at 120° C. for 60 seconds, thereby forming a resist coating having a thickness of 250 nm. The thus obtained wafer is subjected to pattern exposure by means of an ArF excimer laser immersion scanner (NA = 0.75) using purified water as an immersion liquid. Thereafter, the wafer is heated at 120° C. for 60 seconds, and then developed with an aqueous solution of tetramethylammonium hydroxide (2.38 mass %) for 30 seconds, rinsed with purified water, and further spin-dried. Thus, resist patterns are formed. |

TABLE 6

| Pattern forming method |
|---|
| (D) An organic antireflective coating ARC29A (produced by Nissan Chemical Industries, Ltd.) is applied to a silicon wafer, and baked at 205° C. for 60 seconds, thereby forming an antireflective coating with a thickness of 78 nm. On this coating, a prepared positive resist composition is coated, and baked at 120° C. for 60 seconds, thereby forming a resist coating having a thickness of 250 nm. Next, pattern exposure is performed by means of an ArF excimer laser immersion scanner (NA = 0.75) using purified water as an immersion liquid. Immediately after the exposure, isopropyl alcohol is fed onto the wafer surface for 15 seconds, and then the wafer is dried by being spun at 2,000 rpm. Herein, the amount of isopropyl alcohol fed is adjusted to 0.5 kg/cm$^2$. And the wafer thus treated is heated at 120° C. for 60 seconds, and then developed with an aqueous solution of tetramethylammonium hydroxide (2.38 mass %) for 30 seconds, rinsed with purified water, and further spin-dried. Thus, resist patterns are formed. |

It is apparent from Tables 3 and 4 that development defect can be improved by applying the present image forming methods.

Examples 21 to 25 and Comparative Example 4

(1) Formation of Lower Resist Layer

On a 6-inch silicon wafer, FHi-028DD resist (an i-ray resist produced by FUJIFILM OLIN Co., Ltd.) was coated by means of a spin coater, Mark 8 made by Tokyo Electron Limited, and baked at 90° C. for 90 seconds, thereby obtaining a uniform coating with a thickness of 0.55 μm.

This coating was further heated at 200° C. for 3 minutes to result in formation of a lower resist layer having a thickness of 0.40 μm.

(2) Formation of Upper Resist Layer

Solutions each having a solids concentration of 11 mass % were prepared by dissolving ingredients in solvents as shown in the following Table 7, and underwent microfiltration using a membrane filter having a pore diameter of 0.1 μm, thereby preparing resist solutions for upper-layer use. Each of the thus prepared resist solutions was coated on the lower resist layer in the same manner as the lower resist layer was coated, and then heated at 130° C. for 90 seconds, thereby forming an upper resist layer having a thickness of 0.20 μm.

(3) Pattern Formation and Evaluation

Each of the upper resist layers was subjected to pattern exposure by means of an ArF excimer laser immersion scanner (NA=0.75) using purified water as an immersion liquid. Immediately after the exposure, water was fed onto the wafer surface and thereby puddles were formed. Thereafter, the wafer was dried by spinning at 2,000 rpm to eliminate the water. Next, the wafer was heated at 120° C. for 60 seconds, developed with an aqueous solution of tetramethylammonium hydroxide (2.38 mass %) for 30 seconds, rinsed with purified water, and further dried by spinning. Thus, resist patterns were formed. Development defects of the thus formed resist patterns were evaluated by the same method as in Example 1. The evaluation results obtained are shown in Table 7.

Resins (SI-1) to (SI-5) in Table 7 are as follows:

TABLE 7

| | | Molecular Weight |
|---|---|---|
| (SI-1) | 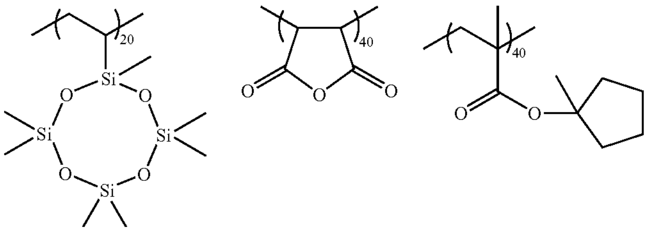 | 15000 |
| (SI-2) | 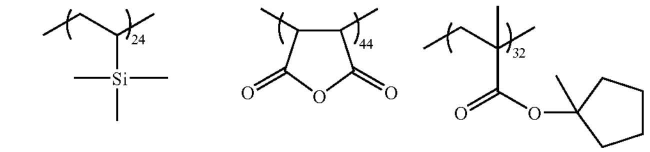 | 14500 |
| (SI-3) | 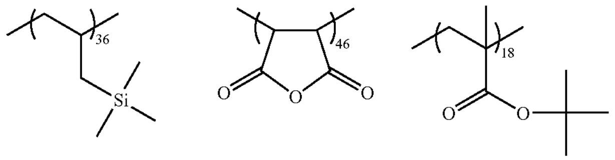 | 9600 |
| (SI-4) | 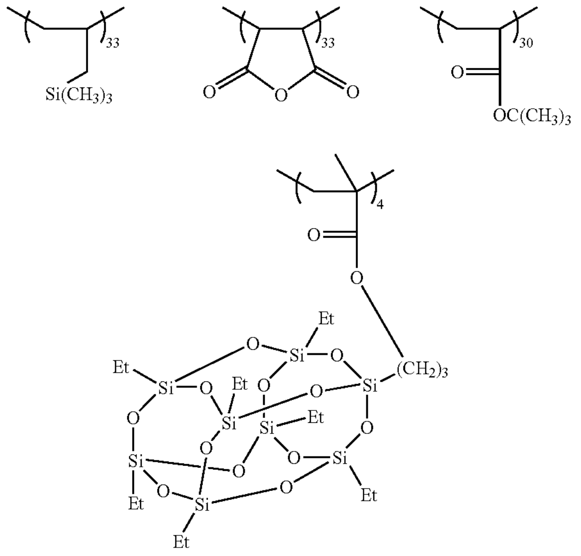 | 8900 |
| (SI-5) | 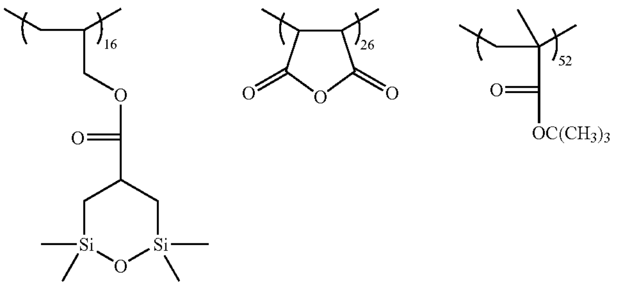 | 10800 |

TABLE 7-continued

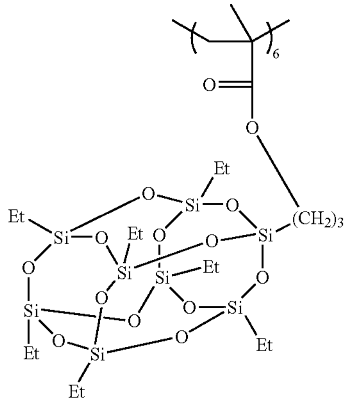

| | Composition | | | | | | |
|---|---|---|---|---|---|---|---|
| | Resin (A) (2g) | Acid Generator (mg) | Resin (C) (mg) | Solvents (ratio by mass) | Basic Compound (mg) | Surfactant (mg) | Number of Defects (per cm$^2$) |
| Example | | | | | | | |
| 21 | SI-1 | z2 (80) | C-1 (2) | SL-2/SL-4 (70/30) | N-1 (7) | W-1 (5) | 0.12 |
| 22 | SI-2 | z2/z51 (20/100) | C-2 (2) | SL-2/SL-4/SL-6 (40/59/1) | N-3 (6) | W-3 (3) | 0.11 |
| 23 | SI-3 | z65 (100) | C-1 (2) | SL-2/SL-4 (60/40) | N-5 (7) | W-1 (5) | 0.10 |
| 24 | SI-4 | z2 (100) | C-3 (3) | SL-2/SL-4 (60/40) | N-3 (10) | W-6 (5) | 0.15 |
| 25 | SI-5 | z55 (80) | C-4 (2) | SL-2/SL-4 (70/30) | N-1 (7) | W-1 (5) | 0.14 |
| Comparative Example | | | | | | | |
| 4 | SI-1 | z2 (80) | — | SL-1/SL-2 (60/40) | N-5 (7) | W-1 (5) | 2.13 |

As is clear from the results shown in Table 7, development defect can be improved by use of the present pattern forming method.

Examples 26 to 34

Resists 1 to 6 were each prepared by dissolving ingredients in solvents as shown in the following Table 8 so as to prepare a solution having a solids concentration of 7 mass % and passing the solution through a 0.1-μm polyethylene filter. Patterns were formed using each of the thus prepared resists in accordance with either of the methods as described in Table 9, and evaluated by the same method as in Example 1. Results obtained are shown in Table 9.

TABLE 8

| | Composition | | | | | |
|---|---|---|---|---|---|---|
| | Resin (A) (2 g) | Acid Generator (mg) | Solvent (ratio By mass) | Basic Compound (mg) | Resin (c) (mg) | Surfactant (mg) |
| Resist 1 | 21 | z25 (80) | SL-2 (100) | N-3/N-5 (3/3) | C-1 (2) | W-1 (3) |
| Resist 2 | 22 | z5/z55 (50/50) | SL-2/SL-4 (60/40) | N-3/N-5 (3/3) | C-1 (2) | W-1 (3) |
| Resist 3 | 23 | z5/z55 (50/50) | SL-1/SL-2 (40/60) | N-3 (6) | C-2 (2) | W-1 (3) |
| Resist 4 | 24 | z5 (80) | SL-2/SL-4 (60/40) | N-5 (6) | C-2 (5) | W-1 (3) |
| Resist 5 | 21 | z2 (100) | SL-2/SL-4 (70/30) | N-3/N-5 (3/3) | C-8 (1) | W-1 (3) |
| Resist 6 | 22 | z2/z55 (50/50) | SL-2/SL-4 (70/30) | N-3/N-5 (3/3) | C-8 (5) | W-1 (3) |

TABLE 9

| | Resist | Pattern forming method | Number of defects (per $cm^2$) |
|---|---|---|---|
| Example 26 | Resist 1 | (D) | 0.09 |
| Example 27 | Resist 2 | (D) | 0.11 |
| Example 28 | Resist 3 | (D) | 0.08 |
| Example 29 | Resist 1 | (B) | 0.13 |
| Example 30 | Resist 2 | (B) | 0.14 |
| Example 31 | Resist 3 | (B) | 0.11 |
| Example 32 | Resist 4 | (D) | 0.12 |
| Example 33 | Resist 5 | (B) | 0.14 |
| Example 34 | Resist 6 | (B) | 0.13 |

It is apparent from these results that development defect can be improved by the pattern forming methods of the invention.

According to the invention, it is possible to provide an immersion lithography-utilized image forming method which can ensure improved development defects.

The entire disclosure of each and every foreign patent application from which the benefit of foreign priority has been claimed in the present application is incorporated herein by reference, as if fully set forth.

What is claimed is:

1. A pattern forming method which uses a positive resist composition comprising:

(A) a fluorine-free resin capable of increasing its solubility in an alkaline developer under action of an acid;

(B) a compound capable of generating an acid upon irradiation with an actinic ray or radiation;

(C) a fluorine-containing resin having at least one group selected from the group consisting of (X) an alkali-soluble group, (XI) a group capable of decomposing under action of an alkali developer and increasing solubility of the resin (C) in an alkaline developer, and (XII) a group capable of decomposing under action of an acid and increasing solubility of the resin (C) in an alkaline developer; and (D) a solvent, the method comprising:

(i) a step of applying the positive resist composition to a substrate to form a resist coating;

(ii) a step of exposing the resist coating to light via an immersion liquid;

(iii) a step of removing the immersion liquid remaining on the resist coating;

(iv) a step of heating the resist coating; and (v) a step of developing the resist coating, wherein the fluorine-containing resin (C) has at least one repeating unit selected from the group consisting of the following formulae:

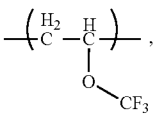

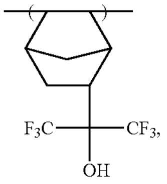

-continued

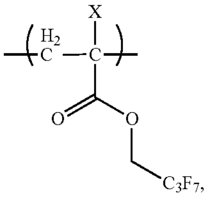

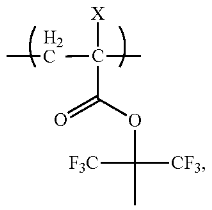

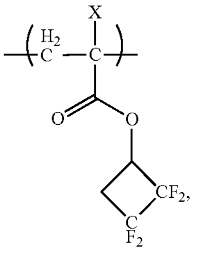

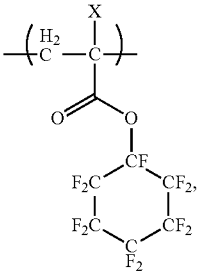

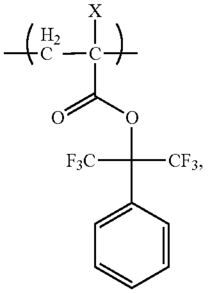

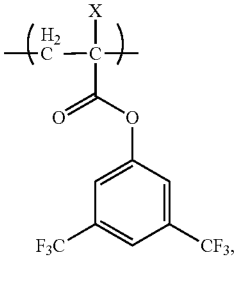

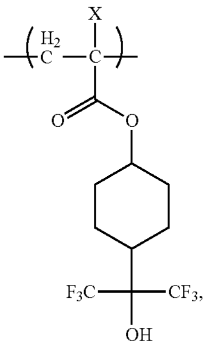

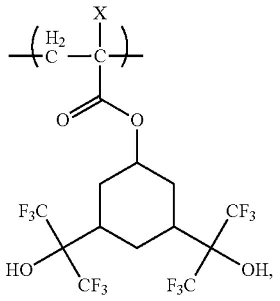

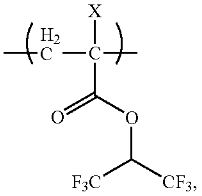

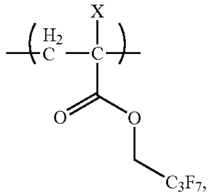

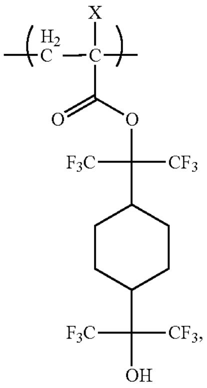

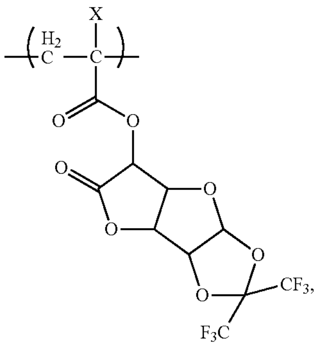

-continued

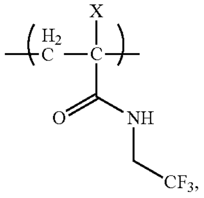

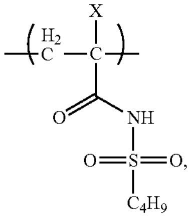

where X represents H, $CH_3$, F, $CF_3$ or $CH_2OCH(CF_3)_2$, and wherein the resin (C) is added in an amount of 0.1 to 10 mass % based on the total solids in the resist composition.

2. The pattern forming method according to claim 1, wherein the resin (A) has a mononuclear or polynuclear alicyclic hydrocarbon structure.

3. The pattern forming method according to claim 1, wherein the resist coating is exposed to light of a wavelength of 193 nm.

4. The pattern forming method according to claim 1, further comprising a step of cleaning the resist coating surface prior to (ii) the step of exposing the resist coating to light via an immersion liquid.

5. The pattern forming method according to claim 1, wherein the resin (C) has a weight average molecular weight of 1,000 to 100,000.

6. The pattern forming method according to claim 1, wherein (iii) the step of removing the immersion liquid remaining on the resist coating comprises forming a liquid film (puddle) of the immersion liquid and then removing the liquid film so as not to leave any liquid drops.

7. The pattern forming method according to claim 6, wherein the step of removing the liquid film is a step of removing the liquid film while rotating the substrate at 500 rpm or above.

8. The pattern forming method according to claim 1, wherein the resin (A) comprises a repeating unit having a polycyclic hydrocarbon group substituted by a hydroxyl group or a cyano group.

9. The pattern forming method according to claim 1, wherein the resin (C) is an alkali-soluble resin having the alkali-soluble group (X), and the alkali-soluble group (X) is represented by —$C(CF_3)(CF_3)(OH)$.

10. The pattern forming method according to claim 1, wherein the resin (A) comprises:

a repeating unit represented by formula (A1);

a repeating unit represented by formula (A2); and a repeating unit represented by formula (A3), (A1)

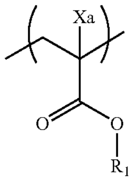

-continued (A2)

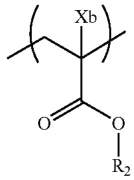

(A3)

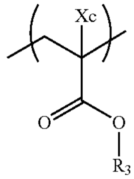

wherein Xa, Xb and Xc each independently represents a hydrogen atom or a methyl group, $R_1$ represents a univalent organic group having a lactone structure, $R_2$ represents a univalent organic group having a hydroxyl group or a cyano group, and $R_3$ represents a univalent organic group capable of splitting off by the action of an acid.

11. The pattern forming method according to claim 1, wherein the resin (C) has at least one alkali-soluble group.

12. The pattern forming method according to claim 1, wherein the resin (C) has at least one group capable of decomposing under action of an acid and increasing solubility of the resin (C) in an alkaline developer.

13. The pattern forming method according to claim 1, wherein the immersion liquid is purified water and the step (iii) of removing the immersion liquid remaining on the resist coating comprises forming a liquid film (puddle) of the purified water and then removing the liquid film so as not to leave any liquid drops.

14. The pattern forming method according to claim 6, wherein the liquid film (puddle) is formed by putting the immersion liquid on the resist coating as the substrate is kept still.

15. A pattern forming method which uses a positive resist composition comprising:

(A) a fluorine-free resin capable of increasing its solubility in an alkaline developer under action of an acid;

(B) a compound capable of generating an acid upon irradiation with an actinic ray or radiation;

(C) a fluorine-containing resin having at least one group selected from the group consisting of (X) an alkali-soluble group, (XI) a group capable of decomposing under action of an alkali developer and increasing solubility of the resin (C) in an alkaline developer, and (XII) a group capable of decomposing under action of an acid and increasing solubility of the resin (C) in an alkaline developer; and (D) a solvent, the method comprising:

(i) a step of applying the positive resist composition to a substrate to form a resist coating;

(ii) a step of exposing the resist coating to light via an immersion liquid;

(iii) a step of removing the immersion liquid remaining on the resist coating;

(iv) a step of heating the resist coating; and (v) a step of developing the resist coating, wherein the fluorine-containing resin (C) has at least one repeating unit selected from the group consisting of the following formulae:

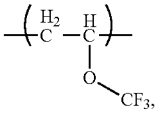
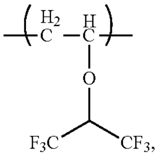
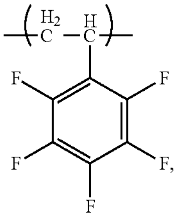
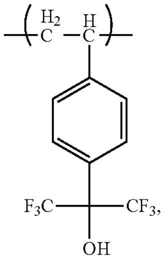
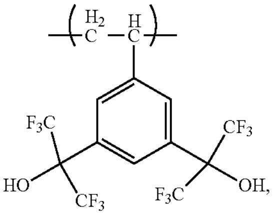
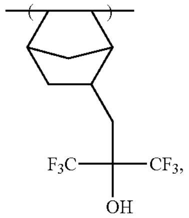
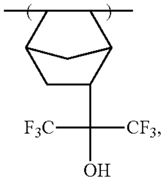
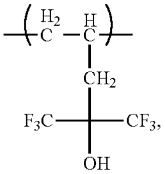
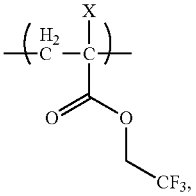
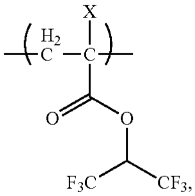
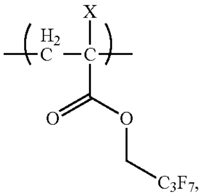
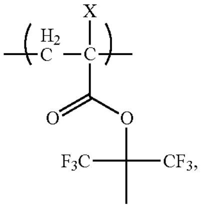
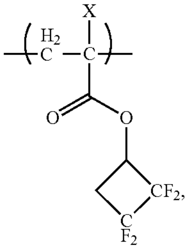
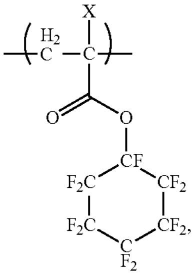
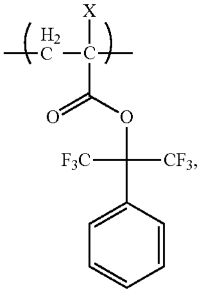
-continued
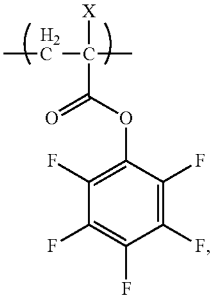
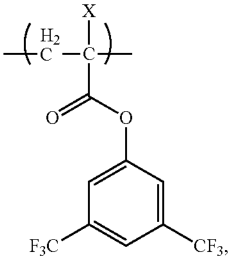
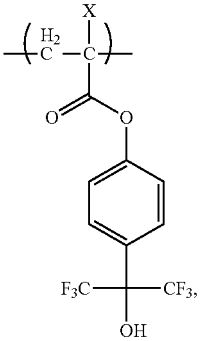
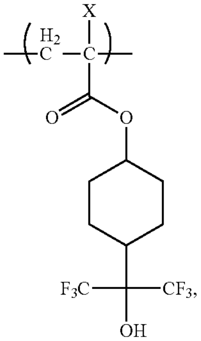
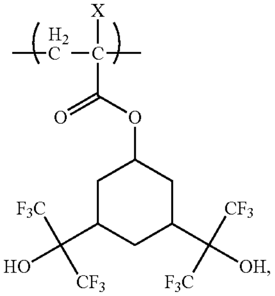
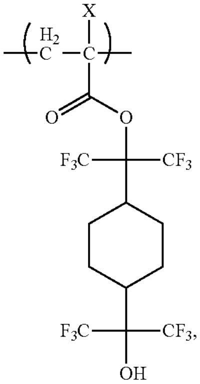
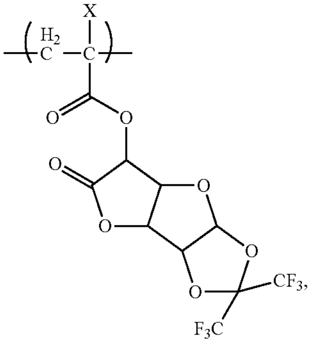
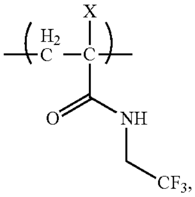
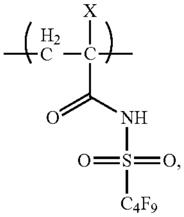
where X represents H, $CH_3$, F, $CF_3$ or $CH_2OCH(CF_3)_2$, wherein:
the resin (C) is added in an amount of 0.1 to 10 mass % based on the total solids in the resist composition;

the step (iii) of removing the immersion liquid remaining on the resist coating comprises forming a liquid film (puddle) of the immersion liquid and then removing the liquid film so as not to leave any liquid drops;

the immersion liquid is purified water; and the step of removing the liquid film is a step of removing the liquid film while rotating the substrate at 500 rpm or above.

16. The pattern forming method according to claim 15, wherein the resin (A) has a mononuclear or polynuclear alicyclic hydrocarbon structure.

17. The pattern forming method according to claim 15, wherein the resist coating is exposed to light of a wavelength of 193 nm.

18. The pattern forming method according to claim 15, further comprising a step of cleaning the resist coating surface prior to (ii) the step of exposing the resist coating to light via an immersion liquid.

19. The pattern forming method according to claim 15, wherein the resin (C) has a weight average molecular weight of 1,000 to 100,000.

20. The pattern forming method according to claim 15, wherein the resin (A) comprises a repeating unit having a polycyclic hydrocarbon group substituted by a hydroxyl group or a cyano group.

21. The pattern forming method according to claim 15, wherein the resin (C) is an alkali-soluble resin having the alkali-soluble group (X), and the alkali-soluble group (X) is represented by —$C(CF_3)(CF_3)(OH)$.

22. The pattern forming method according to claim 15, wherein the resin (A) comprises:

a repeating unit represented by formula (A1);

a repeating unit represented by formula (A2); and a repeating unit represented by formula (A3),

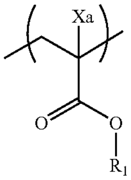

(A1)

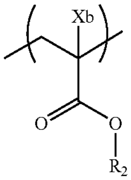

(A2)

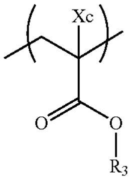

(A3)

wherein Xa, Xb and Xc each independently represents a hydrogen atom or a methyl group, $R_1$ represents a univalent organic group having a lactone structure, $R_2$ represents a univalent organic group having a hydroxyl group or a cyano group, and $R_3$ represents a univalent organic group capable of splitting off by the action of an acid.

* * * * *